United States Patent
Sekiya

(10) Patent No.: US 8,106,410 B2
(45) Date of Patent: Jan. 31, 2012

(54) METHOD OF MANUFACTURING DISPLAY DEVICE AND DISPLAY DEVICE

(75) Inventor: Mitsunobu Sekiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/698,306

(22) Filed: Feb. 2, 2010

(65) Prior Publication Data
US 2010/0200869 A1 Aug. 12, 2010

(30) Foreign Application Priority Data
Feb. 9, 2009 (JP) ................. 2009-027645

(51) Int. Cl.
H01L 29/18 (2006.01)
H01L 33/00 (2010.01)
H01J 1/62 (2006.01)
H01J 63/04 (2006.01)
(52) U.S. Cl. ............... 257/88; 313/504; 257/E21.158
(58) Field of Classification Search .............. 257/88, 257/E21.158, E51.018; 313/504, 506, 495
See application file for complete search history.

(56) References Cited

U.S. PATENT DOCUMENTS
2004/0217694 A1* 11/2004 Cok et al. .............. 313/504
2009/0095962 A1* 4/2009 Matsunobu et al. .......... 257/88
2009/0159906 A1* 6/2009 Ishiguro .............. 257/88
2010/0102335 A1* 4/2010 Takagi et al. .............. 257/88
2011/0043464 A1* 2/2011 Lee et al. ............. 345/173

FOREIGN PATENT DOCUMENTS
JP 2001-110575 4/2001
JP 2001-175200 6/2001

OTHER PUBLICATIONS

Nobuki Ibaraki; 58.1 Invited Paper: Views on the Present and Future Promise of OLED Displays; SID 06 Digest.

* cited by examiner

Primary Examiner — Walter L Lindsay, Jr.
(74) Attorney, Agent, or Firm — SNR Denton US LLP

(57) ABSTRACT

A method of manufacturing a display device including the steps of: forming drive elements on a substrate; forming a planarization film in a position corresponding to each of the drive elements; forming a bottom electrode corresponding to each of the plurality of organic light emitting elements; forming a pixel isolation insulating film in a region between the bottom electrodes; forming an organic layer including a light emission layer above the bottom electrode by evaporation using an evaporation mask; and forming a top electrode over the organic layer. In the step of forming the bottom electrode includes the steps of: forming a bottom electrode material film; forming a photoresist film on the bottom electrode material film; exposing the photoresist film using the evaporation mask and developing it; and selectively removing the bottom electrode material film by etching using the photoresist film as a mask.

4 Claims, 47 Drawing Sheets

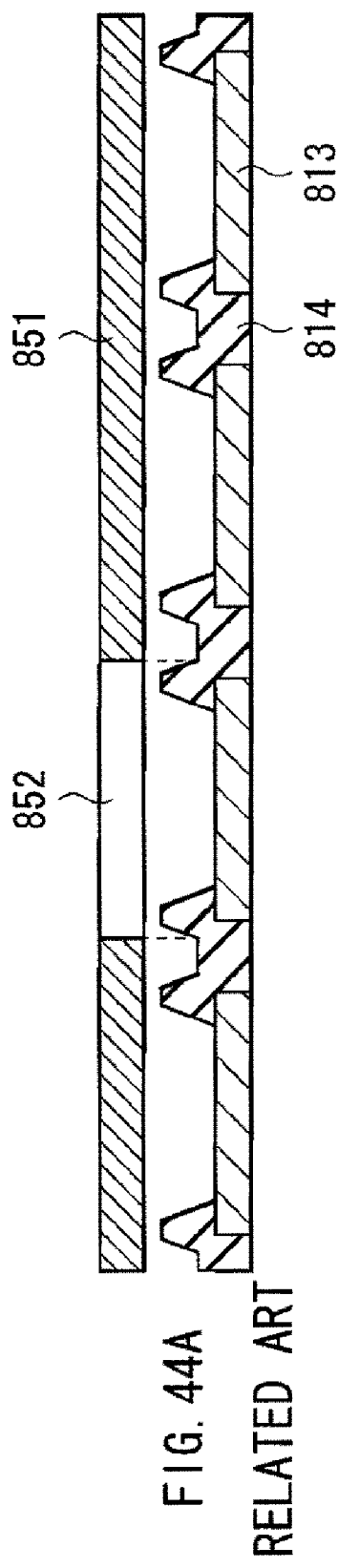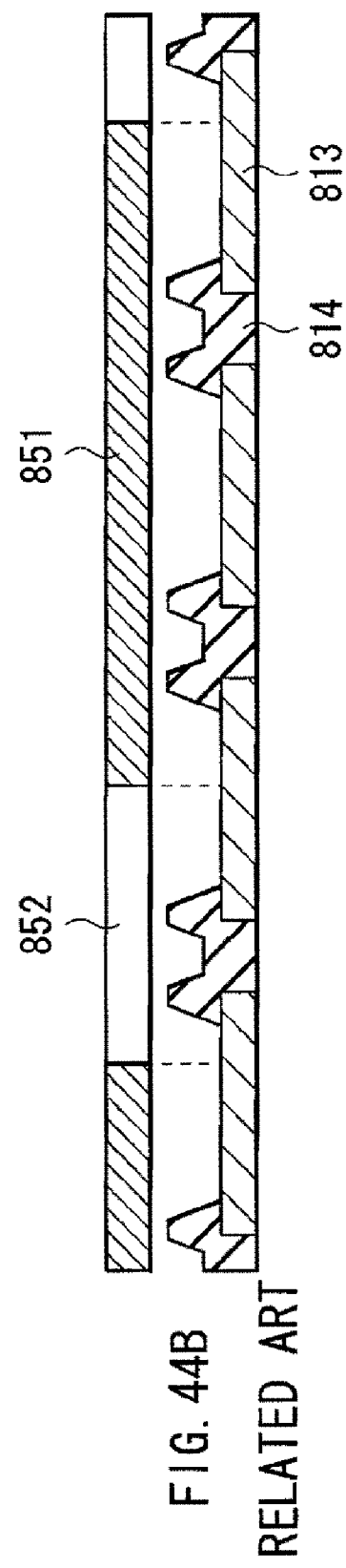
FIG. 44A RELATED ART
FIG. 44B RELATED ART

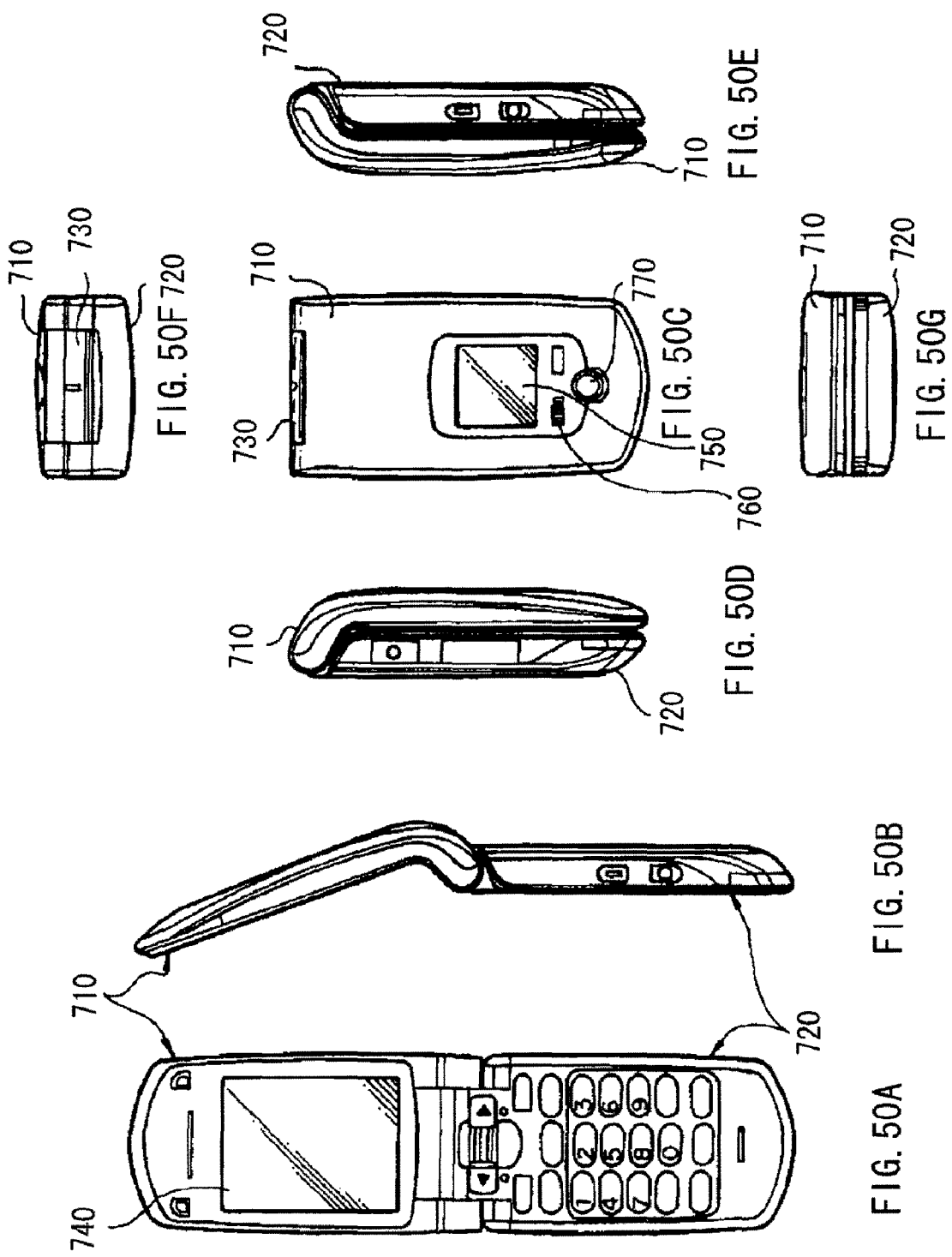

METHOD OF MANUFACTURING DISPLAY DEVICE AND DISPLAY DEVICE

BACKGROUND OF THE INVENTION

1. Field of the Invention

The present invention relates to a method of manufacturing a display device in which a plurality of organic light emitting elements are formed on a substrate, and to a display device.

2. Description of the Related Art

In recent years, as a display device replacing a liquid crystal display, an organic EL display device using an organic light emitting element has been practically used. It is considered that, since the organic EL display device is of a light emission type, the view angle is wider than that of a liquid crystal display or the like, and the organic EL display device has sufficiently high response even to a high-precision high-speed video signal.

In an organic EL display device of related art, to prevent short-circuit between a bottom electrode and a top electrode, a pixel isolation insulating film is formed around the bottom electrode (refer to, for example, Japanese Unexamined Patent Application Publication No. 2001-175200).

SUMMARY OF THE INVENTION

However, there is a problem such that, by providing the pixel isolation insulating film, the aperture ratio decreases. From the viewpoint of the life of an organic light emitting material, increase in the aperture ratio is in demand.

Japanese Unexamined Patent Application Publication No. 2001-110575 discloses a method of preventing short-circuit between top and bottom electrodes by forming a side face of the bottom electrode in a forward-tapered shape. However, the bottom electrode has to be electrically connected to a drive element via a contact hole provided in a planarization layer. There is possibility that short-circuit between the top and bottom electrodes occurs also in the contact hole.

In related art, the bottom electrode and the pixel isolation insulating film are formed by photolithography, and positional precision is high. On the other hand, an organic layer including a light emission layer is formed by evaporation using an evaporation mask. Consequently, in the case where the size becomes larger, an evaporation positional deviation in the organic layer caused by distortion of the evaporation mask increases.

It is therefore desirable to provide a method of manufacturing a display device realizing a reduced positional deviation between the bottom electrode or the pixel isolation insulating film and the organic layer and a display device realizing suppressed short-circuit in a contact hole and improved aperture ratio.

A first method of manufacturing a display device having a plurality of organic light emitting elements as an embodiment of the invention includes the steps of: forming drive elements corresponding to the plurality of organic light emitting elements on a substrate; forming at least one planarization film having, in a position corresponding to each of the drive elements, a contact hole whose side face has a forward-tapered shape; forming a bottom electrode corresponding to each of the plurality of organic light emitting elements, in a region including the contact hole; forming a pixel isolation insulating film in a region between the bottom electrodes; forming an organic layer including a light emission layer above the bottom electrode by evaporation using an evaporation mask; and forming a top electrode over the organic layer. The step of forming the bottom electrode includes the steps of: forming a bottom electrode material film; forming a photoresist film on the bottom electrode material film; exposing the photoresist film using the evaporation mask and developing it; and selectively removing the bottom electrode material film by etching using the photoresist film as a mask.

A second method of manufacturing a display device having a plurality of organic light emitting elements as an embodiment of the present invention includes the steps of: forming drive elements corresponding to the plurality of organic light emitting elements on a substrate; forming at least one planarization film, and forming a side face of a contact hole in at least the uppermost planarization film in the at least one planarization film, in a forward-tapered shape; forming a bottom electrode corresponding to each of the plurality of organic light emitting elements, in a region including the contact hole; forming an organic layer including a light emission layer so as to cover all of a top face and a side face of the bottom electrode by evaporation using an evaporation mask; and forming a top electrode over the organic layer. The bottom electrode is formed by using the evaporation mask. The "forward-tapered shape of a side face of a contact hole" is a shape in which the diameter of the contact hole gradually increases from the substrate side in a conical shape or a pyramid shape.

A display device of an embodiment of the present invention includes: drive elements formed, on a substrate, in correspondence with each of a plurality of organic light emitting elements; at least one planarization film, at least uppermost film of which has a contact hole whose side face has a forward-tapered shape; a bottom electrode formed in a region including the contact hole in correspondence with each of the plurality of organic light emitting elements; an organic layer including a light emission layer; and a top electrode.

According to the display device of an embodiment of the invention, the side face of a contact hole in at least the uppermost planarization film has a forward-tapered shape, and the bottom electrode is formed in the region including the contact hole, so that short-circuit between the bottom and top electrodes in the contact hole is suppressed, and the aperture ratio improves.

According to the first method of manufacturing a display device of an embodiment of the present invention, the photoresist film for etching the bottom electrode material film is exposed using the evaporation mask. According to the second method of manufacturing a display device of an embodiment of the present invention, the bottom electrode is formed by using an evaporation mask and, by evaporation using the evaporation mask, the organic layer is formed so as to cover all of the top face and the side face of the bottom electrode. Thus, a positional deviation between the bottom electrode/pixel isolation insulating film and the organic layer is reduced.

According to the display device of an embodiment of the present invention, the side face of the contact hole in at least the uppermost planarization film is formed in a forward-tapered shape, and the bottom electrode is formed in the region including the connection hole. Therefore, short-circuit between the bottom and top electrodes in the contact hole is suppressed, and the aperture ratio improves.

Other and further objects, features and advantages of the invention will appear more fully from the following description.

BRIEF DESCRIPTION OF THE DRAWINGS

FIGS. 44A and 44B are cross sections in a screen center and a screen end of FIG. 43.

FIG. 50A is a front view illustrating a state where a display device of application example 5 is open, FIG. 50B is a side view of the display device, FIG. 50C is a front view illustrating a state where the display device is closed, FIG. 50D is a left side view, FIG. 50E is a right side view, FIG. 50F is a top view, and FIG. 50G is a bottom view.

DETAILED DESCRIPTION OF THE PREFERRED EMBODIMENTS

Embodiments of the present invention will be described in detail below with reference to the drawings. Description will be given in the following order.
1. First embodiment (an example of exposing a photoresist film for etching a bottom electrode material film and a photosensitive film for forming a pixel isolation insulating film backlight by using an evaporation mask)
2. Second embodiment (an example of forming a side face of a contact hole in a forward tapered shape and forming a bottom electrode in a region including the contact hole)
3. Modification
4. Third embodiment (an example of forming a bottom electrode by electron beam evaporation or sputtering using an evaporation mask)

First Embodiment

Figure 1:
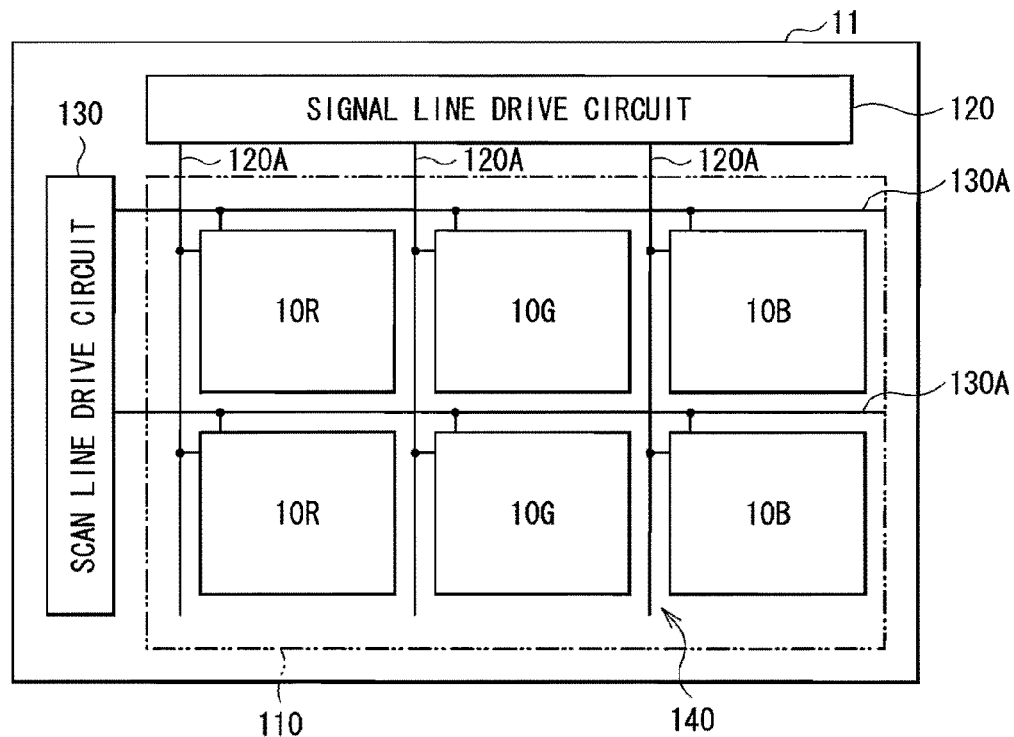
FIG. 1 is a diagram the configuration of a display device according to a first embodiment of the present invention.

FIG. 1 illustrates a configuration of a display device using an organic light emitting element according to a first embodiment of the present invention. The display device is used as a very-thin-type organic light emission color display device or the like. For example, a display region 110 in which a plurality of organic light emitting elements 10R, 10G, and 10B which will be described later are disposed in a matrix is formed on a substrate 11 made of glass or the like. A signal line drive circuit 120 and a scan line drive circuit 130 as drivers for video image display are formed around the display region 110.

Figure 2:
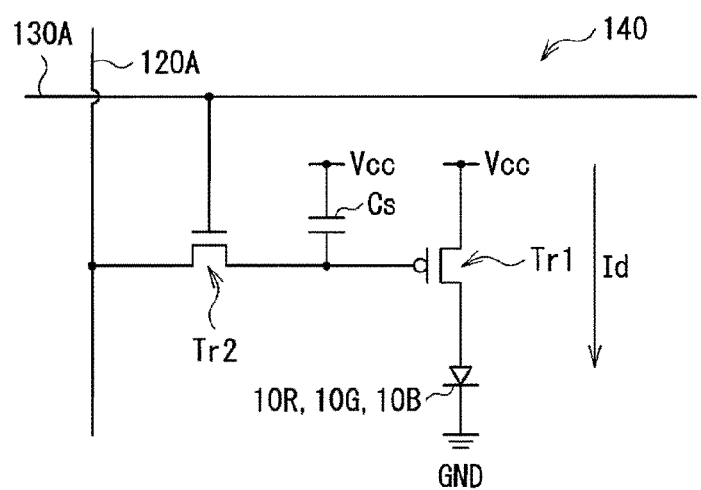
FIG. 2 is a diagram illustrating an example of a pixel drive circuit shown in FIG. 1.

A pixel drive circuit 140 is formed in the display region 110. FIG. 2 illustrates an example of the pixel drive circuit 140. The pixel drive circuit 140 is formed in a layer below a bottom electrode 13 which will be described later and is an active-type drive circuit having a drive transistor Tr1, a write transistor Tr2, a capacitor (retention capacitor) Cs provided between the transistors Tr1 and Tr2, and the organic light emitting element 10R (or 10G or 10B) connected to the drive transistor Tr1 in series between a first power supply line (Vcc) and a second power supply line (GND). The drive transistor Tr1 and the write transistor Tr2 are general thin film transistors (TFTs) and may have, for example, an inverted staggered structure (so-called bottom gate type) or a staggered structure (top gate type), but not be limited.

In the pixel drive circuit 140, a plurality of signal lines 120A are disposed in the column direction, and a plurality of scan lines 130A are disposed in the row direction. The cross point between the signal line 120A and the scan line 130A corresponds to any one of the organic light emitting elements 10R, 10G, and 10B (sub-pixels). The signal lines 120A are connected to the signal line drive circuit 120. From the signal line drive circuit 120, an image signal is supplied to the source electrode of the write transistor Tr2 via the signal line 120A. The scan lines 130A are connected to the scan line drive circuit 130, and a scan signal is sequentially supplied from the scan line drive circuit 130 via the scan line 130A to the gate electrode of the write transistor Tr2.

Figure 3:
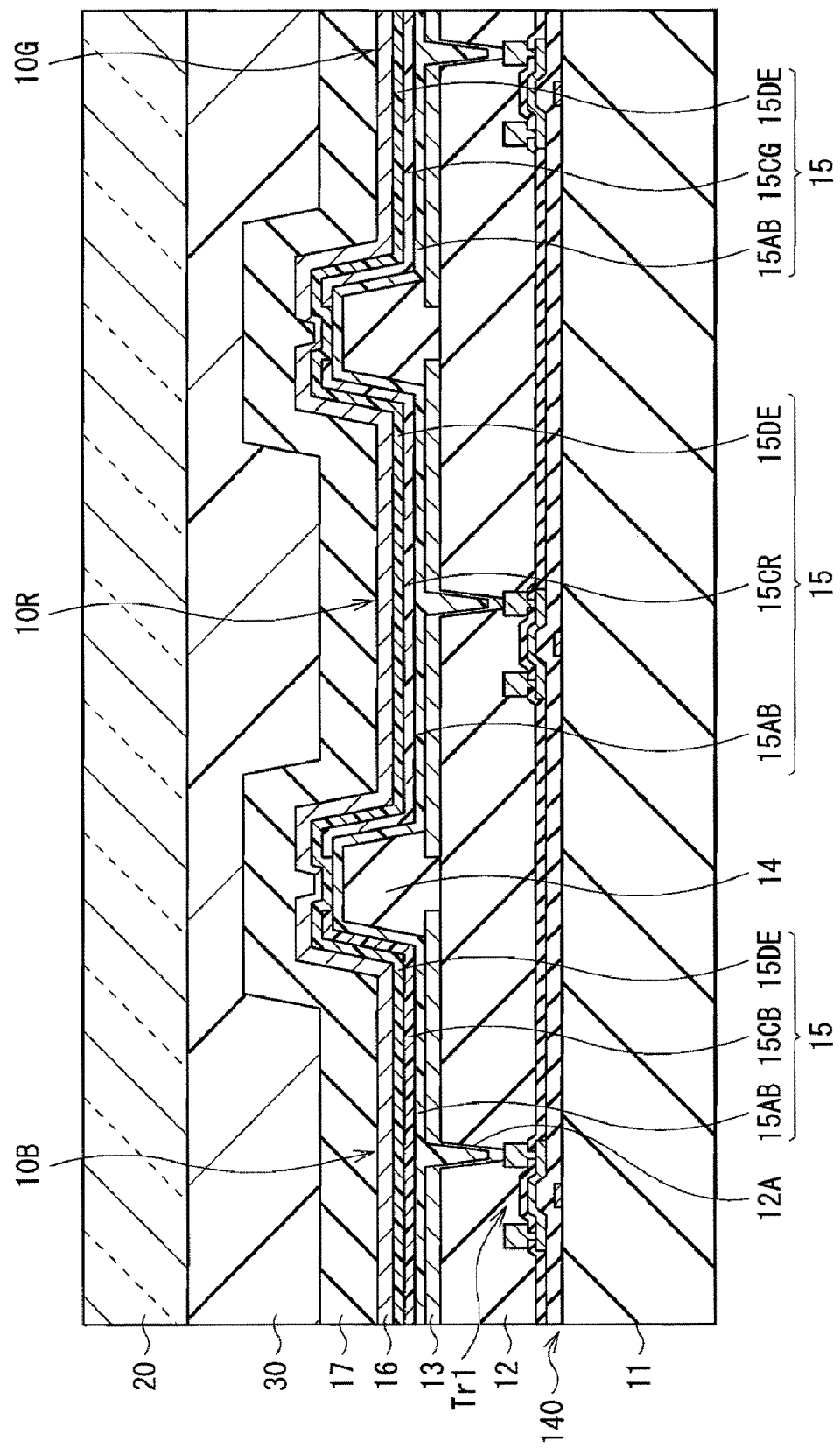
FIG. 3 is a cross section illustrating the configuration of a display region shown in FIG. 1.

FIG. 3 shows an example of a sectional configuration of the display region 110. In the display region 110, the organic light emitting elements 10R generating red light, the organic light emitting elements 10G generating green light, and the organic light emitting elements 10B generating blue light are formed in order and generally in a matrix. The organic light emitting elements 10R, 10G, and 10B each having a rectangular shape in plan view are disposed in the longitudinal direction (column direction) by colors.

Each of the organic light emitting elements 10R, 10G, and 10B has a configuration such that, the bottom electrode 13 as an anode, a pixel isolation insulating film 14, an organic layer 15 including a red light emitting layer 15CR, a green light emitting layer 15CG, or a blue light emitting layer 15CB, and a top electrode 16 as a cathode are stacked in order from the side of the substrate 11 while sandwiching the drive transistor Tr1 and a planarization film 12 of the pixel drive circuit 140.

Such organic light emitting elements 10R, 10G, and 10B are covered with a protection film 17 made of silicon nitride (SiNx) or the like. To the entire surface of the protection film 17, a sealing substrate 20 made of glass or the like is bonded via an adhesive layer 30 made of a thermoset resin, an ultraviolet curable resin, or the like.

The planarization film 12 is provided to planarize the surface of the substrate 11 on which a pixel drive circuit 140 is formed and is made of an organic material such as acrylic, polyimide, or the like or an inorganic material such as silicon oxide (SiO2), nitric oxide ($Si_3N_4$), or the like. The planarization film 12 is provided with contact holes 12A for electrically connecting the drive transistor Tr1 and the bottom electrode 13.

The bottom electrode 13 is formed in correspondence with each of the organic light emitting elements 10R, 10G, and 10B. For example, in the case of extracting light generated from the red light emitting layer 15CR, the green light emitting layer 15CG, or the blue light emitting layer 15CB from the bottom electrode 13 side (bottom emission), the bottom electrode 13 is a transparent electrode made of ITO (Indium Tin Oxide), IZO (Indium Zinc Oxide), $SnO_2$ or the like. On the other hand, in the case of extracting light generated from the red light emitting layer 15CR, the green light emitting layer 15CG, or the blue light emitting layer 15CB from the top electrode 16 side (top emission), the bottom electrode 13 is a reflective electrode made of a metal element such as gold (Au), platinum (Pt), nickel (Ni), chromium (Cr), copper (Cu), tungsten (W), aluminum (Al), molybdenum (Mo), silver (Ag), or the like or an alloy of any of the metal elements. The bottom electrode 13 may be constructed by a composite film of the transparent electrode and the reflective electrode.

The side face of the contact hole 12A in the planarization film 12 is formed in a forward tapered shape. The bottom electrode 13 is formed in a region including the contact hole 12A. With the configuration, in the display device, short-circuit in the contact hole 12A is suppressed, and the aperture ratio is improved.

The pixel isolation insulating film 14 is provided to assure insulation between the bottom electrode 13 and a top electrode 16 and to accurately form a light emission region in a desired shape. The pixel isolation insulating film 14 has a thickness of about 1 μm and is made of a photosensitive resin such as silicon oxide or polyimide. In the pixel isolation insulating film 14, openings are provided in correspondence with light emission regions. The organic layer 15 and the top electrode 16 are provided continuously also on the pixel isolation insulting film 14. Light is generated only in the openings in the pixel isolation insulating film 14.

The organic layer 15 has a configuration, for example, in which a hole injection layer and hole transport layer 15AB, the red light emission layer 15CR, the green light emission layer 15CG, or the blue light emission layer 15CB, and an electron transport layer and electron injection layer 15DE are stacked in order from the side of the bottom electrode 13. The layers other than the red light emission layer 15CR, the green light emission layer 15CG, or the blue light emission layer 15CB may be provided as necessary. The organic layer 15 may have a configuration which varies according to light emission colors of the organic light emitting elements 10R, 10G, and 10B. The hole injection layer is a buffer layer for increasing the hole injection efficiency and for preventing leakage. The hole transport layer is provided to increase the efficiency of transporting holes to the red light emission layer 15CR, the green light emission layer 15CG, or the blue light emission layer 15CB. In the red light emission layer 15CR, the green light emission layer 15CG, or the blue light emission layer 15CB, by applying an electric field, recombination of electrons and holes occurs, and light is generated. The electron transport layer is provided to increase the efficiency of transporting electrons to the red light emission layer 15CR, the green light emission layer 15CG, or the blue light emission layer 15CB. The electron injection layer has a thickness of, for example, about 0.3 nm and is made of LiF, Li2O, or the like. In FIG. 3, the hole injection layer and the hole transport layer are expressed as one layer (the hole injection layer and hole transport layer 15AB), and the electron transport layer and the electron injection layer are expressed as one layer (the electron transport layer and electron injection layer 15DE).

The hole injection layer of the organic light emitting element 10R has a thickness of, for example, 5 nm to 300 nm and is made of 4,4',4"-tris(3-methylphenyphenylamino)triphenylamine (m-MTDATA), or 4,4',4"-tris(2-naphthylphenylamino)triphenylamine (2-TNATA). The hole transport layer of the organic light emitting element 10R has a thickness of, for example, 5 nm to 300 nm and is made of bis[(N-naphthyl)-N-phenyl]benzidine (α-NPD). The red light emission layer 15CR of the organic light emitting element 10R has a thickness of, for example, 10 nm to 100 nm and is made of a material obtained by mixing 30% by weight of 2,6=bis[4'=methoxydiphenylamino)styryl]=1,5=dicyanonaphthalene (BSN) to 9,10-di-(2-naphthyl)anthracene (ADN). The electron transport layer of the organic light emitting element 10R has a thickness of, for example, 5 nm to 300 nm and is made of 8=hydroxyquinoline aluminum (Alq3).

The hole injection layer of the organic light emitting element 10G has a thickness of, for example, 5 nm to 300 nm and is made of m-MTDATA or 2-TNATA. The hole transport layer of the organic light emitting element 10G has a thickness of, for example, 5 nm to 300 nm and is made of α-NPD. The green light emission layer 15CG of the organic light emitting element 10G has a thickness of, for example, 10 nm to 100 nm and is made of a material obtained by mixing 5 volume % of Coumarin 6 to ADN. The electron transport layer of the organic light emitting element 10G has a thickness of, for example, 5 nm to 300 nm and is made of Alq3.

The hole injection layer of the organic light emitting element 10B has a thickness of, for example, 5 nm to 300 nm and is made of m-MTDATA or 2-TNATA. The hole transport layer of the organic light emitting element 10B has a thickness of, for example, 5 nm to 300 nm and is made of α-NPD. The blue light emission layer 15CB of the organic light emitting element 10B has a thickness of, for example, 10 nm to 100 nm and is made of a material obtained by mixing 2.5 weight % of 4,4=bis[2={4=(N,N=diphenylamino)phenyl}vinyl]biphenyl (DPAVBi) to ADN. The electron transport layer of the organic light emitting element 10B has a thickness of, for example, 5 nm to 300 nm and is made of Alq3.

The top electrode 16 has a thickness of, for example, 5 nm to 50 nm and is made of a metal element or an alloy of aluminum (Al), magnesium (Mg), calcium (Ca), sodium (Na) or the like. Particularly, an alloy of magnesium and silver (MgAg alloy) or an alloy of aluminum (Al) and lithium (Li) (AlLi alloy) is preferable. The top electrode 16 may be constructed by a composite film of a layer made of any of the metal elements or an alloy of the metal elements and a transparent electrode similar to the first electrode 13.

The sealing substrate 20 is positioned on the side of the top electrode 16 of the organic light emitting elements 10R, 10G, and 10B and seals the organic light emitting elements 10R, 10G,k and 10B together with the adhesive layer 30. The sealing substrate 20 is made of a material such as a glass transparent to light generated by the organic light emitting elements 10R, 10G, and 10B.

For example, the display device may be manufactured as follows.

FIGS. 4 to 18 show a method of manufacturing the display device in process order. First, on the substrate 11 made of the above-described material, the pixel drive circuit 140 including the drive transistor Tr1 is formed. Subsequently, as shown also in FIG. 4, a photosensitive resin is coated on the entire surface of the substrate 11. By performing exposure and development, the planarized film 12 having the contact hole 12A whose side face is forward-tapered in a position corresponding to the drive transistor Tr1 is formed and baked. At this time, by using a positive photosensitive resin as the material of the planarization film 12, the side face of the contact hole 12A may be easily formed in a forward taper shape.

Figure 4:
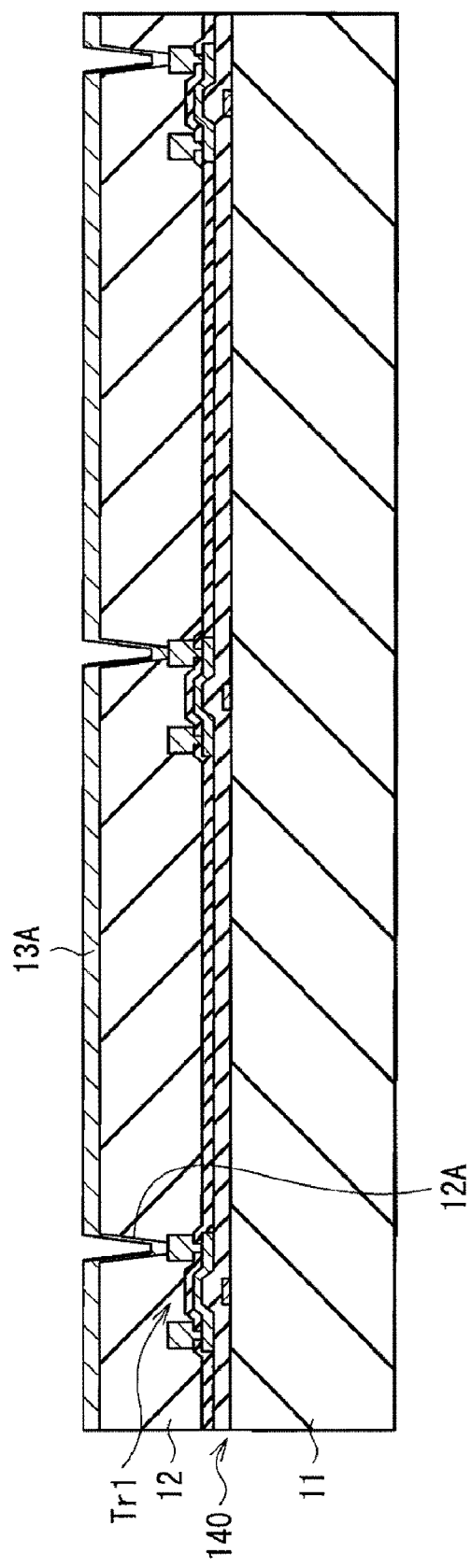
FIG. 4 is a cross section a method of manufacturing the display device illustrated in FIG. 1 in process order.

Subsequently, as shown also in FIG. 4, a bottom electrode material film 13A made of the material of the bottom electrode 13 is formed on the planarization film 12.

Figure 5:
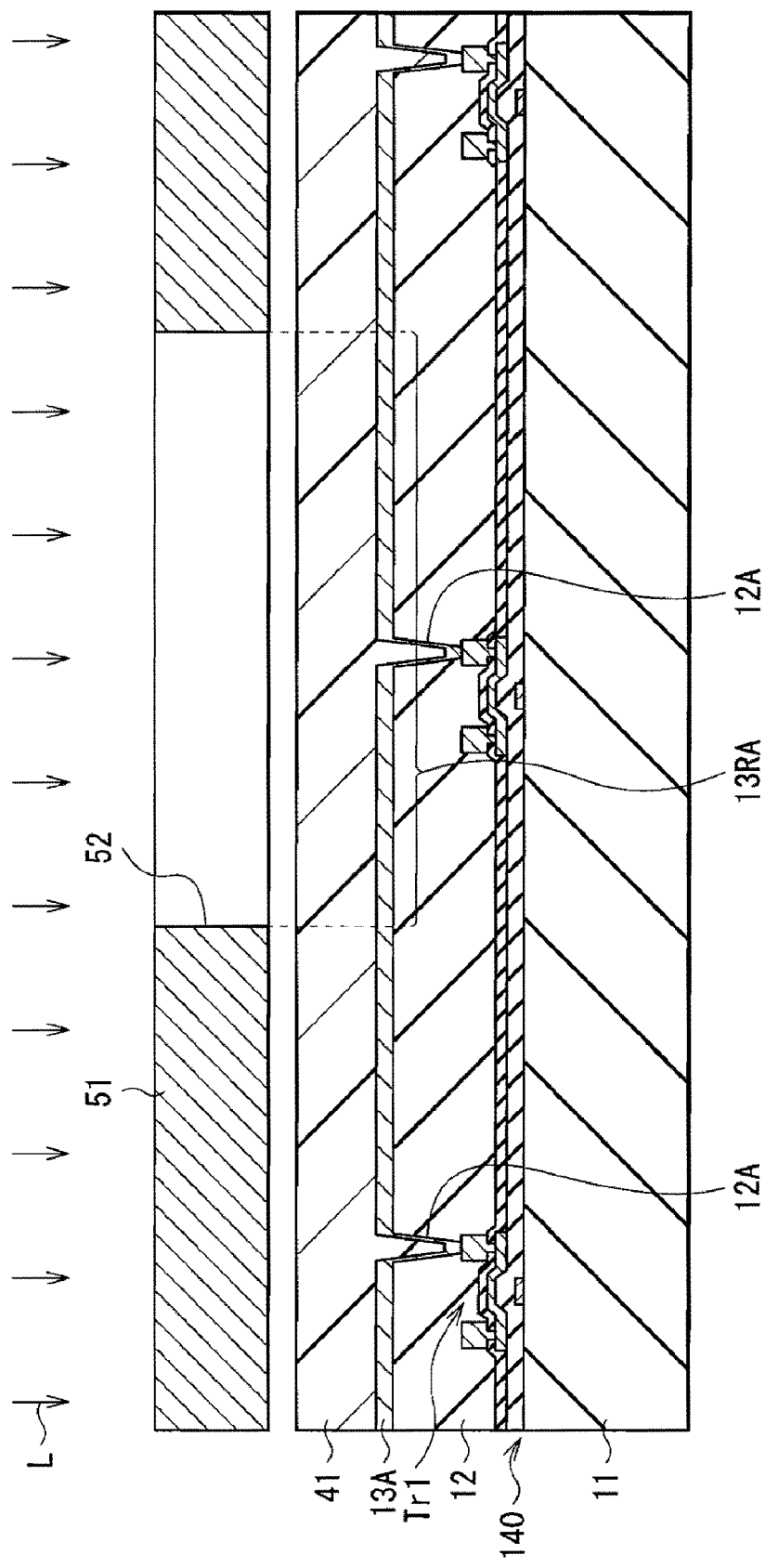
FIG. 5 is a cross section illustrating a process subsequent to FIG. 4.
Figure 6:
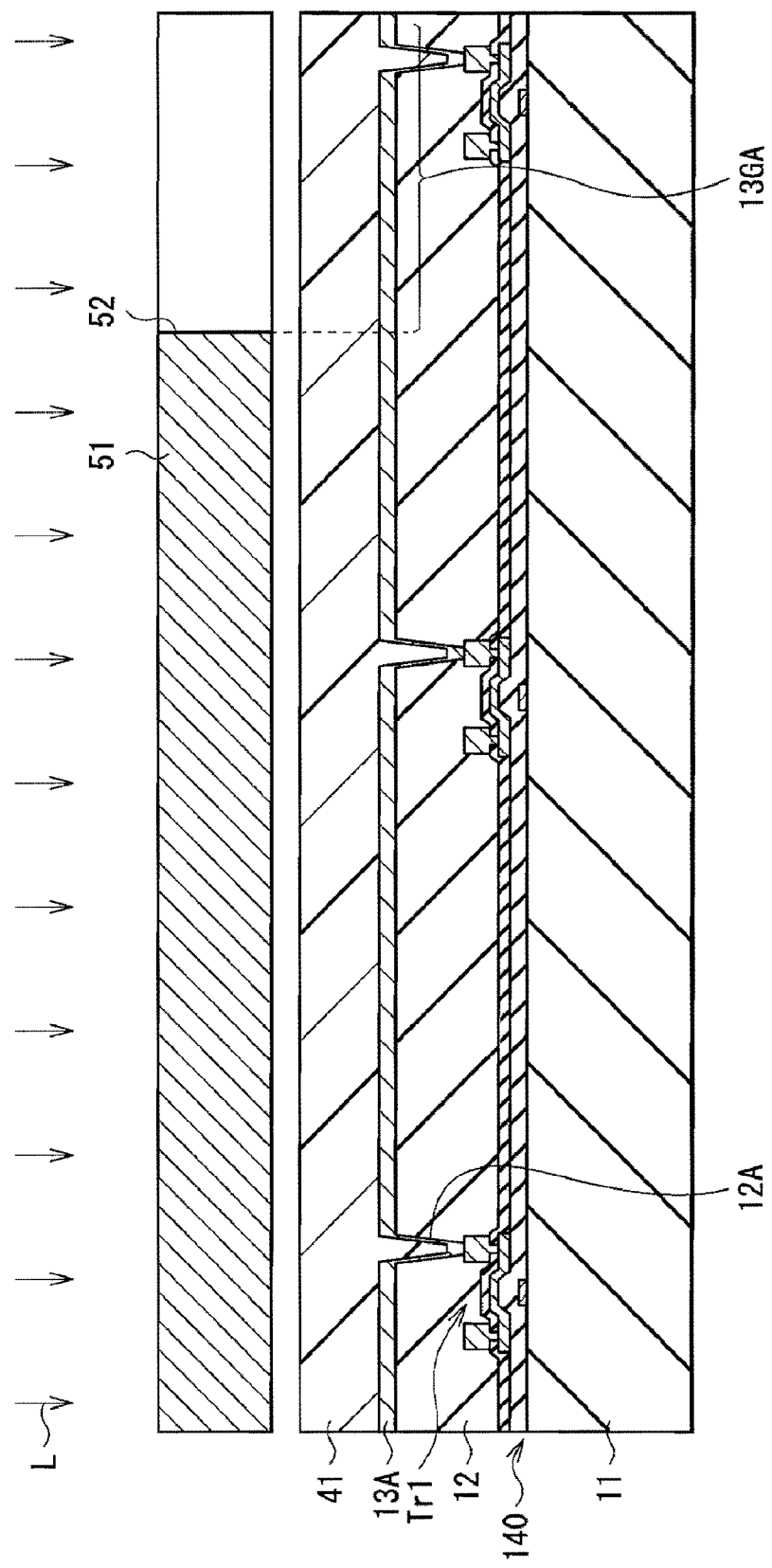
FIG. 6 is a cross section illustrating a process subsequent to FIG. 5.
Figure 7:
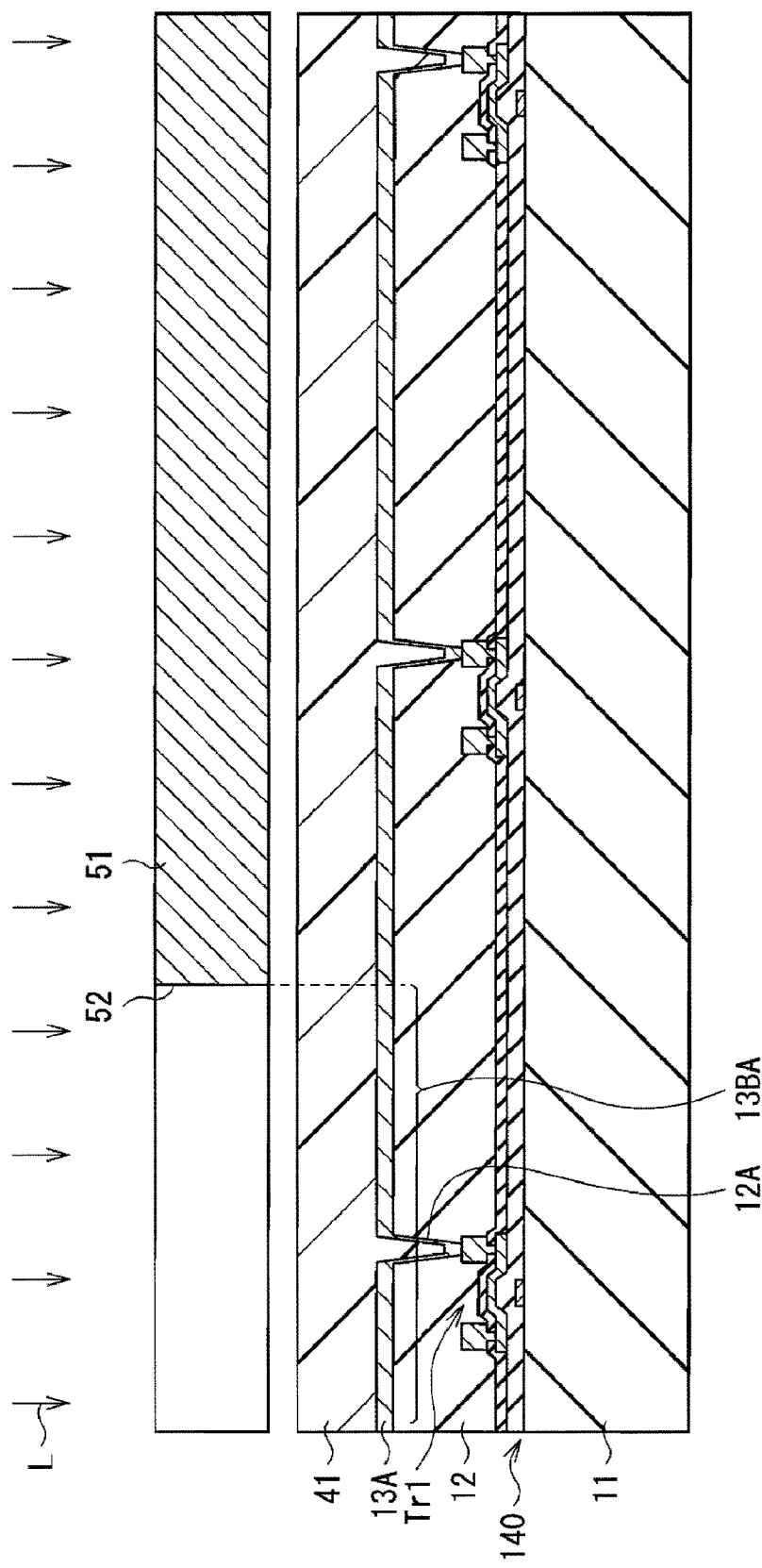
FIG. 7 is a cross section illustrating a process subsequent to FIG. 6.

After that, as shown in FIGS. 5 to 7, a negative photoresist film 41 is formed on the bottom electrode material film 13A. The photoresist film 41 is exposed three times using an evaporation mask 51 for forming the red light emission layer 15CR, the green light emission layer 15CG, or the blue light emission layer 15CB.

In the first time, as shown in FIG. 5, an opening 52 in the evaporation mask 51 is aligned to a region 13RA in which the bottom electrode 13 of the organic light emitting element 10R is to be formed, and exposure is performed on the photoresist film 41. The region 13RA in which the bottom electrode 13 is to be formed is set so as to include the contact hole 12A. At the time of exposure, it is preferable to widen the distance between the evaporation mask 51 and the substrate 11, increase the exposure amount, decrease linearity of exposure light L, or the like in order to form the bottom electrode 13 wider than the opening 52.

In the second time, as shown in FIG. 6, the opening 52 in the evaporation mask 51 is aligned to a region 13GA in which the bottom electrode 13 of the organic light emitting element 10G is to be formed, and exposure is performed on the photoresist film 41. The region 13GA in which the bottom electrode 13 is to be formed is set so as to include the contact hole 12A.

In the third time, as shown in FIG. 7, the opening 52 in the evaporation mask 51 is aligned to a region 13BA in which the bottom electrode 13 of the organic light emitting element 10B is to be formed, and exposure is performed on the photoresist film 41. The region 13BA in which the bottom electrode 13 is to be formed is set so as to include the contact hole 12A.

Figure 8:
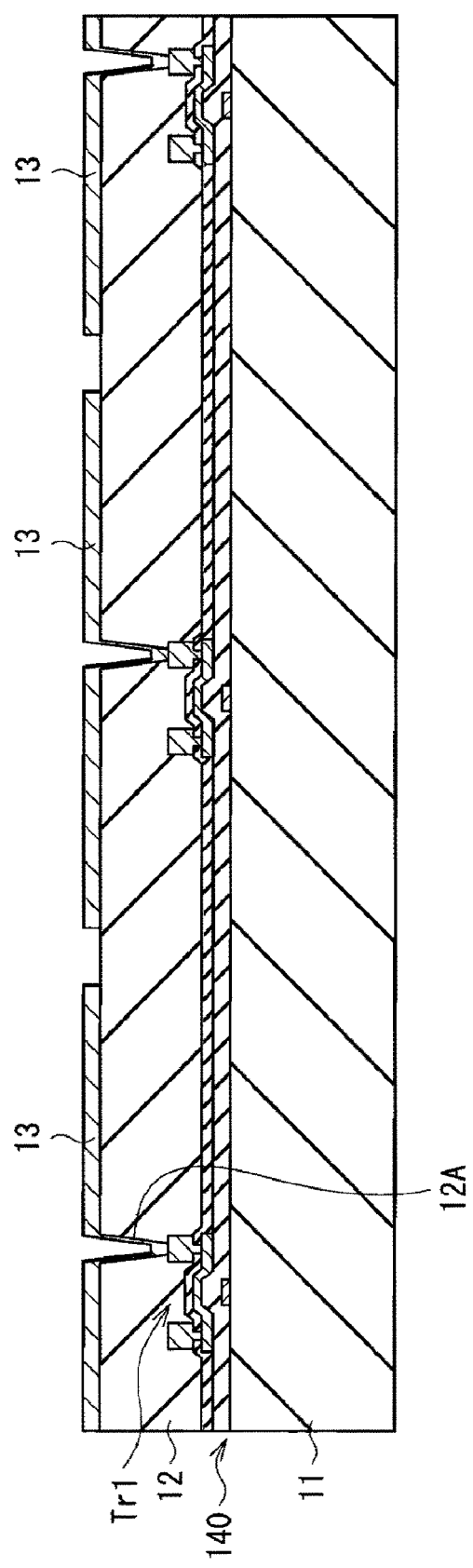
FIG. 8 is a cross section illustrating a process subsequent to FIG. 7.

After the photoresist film 41 is exposed three times using the evaporation mask 51 as described above, the photoresist film 41 is developed. Subsequently, as shown in FIG. 8, by etching using the photoresist film 41 as a mask, the bottom electrode material film 13A is selectively removed. As a result, the bottom electrodes 13 corresponding to the organic light emitting elements 10R, 10G, and 10B are formed in the regions each including the contact hole 12A.

Figure 9:
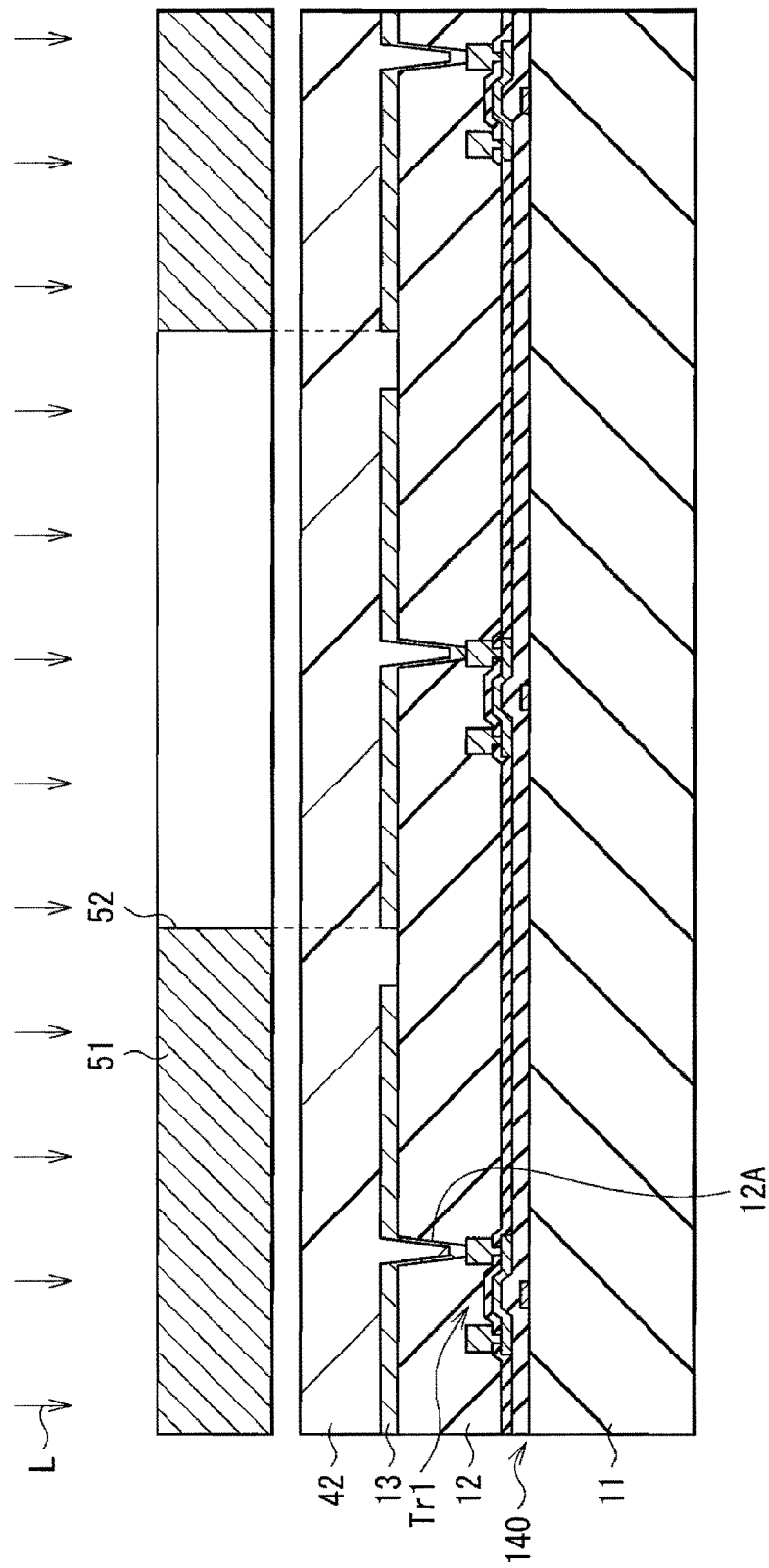
FIG. 9 is a cross section illustrating a process subsequent to FIG. 8.
Figure 10:
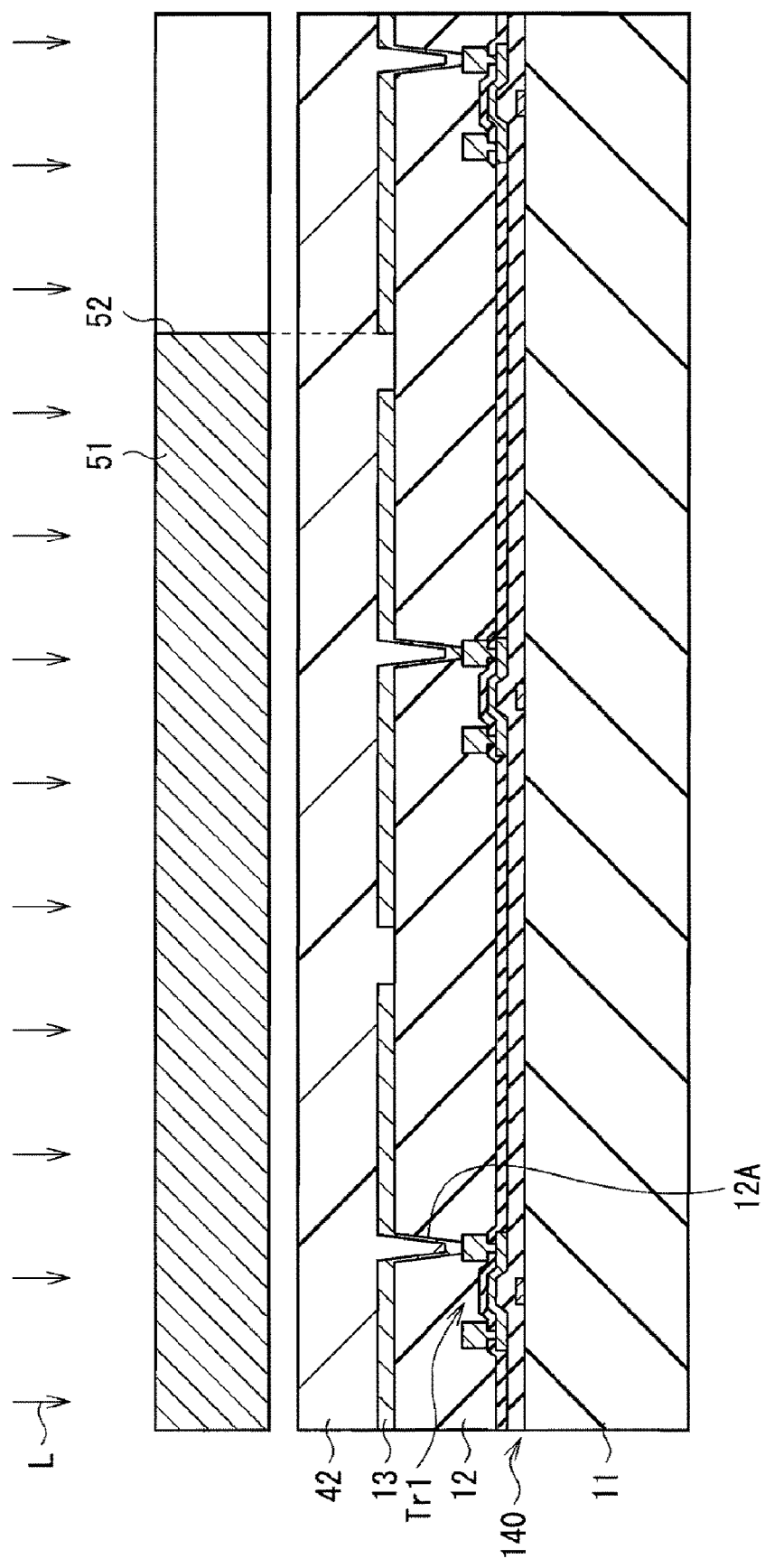
FIG. 10 is a cross section illustrating a process subsequent to FIG. 9.
Figure 11:
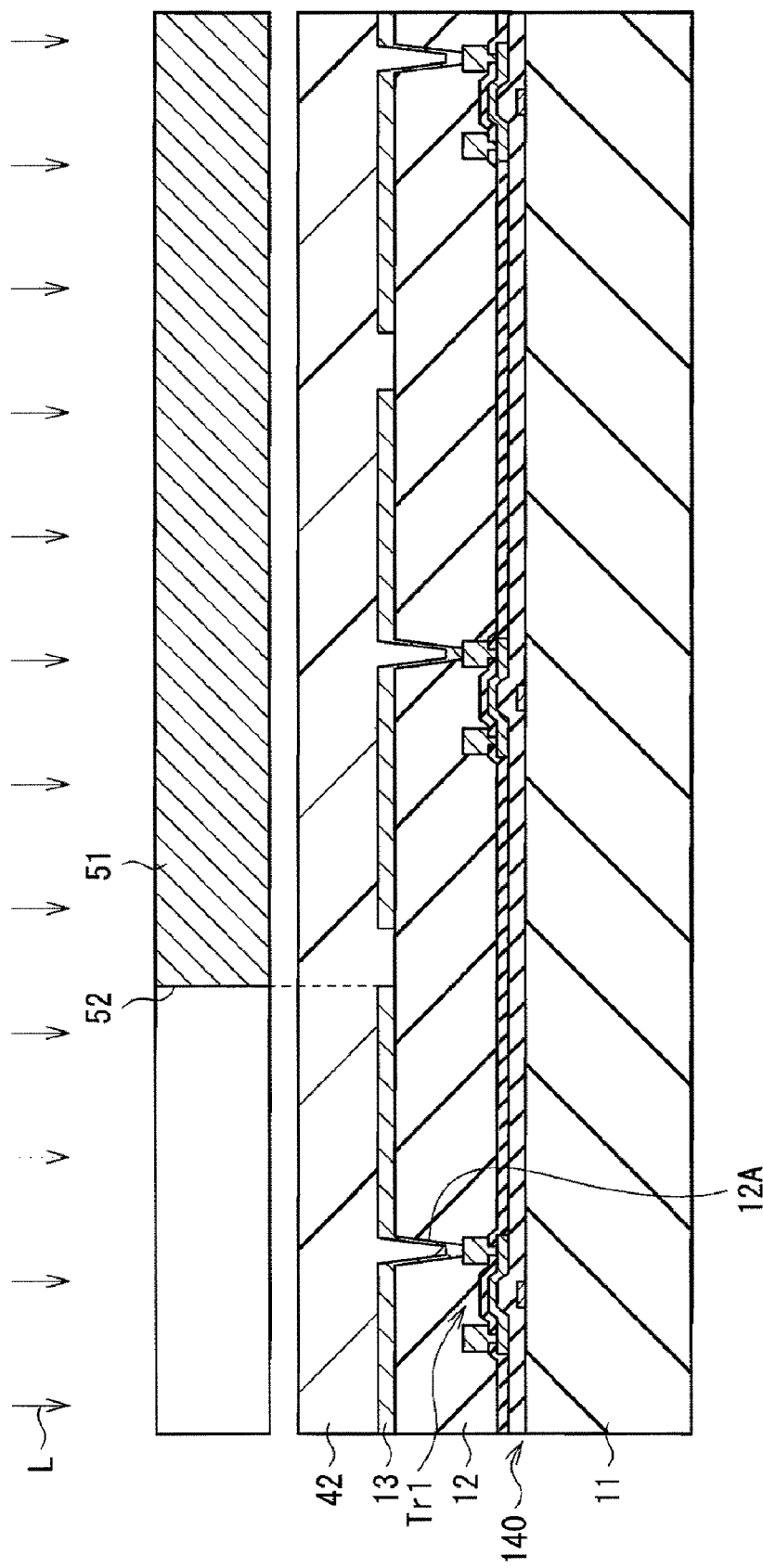
FIG. 11 is a cross section illustrating a process subsequent to FIG. 10.

After formation of the bottom electrode 13, as shown in FIGS. 9 to 11, a photosensitive film 42 made of the material of the pixel isolation insulating film 14 is formed on the entire surface of the substrate 11, and is exposed three times using the evaporation mask 51.

In the first time, as shown in FIG. 9, the opening 52 in the evaporation mask 51 is aligned to the bottom electrode 13 of the organic light emitting element 10R, and exposure is performed on the photosensitive film 42. At the time of exposure, by the same exposure mask 51, the bottom electrode 13 and the pixel isolation insulating film 14 have to be overlapped, that is, the opening in the pixel isolation insulating film 14 has to be made smaller than the bottom electrode 13. Consequently, it is preferable to narrow the distance between the evaporation mask 51 and the substrate 11, decrease the exposure amount, increase linearity of the exposure light L, or the like.

In the second time, as shown in FIG. 10, the opening 52 in the evaporation mask 51 is aligned to the bottom electrode 13 of the organic light emitting element 10G, and exposure is performed on the photosensitive film 42.

In the third time, as shown in FIG. 11, the opening 52 in the evaporation mask 51 is aligned to the bottom electrode 13 of the organic light emitting element 10B, and exposure is performed on the photosensitive film 42.

Figure 12:
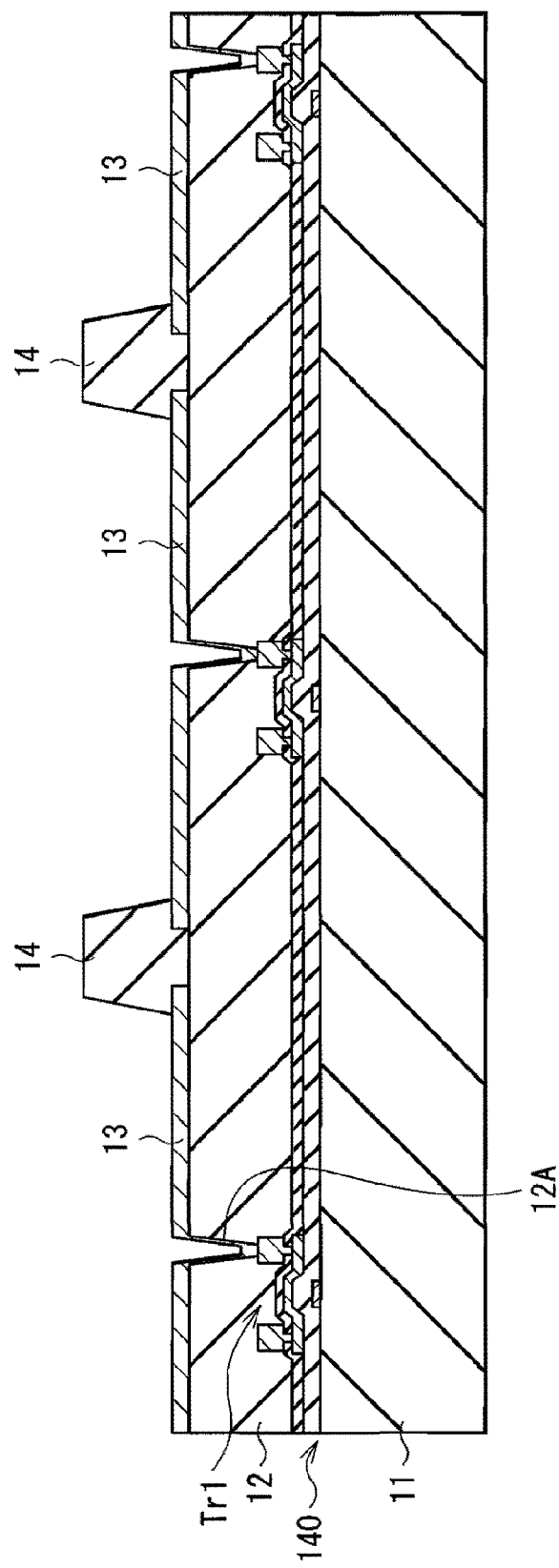
FIG. 12 is a cross section illustrating a process subsequent to FIG. 11.

After the photosensitive film 42 is exposed three times using the evaporation mask 51 as described above, the photosensitive film 42 is developed. As a result, as shown in FIG. 12, the pixel isolation insulating film 14 is formed in the region between the bottom electrodes 13. In the embodiment, the photoresist film 41 for etching the bottom electrode material film 13A and the photosensitive film 42 for forming the pixel isolation insulating film 14 are exposed with the evaporation mask 51, so that a positional deviation between the bottom electrode 13 and the pixel isolation insulating film 14 and the organic layer 15 may be reduced.

Figure 13:
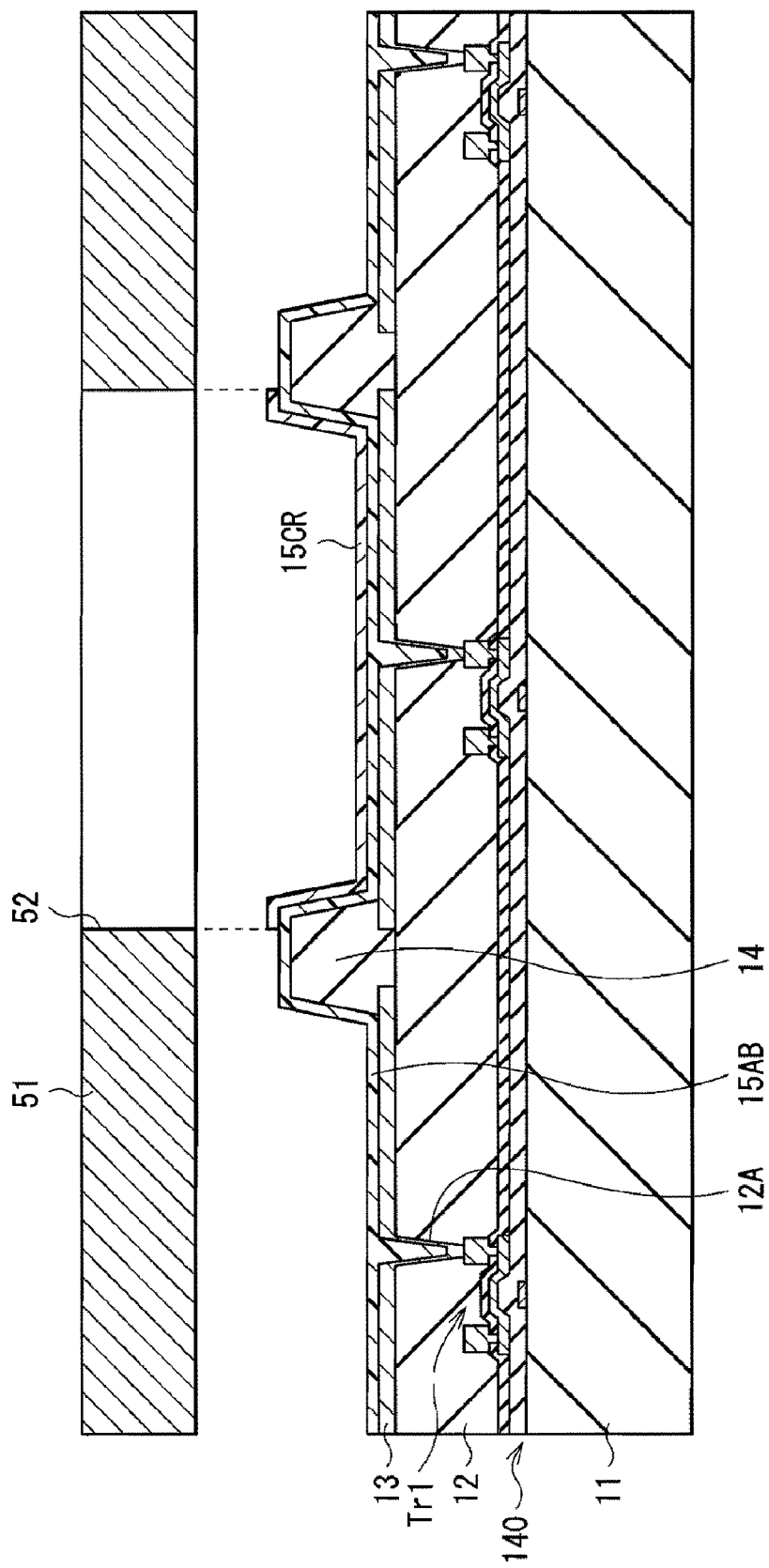
FIG. 13 is a cross section illustrating a process subsequent to FIG. 12.

After formation of the pixel isolation insulating film 14, as shown in FIG. 13, the hole injection layer and hole transport layer 15AB made of the above-described material is formed on the entire surface of the substrate 11 by, for example, evaporation. Subsequently, as shown also in FIG. 13, the opening 52 in the evaporation mask 51 is aligned to the bottom electrode 13 of the organic light emitting element 10R, and the red light emission layer 15CR is formed on the bottom electrode 13 of the organic light emitting element 10R by evaporation using the evaporation mask 51.

Figure 14:
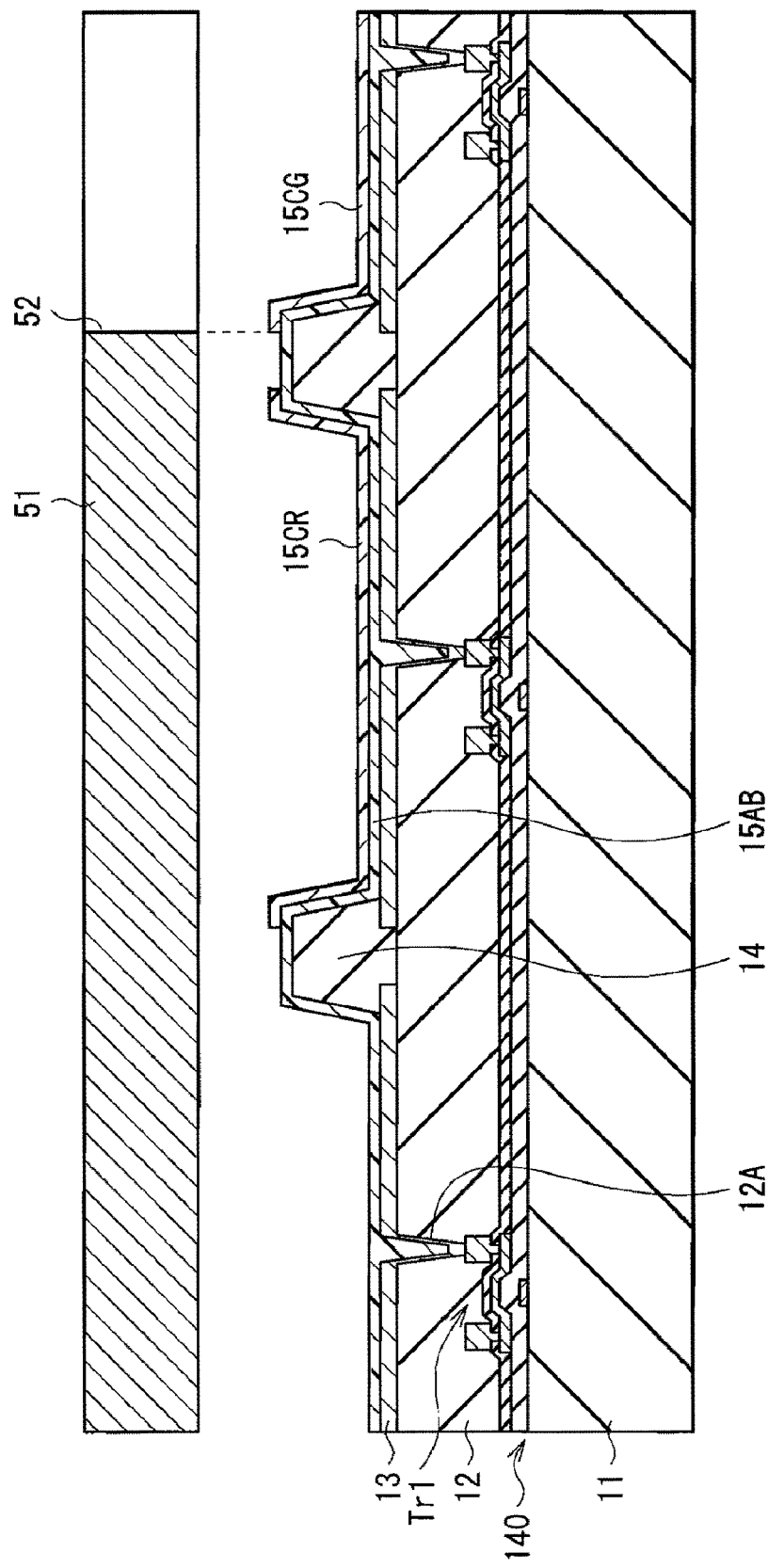
FIG. 14 is a cross section illustrating a process subsequent to FIG. 13.

After formation of the red light emission layer 15CR, as shown in FIG. 14, the opening 52 in the evaporation mask 51 is aligned to the bottom electrode 13 of the organic light emitting element 10G, and the green light emission layer 15CG is formed on the bottom electrode 13 of the organic light emitting element 10G by evaporation using the evaporation mask 51.

Figure 15:
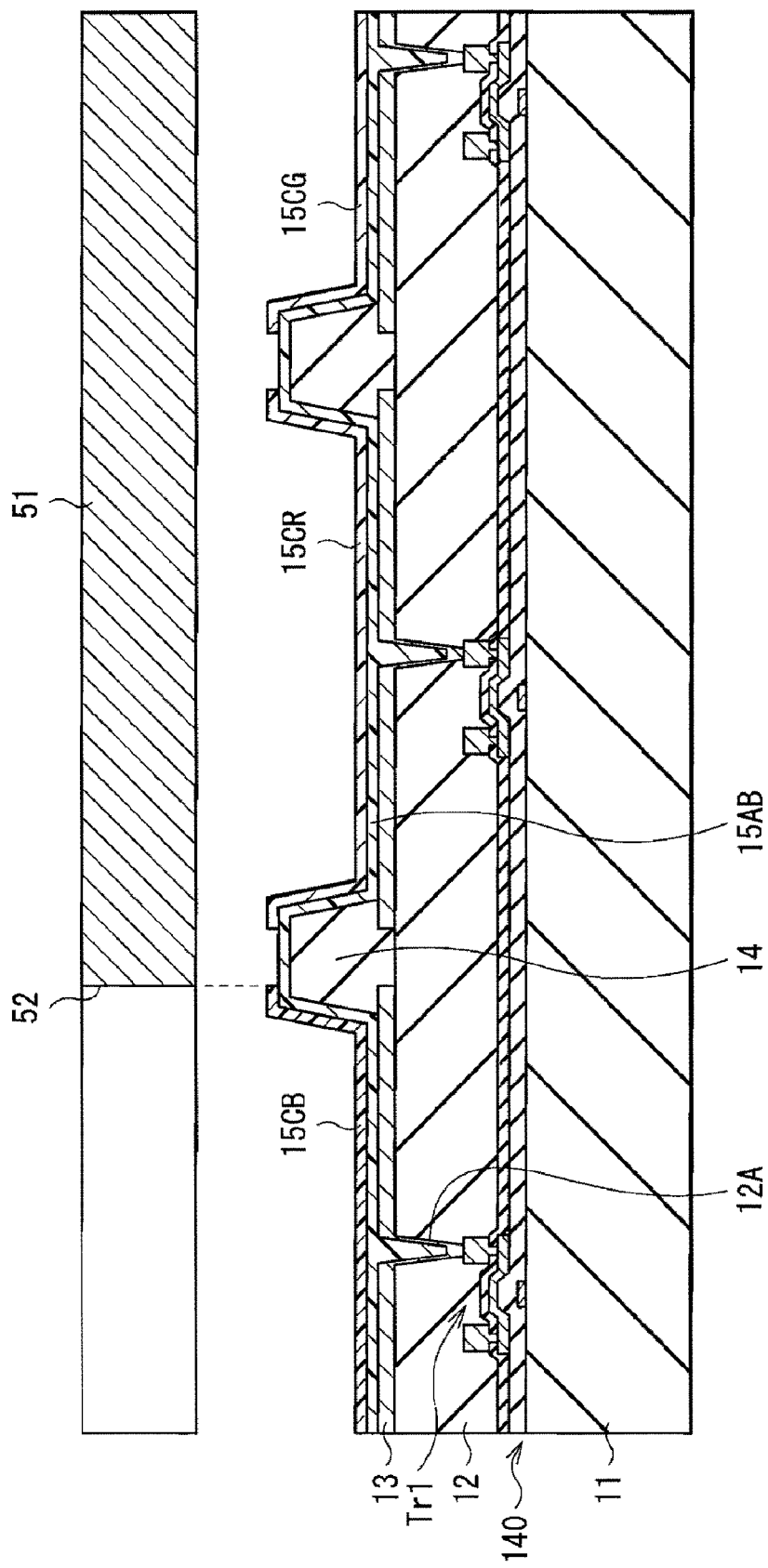
FIG. 15 is a cross section illustrating a process subsequent to FIG. 14.
Figure 16:
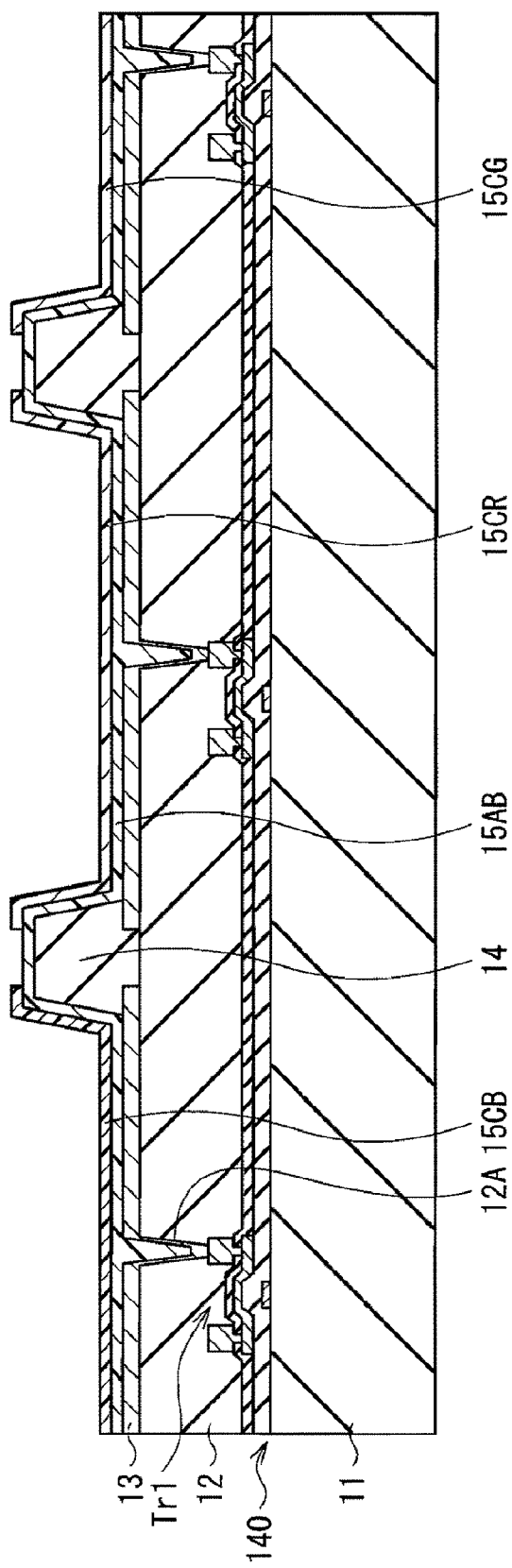
FIG. 16 is a cross section illustrating a process subsequent to FIG. 15.

After formation of the green light emission layer 15CG, as shown in FIG. 15, the opening 52 in the evaporation mask 51 is aligned to the bottom electrode 13 of the organic light emitting element 10B, and the blue light emission layer 15CB is formed on the bottom electrode 13 of the organic light emitting element 10B by evaporation using the evaporation mask 51. As a result, as shown in FIG. 16, the red light emission layer 15CR, the green light emission layer 15CG, and the blue light emission layer 15CB are formed.

Figure 17:
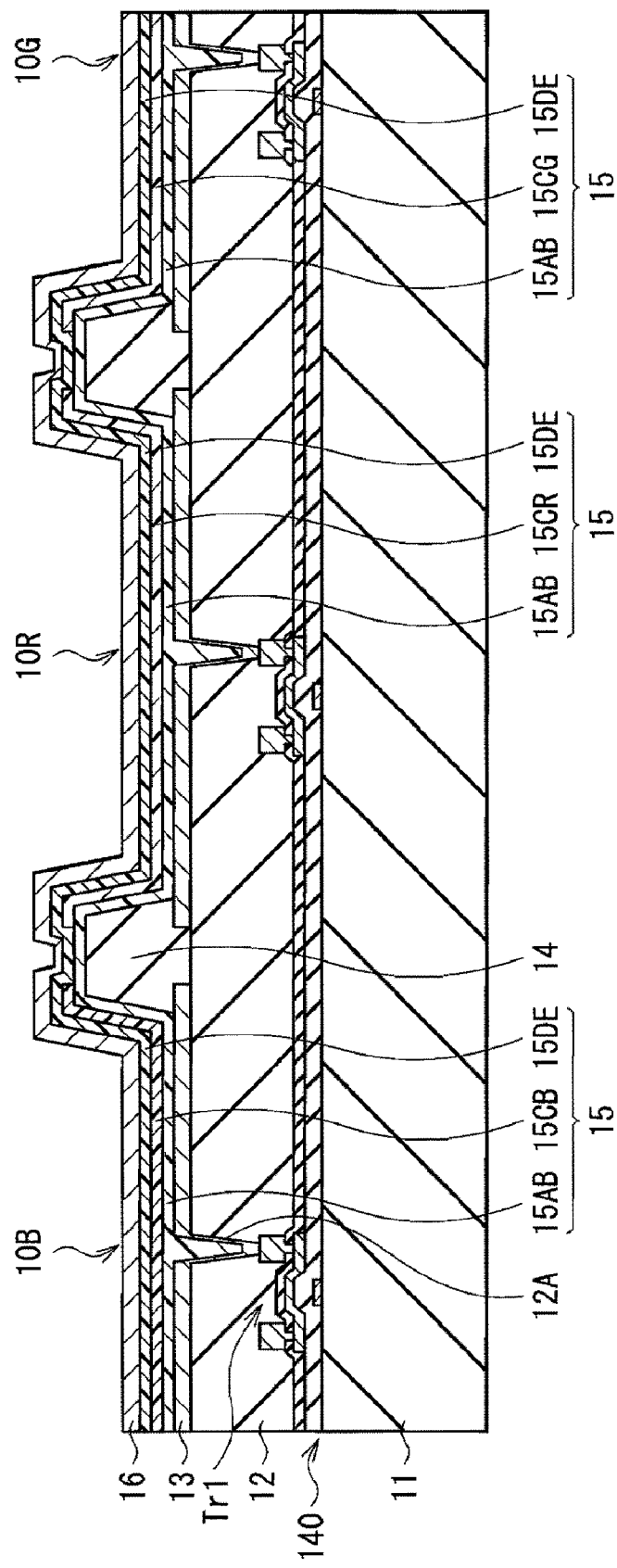
FIG. 17 is a cross section illustrating a process subsequent to FIG. 16.

After that, as show in FIG. 17, the electron transport layer and electron injection layer 15DE made of the above-described material is formed on the entire surface of the substrate 11 by, for example, evaporation. In such a manner, the organic layer 15 is formed. Subsequently, as shown also in FIG. 16, the top electrode 16 made of the above-described material is formed on the organic layer 15 by, for example, evaporation. As a result, the organic light emitting elements 10R, 10G, and 10B are formed.

Figure 18:
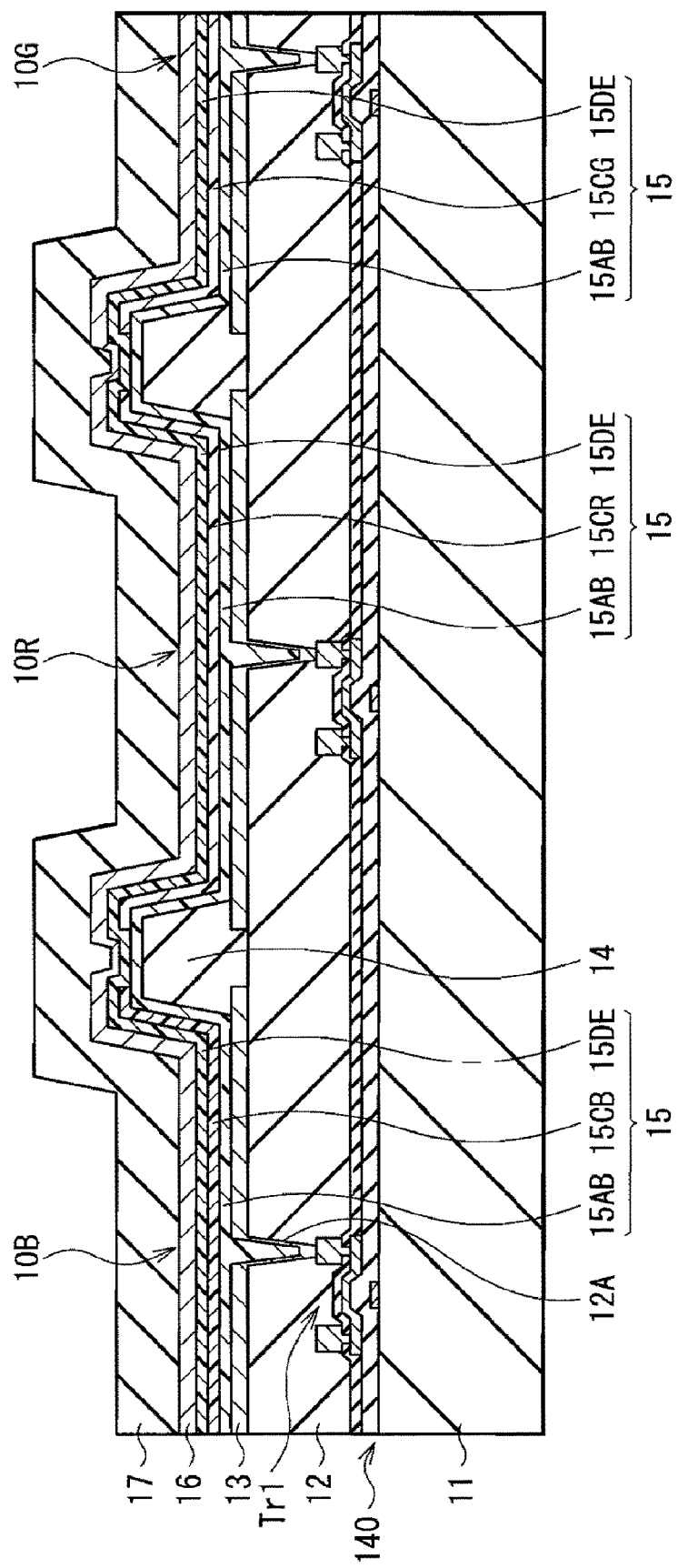
FIG. 18 is a cross section illustrating a process subsequent to FIG. 17.

After formation of the organic light emitting elements 10R, 10G, and 10B, as shown in FIG. 18, the protection film 17 made of the above-described material is formed on the organic light emitting elements 10R, 10G, and 10B. After that, the adhesive layer 30 is formed on the protection film 17, and the sealing substrate 20 is adhered while sandwiching the adhesive layer 30. As a result, the display device shown in FIG. 3 is completed.

In the display device, a scan signal is supplied from the scan line drive circuit 130 to each pixel via the gate electrode of the write transistor Tr2, and an image signal from the signal line drive circuit 120 is held at the retentive capacitor Cs via the write transistor Tr2. That is, the drive transistor Tr1 is on/off controlled according to the signal held in the retentive capacitor Cs. A drive current Id is injected to each of the organic light emitting elements 10R, 10G, and 10B by the on/off control, thereby causing recombination between holes and electrons and generating light. The light passes through the bottom electrode 13 and the substrate 11 (bottom emission), or passes through the top electrode 16 and the sealing substrate 20 (top emission), and is extracted. Since the side face of the contact hole 12A has the forward-tapered shape and the bottom electrode 13 is formed in the region including the contact hole 12A, short-circuit between the bottom electrode 13 and the top electrode 16 in the contact hole 12A is suppressed. Consequently, the contact hole 12A which is covered with the pixel isolation insulating film 14 in related art is included in the light emission region, so that the aperture ratio improves. Therefore, the life of the organic light emitting elements 10R, 10G, and 10B is increased.

In the method of manufacturing the display device of the embodiment, the photoresist film 41 for etching the bottom electrode material film 13A and the photosensitive film 42 for forming the pixel isolation insulating film 14 are exposed using the evaporation mask 51. Consequently, the positional deviation between the bottom electrode 13 and the pixel isolation insulating film 14 and the organic layer 15 is reduced.

In the display device of the embodiment, by forming the side face of the contact hole 12A in the forward tapered shape and forming the bottom electrode 13 in the region including the contact hole 12A, short-circuit between the bottom electrode 13 and the top electrode 16 in the contact hole 12A is suppressed, and the aperture ratio is improved.

In the foregoing embodiment, the case of extracting light generated by the red light emission layer 15CR, the green light emission layer 15CG, or the blue light emission layer 15CB from the bottom electrode 13 side (bottom emission) and the case of extracting the light from the top electrode 16 side (top emission) has been described. In the embodiment, the top electrode 16 has the function of a semi-transmissive reflection layer. The present invention may be also applied to the case where a resonator structure for resonating light generated by the red light emission layer 15CR, the green light emission layer 15CG, or the blue light emission layer 15CB is constructed by the bottom electrode 13 and the top electrode 16.

In the foregoing embodiment, the case where the pixel isolation insulating film 14 is made of a photosensitive resin such as polyimide has been described. The pixel isolation insulating film 14 may be made of an inorganic material such as silicon oxide ($SiO_2$), nitric oxide ($Si_3N_4$), or the like. In this case, the pixel isolation insulating film 14 may be formed as follows. First, an inorganic material film made of the above-described material of the pixel isolation insulating film 14 is formed. Subsequently, a photoresist film is formed on the inorganic material film. The exposure is performed on the photoresist film three times by the processes illustrated in FIGS. 5 to 7 using the evaporation mask 51. After that, the photoresist film is developed. Subsequently, the inorganic material film is selectively removed by etching using the photoresist film as a mask. As a result, the pixel isolation insulating film 14 is formed.

Second Embodiment

Figure 19:
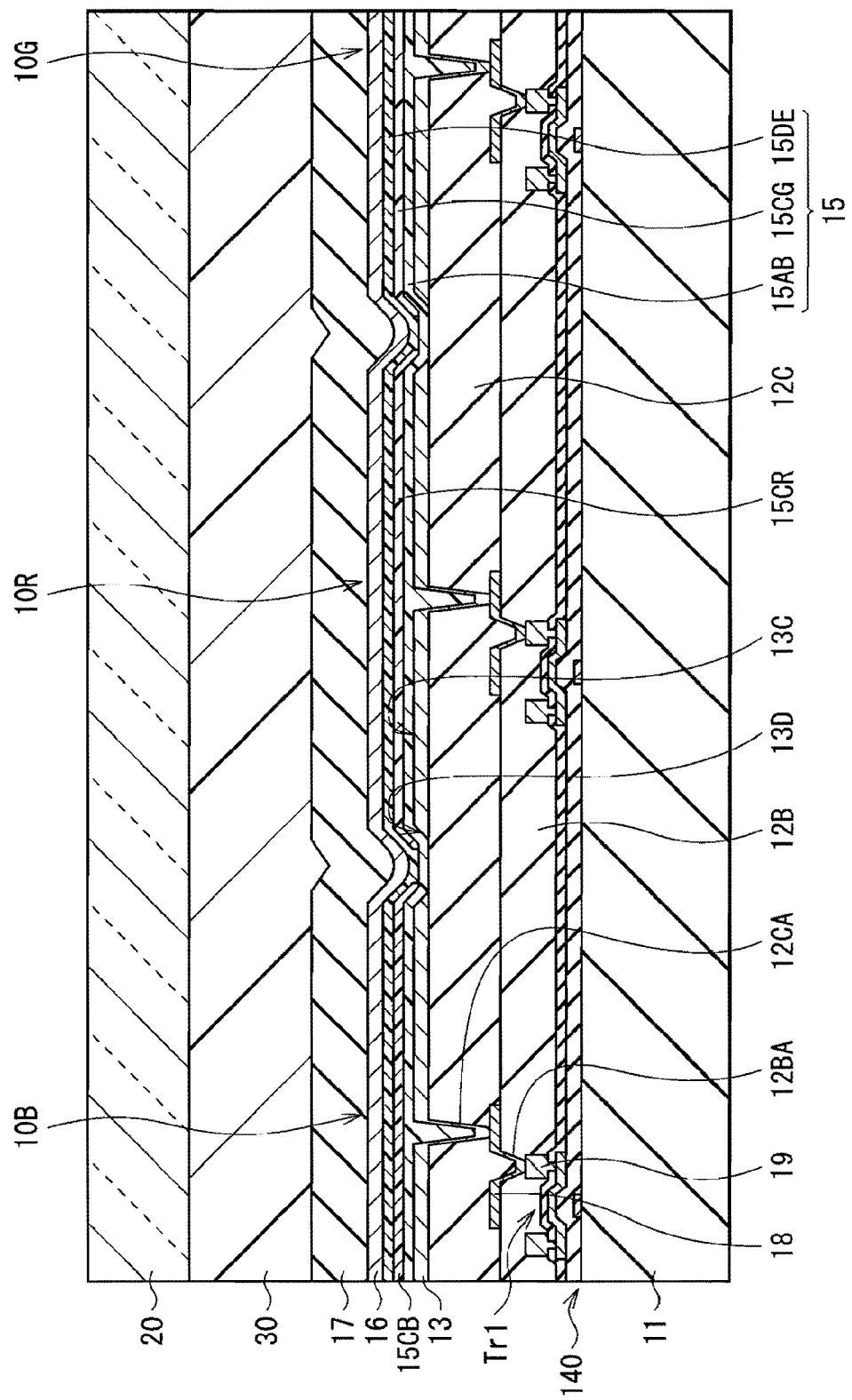
FIG. 19 is a cross section illustrating the configuration of a display region in a display device according to a second embodiment of the present invention.

FIG. 19 illustrates a sectional configuration of the display region 110 in a display device according to a second embodiment of the present invention. The display device is different from that of the first embodiment with respect to the points that the pixel isolation insulating film 14 is not provided, the organic layer 15 is formed so as to cover all of a top face 13C and a side face 13D of the bottom electrode 13, and the drive transistor Tr1 and the bottom electrode 13 are connected to each other via an intermediate electrode. Therefore, the same reference numerals are designated to corresponding components.

The substrate 11 and the pixel drive circuit 140 including the drive transistor Tr1 are similar to those of the first embodiment.

Between the substrate 11 and the bottom electrode 13, a first planarization film 12B, an intermediate electrode 18, and a second planarization film 12C are provided in order.

The first planarization film 12B has the function of an interlayer insulating film between the drive transistor Tr1 and the intermediate electrode 18 and is made of, for example, an organic material such as acrylic, polyimide, or the like or an inorganic material such as silicon oxide (SiO2), nitric oxide ($Si_3N_4$), or the like. The first planarization film 12B is provided with contact holes 12BA for electrically connecting the drive transistor Tr1 and the intermediate electrode 18 in positions corresponding to the drive transistors Tr1. The side face of the contact hole 12BA is desirably forward-tapered.

The planarization film 12C is provided to planarize the surface of the substrate 11 on which the pixel drive circuit 140 is formed and is made of an organic material such as acrylic, polyimide, or the like or an inorganic material such as silicon oxide (SiO2), nitric oxide ($Si_3N_4$), or the like. The second planarization film 12C is provided with contact holes 12CA for electrically connecting the intermediate electrode 18 and the bottom electrode 13. The contact hole 12CA is provided in a position corresponding to the intermediate electrode 18 and its side face is formed in a forward tapered shape. The bottom electrode 13 is formed in a region including the contact hole 12CA. With the configuration, in the display device, short-circuit in the contact hole 12CA is suppressed, and the aperture ratio is improved.

The intermediate electrode 18 is formed in a region including the contact hole 12BA in the first planarization film 12B, and its material is not limited as long as it is a conductive material. The intermediate electrode 18 suppresses short-circuit between the bottom electrode 13 and the top electrode 14 in the contact hole 12A which occurs due to roughness of the surface of a wire electrode 19 made by a thick aluminum (Al) film of the drive transistor Tr1.

In the embodiment, the organic layer 15 is formed so as to cover all of the top face 13C and the side face 13D of the bottom electrode 13. With the configuration, it becomes unnecessary to provide the pixel isolation insulating film 14, the aperture ratio is further increased, and the device life is further improved. Also in the case of bottom emission, the area of connection to the drive transistor Tr1 is small, and the influence of reduction in the aperture ratio by the pixel isolation insulating film 14 is larger. The process of forming the pixel isolation insulating film 14 is made unnecessary, the process is largely made simpler, and the cost is reduced. Further, there is no damage on the top face 13C of the bottom electrode 13 caused by formation and patterning of the pixel isolation insulating film 14, and roughness of the top face 13C is prevented, so that the device characteristics are excellent. In addition, since there is no roughness which makes the pixel isolation insulating film 14 thicker, coverage of the protection film 17 is excellent, and reliability improves.

The side face 13D of the bottom electrode 13 has preferably a forward-tapered shape for the following reasons. The possibility that the organic layer 15 is interrupted on the side face 13D of the bottom electrode 13 decreases and short-circuit between the bottom electrode 13 and the top electrode 16 is suppressed. "The side face 13D of the bottom electrode 13 has a forward-tapered shape" means that the dimension of the bottom electrode 13 gradually decreases from the substrate 11 side in a conical shape or a pyramid shape.

Figure 20:
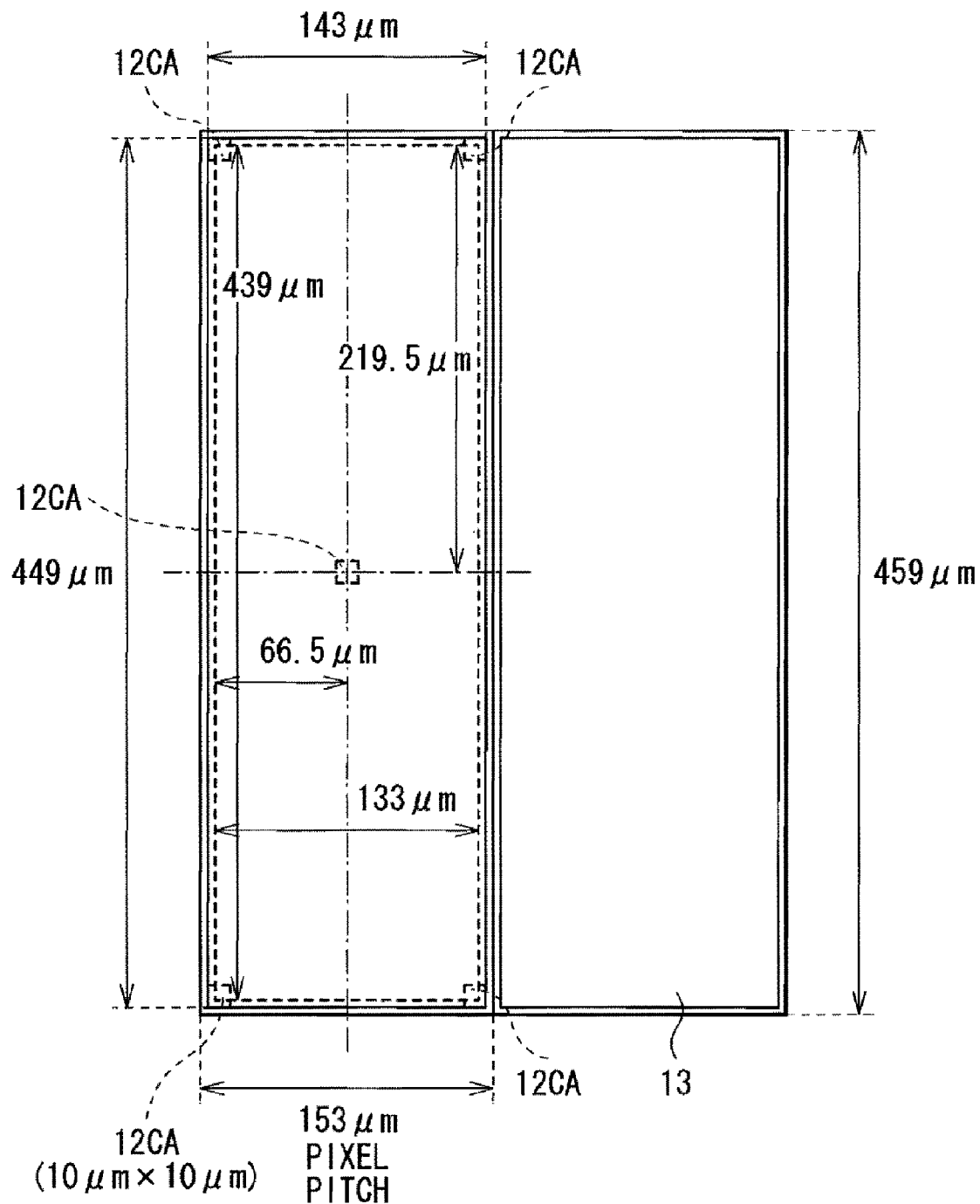
FIG. 20 is diagram for explaining a positional relation in plan view between a contact hole and a bottom electrode.

The bottom electrode 13 is preferably thinner than the organic layer 15. When the bottom electrode 13 is sufficiently thin, the possibility that the organic layer 15 is interrupted on the side face 13D of the bottom electrode 13 is reduced, and short-circuit between the bottom electrode 13 and the top electrode 16 is suppressed. In this case, the side face 13D of the bottom electrode 13 does not always have to be formed in a forward-tapered shape. Concretely, for example, in a 40-inch FHD display device, as shown in FIG. 20, the size of one pixel is about 153 μm×459 μm, and the size of the bottom electrode 13 is 143 μm×449 μm. According to "58.1: Invited Paper: Views on the Present and Future Promise of OLED displays", Nobuki Ibaraki, et al, "SID 06 DIGEST", pp. 1760-1763, the performance which may be realized in 2008, the maximum current necessary for one pixel is about 2 μA and it is predicted that the necessary current is reduced to about ⅓ of 2 μA by subsequent improvement. When it is assumed that necessary voltage is 5V, resistance of the organic layer 15 of one pixel is 2.5 MΩ. When the size of the contact hole 12CA in the drive transistor Tr1 is 10 μm×10 μm and is disposed in the center of a pixel, the length of the diagonal line of the contact hole 12CA is 14.1 μm, a deviation amount in the lateral direction in the case where the contact hole 12CA is deviated to an end of the pixel is 66.5 μm, and a deviation amount in the longitudinal direction is 219.5 μm. Therefore, resistance to the pixel end is as large as 16 times of sheet resistance ($\sqrt{(66.5^2+219.5^2)}/14.1 \approx 16$) or less. When an amount of a voltage drop due to the sheet resistance of the bottom electrode 13 is set up to ±0.1% in order to reduce the difference of light emission brightness within one pixel, the sheet resistance is permitted to 156Ω/. Even in the case where the bottom electrode 13 is made of ITO having high resistivity, if the resistivity of ITO is $1.5 \times 10^{-4}$ Ω·cm, thickness of 10 nm or more is sufficient. The thickness of the regular organic layer 15 is 50 nm or larger, the bottom electrode 13 is much thinner than the organic layer 15.

The display device is manufactured, for example, as follows.

Figure 21:
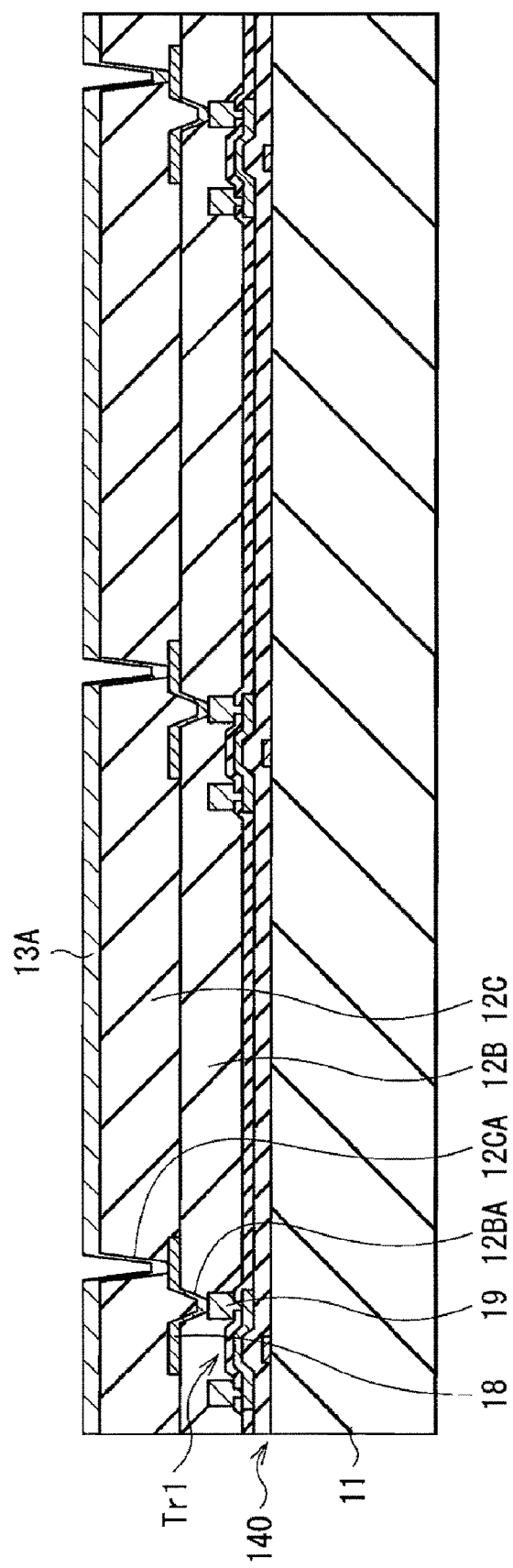
FIG. 21 is a cross section illustrating a method of manufacturing the display device shown in FIG. 19 in process order.

FIGS. 21 to 28 illustrate a method of manufacturing the display device in process order. First, as illustrated in FIG. 21, in a manner similar to the first embodiment, the pixel drive circuit 140 including the drive transistor Tr1 is formed on the substrate 11.

Subsequently, also as illustrated in FIG. 21, by coating the entire surface of the substrate 11 with a photosensitive resin and performing exposure and development, the first planarization film 12B having, in a position corresponding to the drive transistor Tr1, the contact hole 12BA whose side face has a forward-tapered shape is formed and baked. At this time, by using a positive photosensitive resin as the material of the first planarization film 12B, the side face of the contact hole 12BA may be easily formed in a forward tapered shape.

Subsequently, as shown also in FIG. 21, an intermediate electrode material film (not shown) made of the material of the above-described intermediate electrode 18 is formed on the planarization film 12B and is shaped in a predetermined shape by, for example, photolithography, thereby forming the intermediate electrode 18.

After that, as also shown in FIG. 21, a photosensitive resin is coated on the entire surface of the substrate 11, exposed, and developed, thereby forming the second planarization film 12C having the contact hole 12CA whose side face has the forward-tapered shape in a position corresponding to the intermediate electrode 18 and baking it. At this time, by using a positive photosensitive resin as the material of the second planarization film 12C, the side face of the contact hole 12CA may be easily formed in a forward tapered shape.

After formation of the second planarization film 12C, as also shown in FIG. 21, the bottom electrode material film 13A made of the material of the bottom electrode 13 is formed on the second planarization film 12C.

Figure 22:
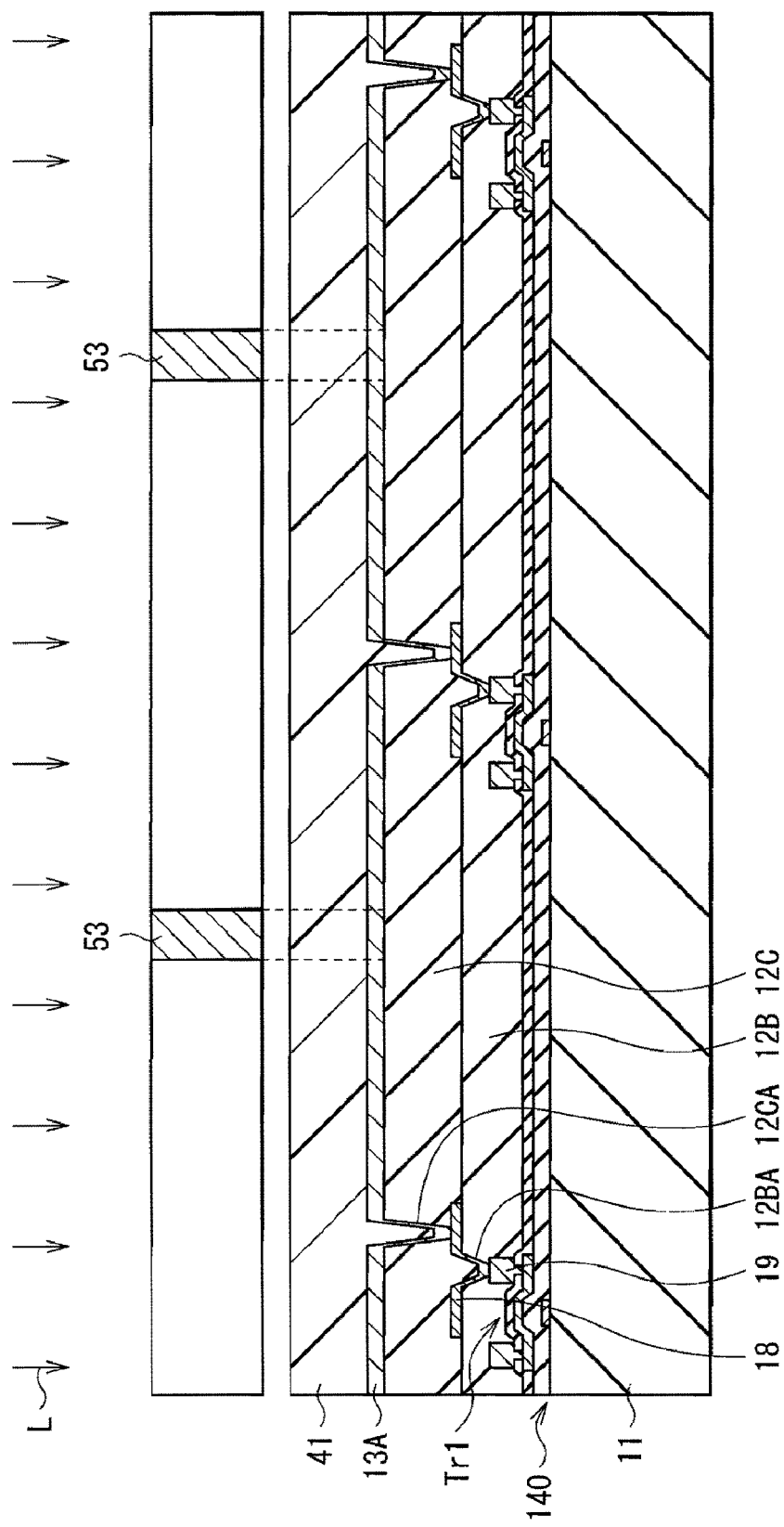
FIG. 22 is a cross section illustrating a process subsequent to FIG. 21.
Figure 23:
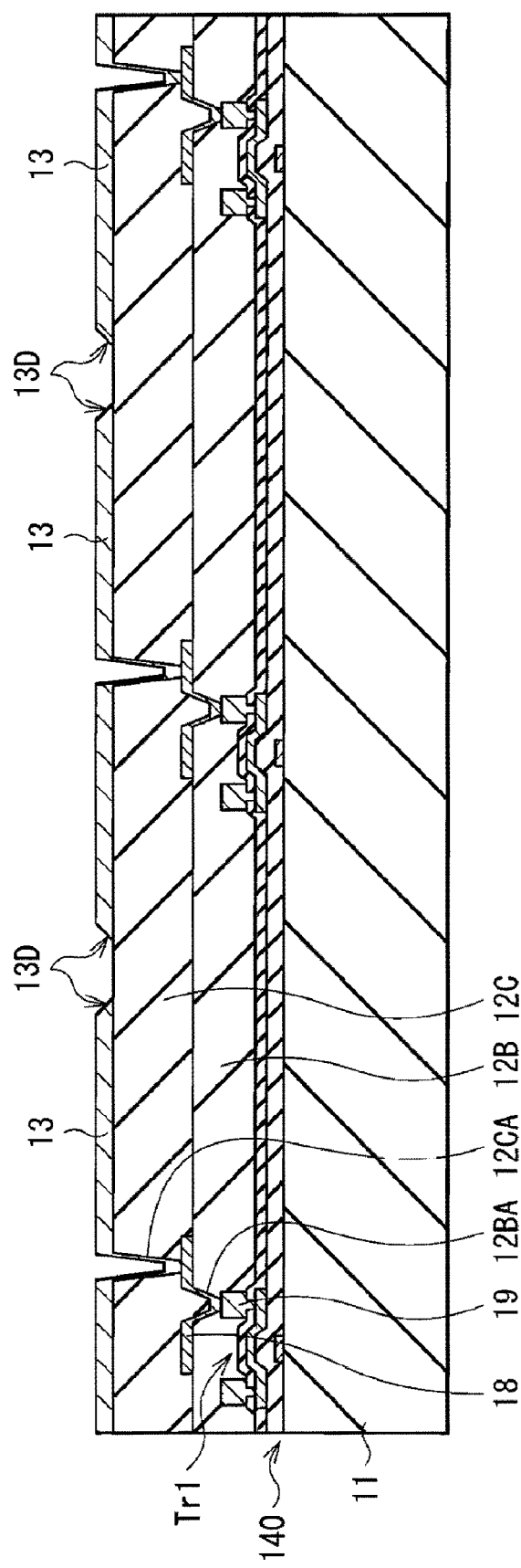
FIG. 23 is a cross section illustrating a process subsequent to FIG. 22.

After formation of the bottom electrode material film 13, as shown in FIG. 22, the negative photoresist film 41 is formed on the bottom electrode material film 13A. The photoresist film 41 is exposed using an exposure mask 53 and developed. Subsequently, by etching using the photoresist film 41 as a mask, the bottom electrode material film 13A is selectively removed. As a result, as shown in FIG. 23, the bottom electrodes 13 corresponding to the organic light emitting elements 10R, 10G, and 10B are formed in the regions each including the contact hole 12A. At this time, by adjustment of the etching parameters, the side face 13D of the bottom electrode 13 is formed in a forward-tapered shape. Alternatively, the bottom electrode 13 is made thinner than the organic layer 15.

Figure 24:
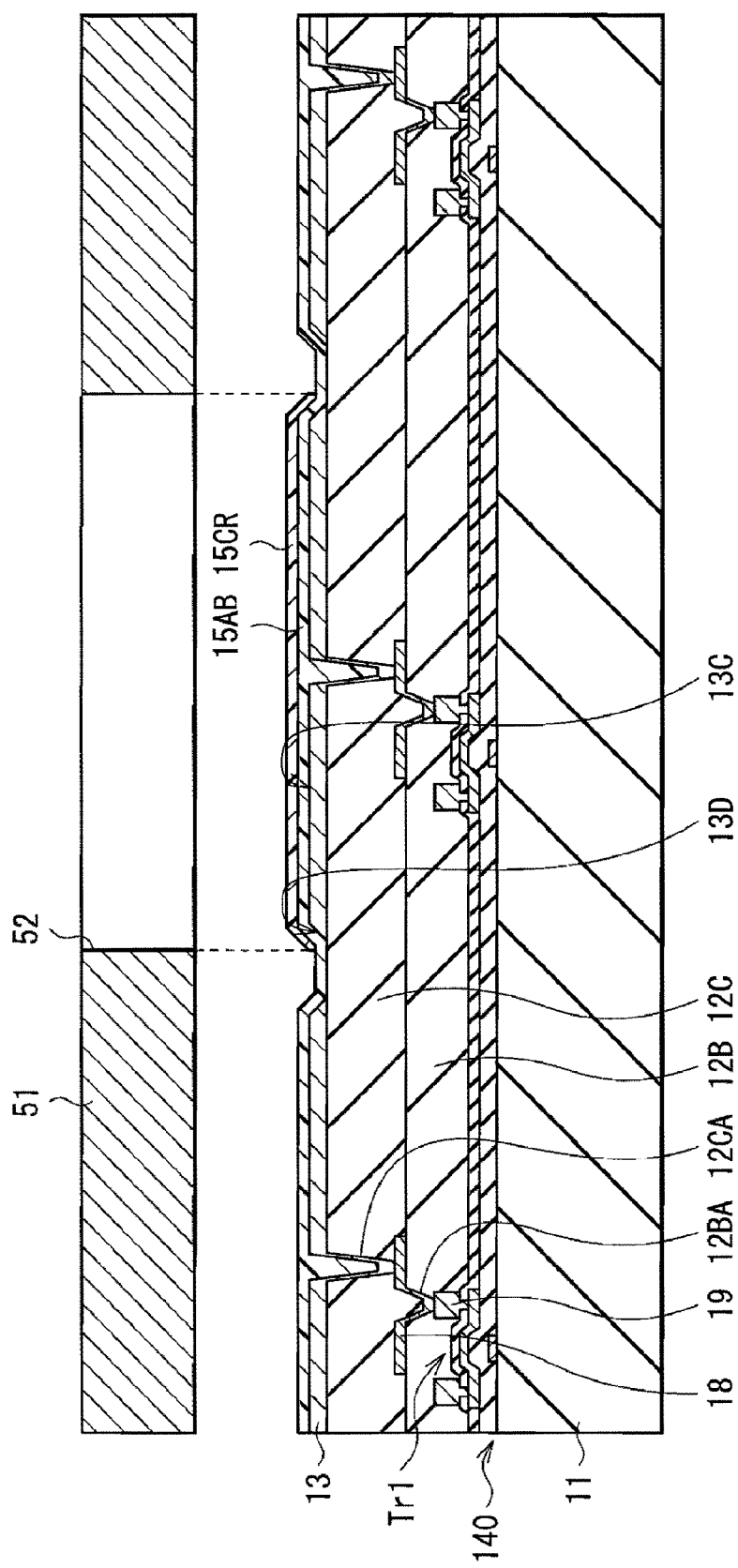
FIG. 24 is a cross section illustrating a process subsequent to FIG. 23.

After formation of the bottom electrode 13, as shown in FIG. 24, the hole injection layer and hole transport layer 15AB made of the above-described material is formed on the entire surface of the substrate 11 by, for example, evaporation. Subsequently, as also shown in FIG. 23, the opening 52 in the evaporation mask 51 is aligned to the bottom electrode 13 of the organic light emitting element 10R, and the red light emission layer 15CR is formed on the bottom electrode 13 of the organic light emitting element 10R by evaporation using the evaporation mask 51.

Figure 25:
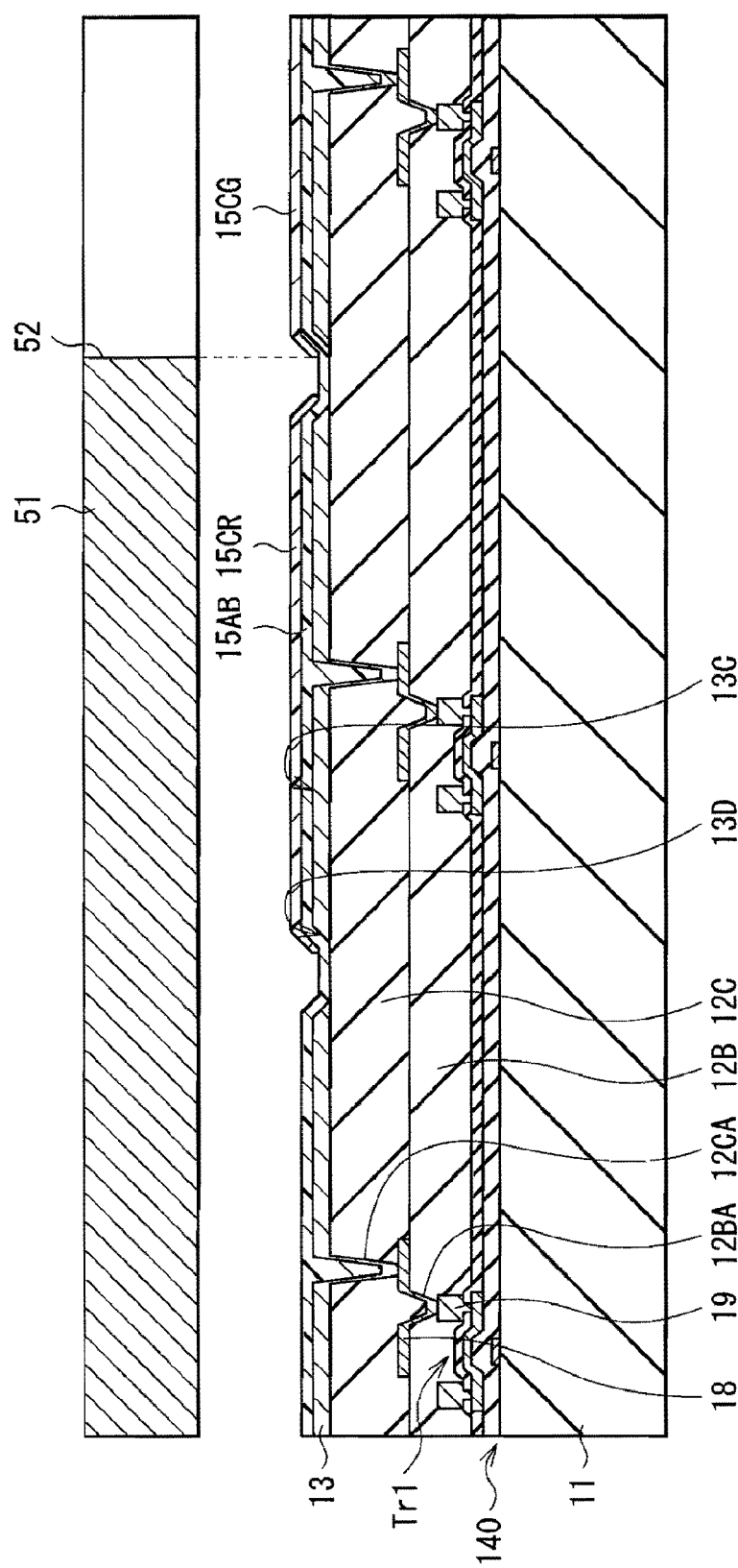
FIG. 25 is a cross section illustrating a process subsequent to FIG. 24.

After formation of the red light emission layer 15CR, as shown in FIG. 25, the opening 52 in the evaporation mask 51 is aligned to the bottom electrode 13 of the organic light emitting element 10G, and the green light emission layer 15CG is formed on the bottom electrode 13 of the organic light emitting element 10G by evaporation using the evaporation mask 51.

Figure 26:
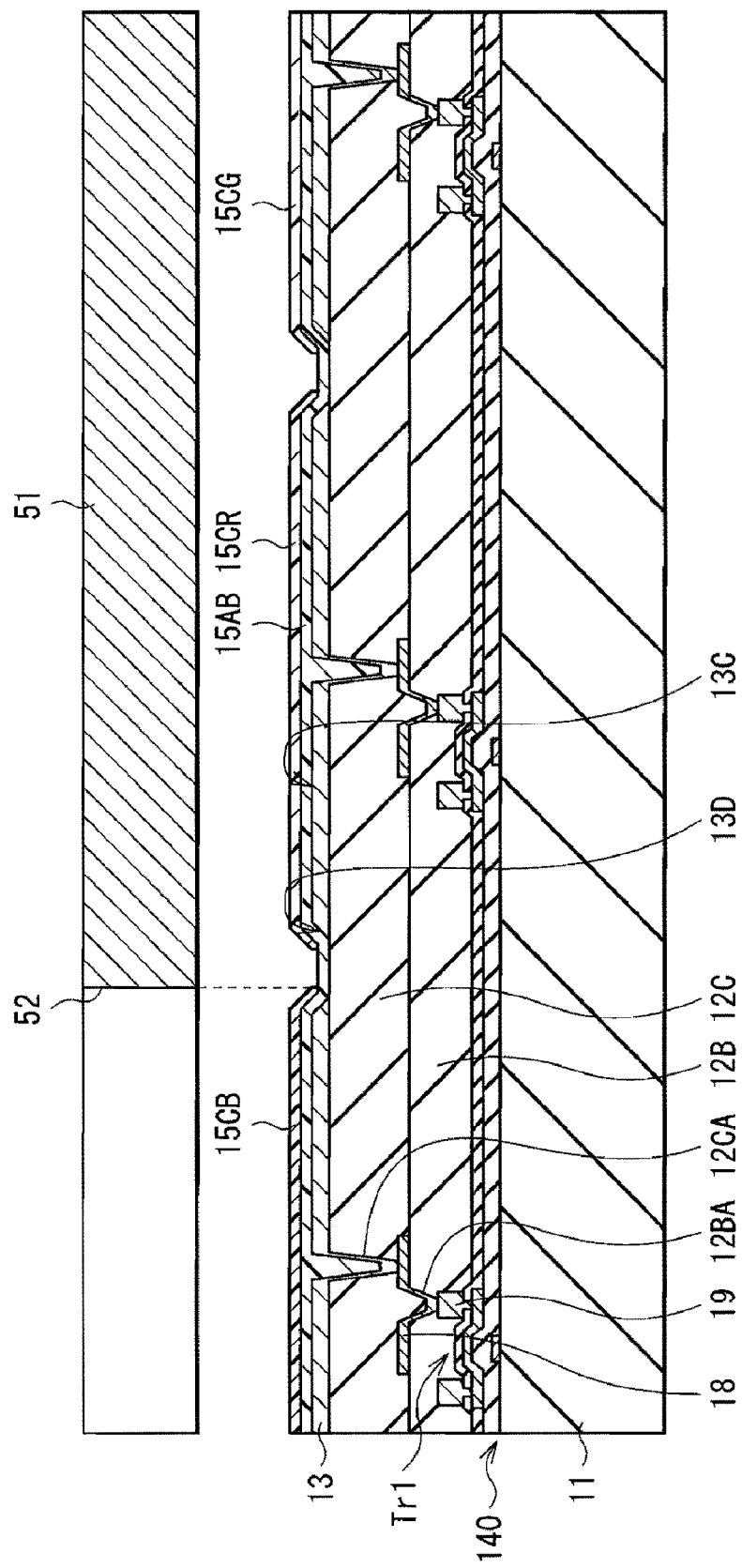
FIG. 26 is a cross section illustrating a process subsequent to FIG. 25.

After formation of the green light emission layer 15CG, as shown in FIG. 26, the opening 52 in the evaporation mask 51 is aligned to the bottom electrode 13 of the organic light emitting element 10B, and the blue light emission layer 15CB is formed on the bottom electrode 13 of the organic light emitting element 10B by evaporation using the evaporation mask 51. By the operation, the red light emission layer 15CR, the green light emission layer 15CG, and the blue light emission layer 15CB are formed.

Figure 27:
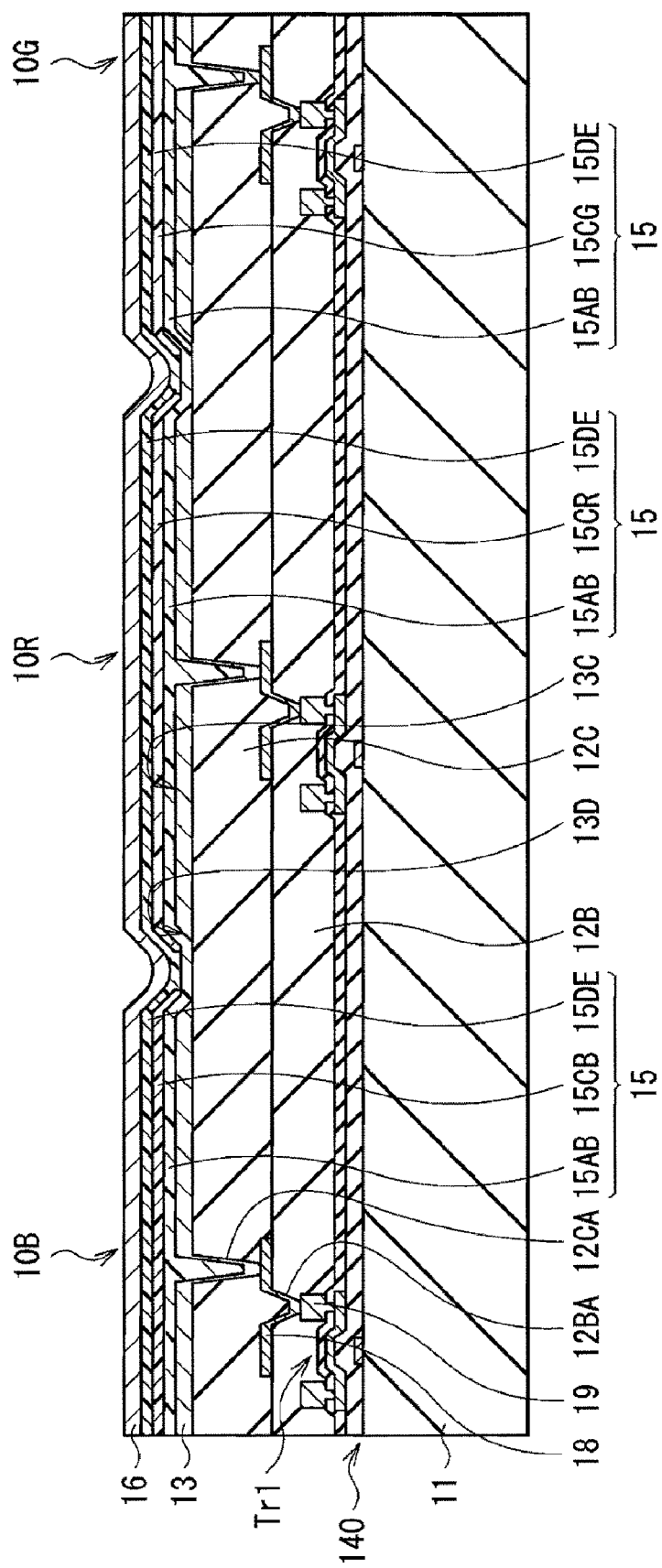
FIG. 27 is a cross section illustrating a process subsequent to FIG. 26.

After that, as shown in FIG. 27, the electron transport layer and electron injection layer 15DE made of the above-described material is formed on the entire surface of the substrate 11 by, for example, evaporation. In such a manner, the organic layer 15 is formed. Subsequently, as shown also in FIG. 26, the top electrode 16 made of the above-described material is formed on the organic layer 15 by, for example, evaporation. As a result, the organic light emitting elements 10R, 10G, and 10B are formed.

Figure 28:
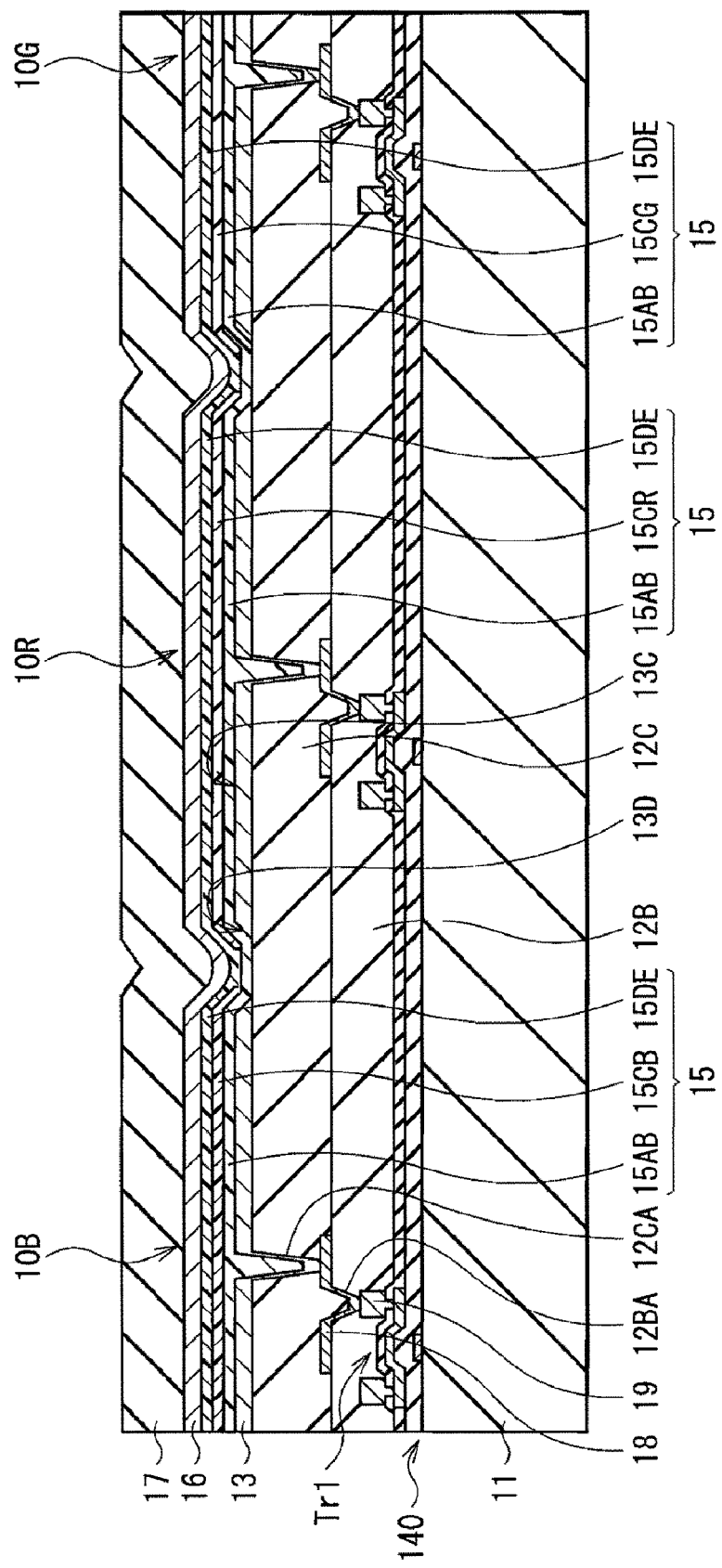
FIG. 28 is a cross section illustrating a process subsequent to FIG. 10.

After formation of the organic light emitting elements 10R, 10G, and 10B, as shown in FIG. 28, the protection film 17 made of the above-described material is formed on the organic light emitting elements 10R, 10G, and 10B. After that, the adhesive layer 30 is formed on the protection film 17, and the sealing substrate 20 is adhered while sandwiching the adhesive layer 30. As a result, the display device shown in FIG. 19 is completed.

In the display device, a scan signal is supplied from the scan line drive circuit 130 to each pixel via the gate electrode of the write transistor Tr2, and an image signal from the signal line drive circuit 120 is held at the retentive capacitor Cs via the write transistor Tr2. That is, the drive transistor Tr1 is on/off controlled according to the signal held in the retentive capacitor Cs. A drive current Id is injected to each of the organic light emitting elements 10R, 10G, and 10B by the on/off control, thereby causing recombination between holes and electrons and generating light. The light passes through the bottom electrode 13 and the substrate 11 (bottom emission), or passes through the top electrode 16 and the sealing substrate 20 (top emission), and is extracted. In a manner similar to the first embodiment, since the side face of the contact hole 12A has the forward-tapered shape and the bottom electrode 13 is formed in the region including the contact hole 12A, short-circuit between the bottom electrode 13 and the top electrode 16 in the contact hole 12A is suppressed. Consequently, the contact hole 12A which is covered with the pixel isolation insulating film 14 in related art is included in the light emission region, so that the aperture ratio improves. Therefore, the life of the organic light emitting elements 10R, 10G, and 10B is increased.

Since the organic layer 15 is formed so as to cover all of the top face 13C and the side face 13D of the bottom electrode 13, the pixel isolation insulating film 14 is unnecessary, and the aperture ratio further increases.

In the display device of the embodiment as described above, in addition to the effects of the first embodiment, the organic layer 15 is formed so as to cover all of the top face 13C and the side face 13D of the bottom electrode 13. Therefore, the pixel isolation insulating film 14 is unnecessary, the aperture ratio further increases, and the device life is further improved. In addition, the process of forming the pixel isolation insulating film 14 can be omitted, so that the process is largely simplified, and the cost is reduced.

Also in the second embodiment, in a manner similar to the first embodiment, the top electrode 16 has the function of a semi-transmissive reflection layer. The present invention is applicable to the case where a resonator structure for resonating light generated by the red light emission layer 15CR, the green light emission layer 15CG, or the blue light emission layer 15CB is constructed by the bottom electrode 13 and the top electrode 16.

A modification of the second embodiment will now be described.

Modification 1

Figure 29:
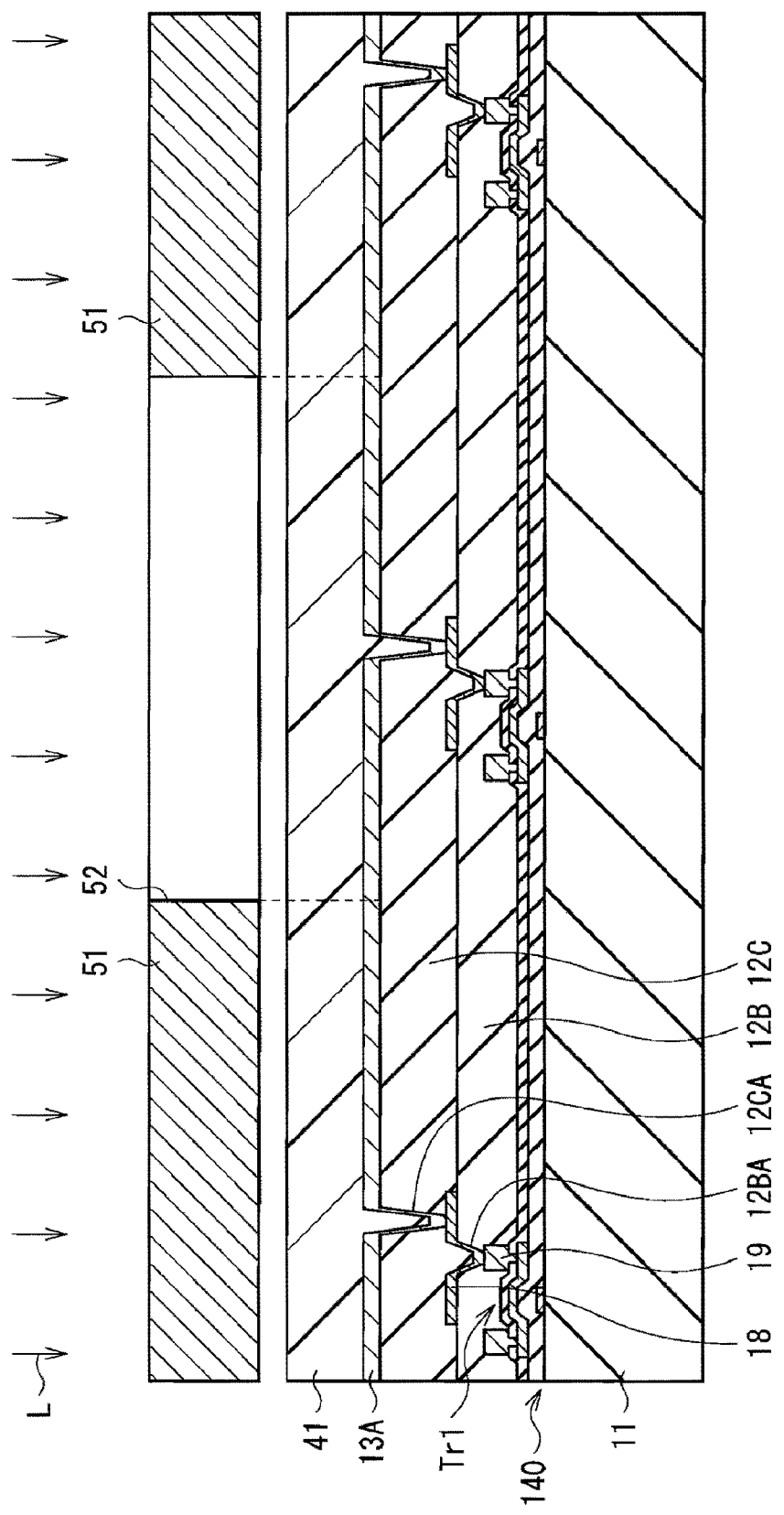
FIG. 29 is a cross section illustrating a method of manufacturing a display device according to modification 1.
Figure 30:
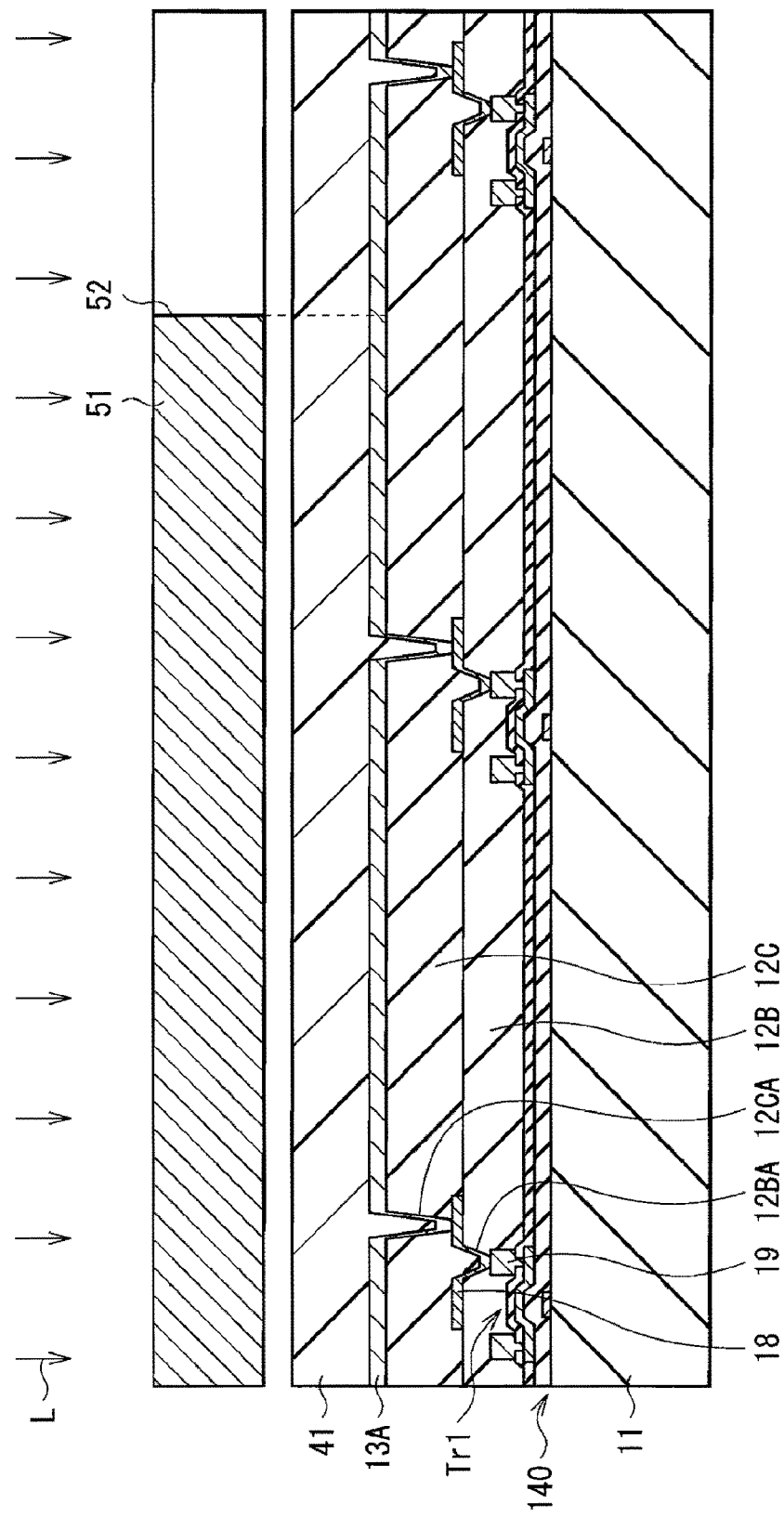
FIG. 30 is a cross section illustrating a process subsequent to FIG. 29.
Figure 31:
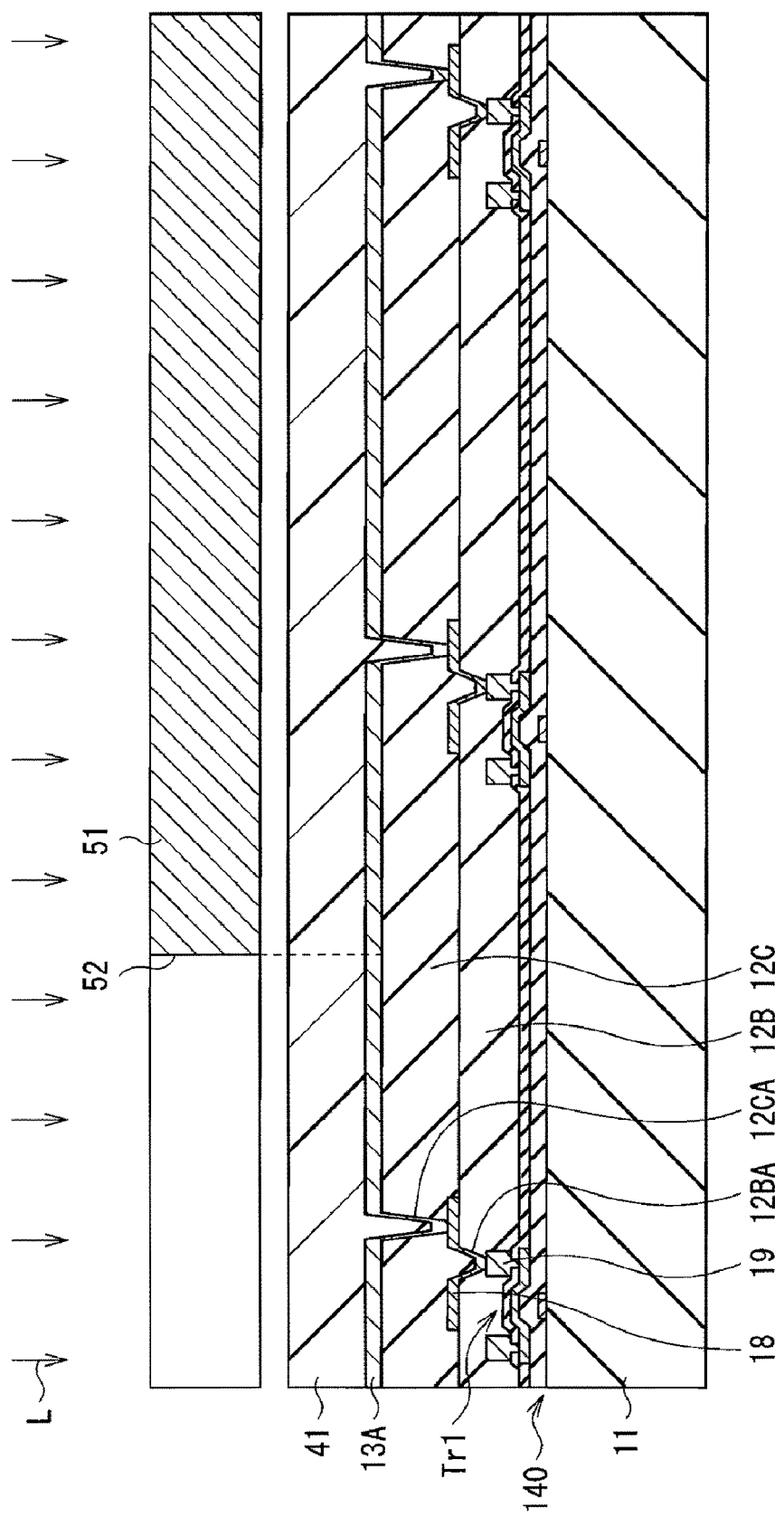
FIG. 31 is a cross section illustrating a process subsequent to FIG. 30.

FIGS. 29 to 31 illustrate a method of manufacturing a display device according to modification 1 in process order. The modification is similar to the manufacturing method of the second embodiment except that the photoresist film 41 for etching the bottom electrode material film 13A is exposed using the evaporation mask 51. Therefore, the same processes as those in the second embodiment will be described with reference to FIGS. 20 to 27.

First, in a manner similar to the second embodiment, by a process shown in FIG. 21, the pixel drive circuit 140 including the drive transistor Tr1, the first planarization film 12B, the intermediate electrode 18, the second planarization film 12C, and the bottom electrode material film 13A are formed on the substrate 11.

Subsequently, as shown in FIG. 29, the negative photoresist film 41 is formed on the bottom electrode material film 13A, and is exposed three times using the evaporation mask 51 for forming the red light emission layer 15CR, the green light emission layer 15CG, or the blue light emission layer 15CB. By the operation, in a manner similar to the first embodiment, the positional deviation between the bottom electrode 13 and the organic layer 15 is reduced.

In the first time, as shown in FIG. 29, the opening 52 in the evaporation mask 51 is aligned to the region 13RA in which the bottom electrode 13 of the organic light emitting element 10R is to be formed, and exposure is performed on the photoresist film 41. The region 13RA in which the bottom electrode 13 is to be formed is set so as to include the contact hole 12A. At the time of exposure, it is preferable to widen the distance between the evaporation mask 51 and the substrate 11, increase the exposure amount, decrease linearity of exposure light L, or the like in order to form the bottom electrode 13 wider than the opening 52.

In the second time, as shown in FIG. 30, the opening 52 in the evaporation mask 51 is aligned to the region 13GA in which the bottom electrode 13 of the organic light emitting element 10G is to be formed, and exposure is performed on the photoresist film 41. The region 13GA in which the bottom electrode 13 is to be formed is set so as to include the contact hole 12A.

In the third time, as shown in FIG. 31, the opening 52 in the evaporation mask 51 is aligned to the region 13BA in which the bottom electrode 13 of the organic light emitting element 10B is to be formed, and exposure is performed on the photoresist film 41. The region 13BA in which the bottom electrode 13 is to be formed is set so as to include the contact hole 12A.

After the photoresist film 41 is exposed three times using the evaporation mask 51 as described above, the photoresist film 41 is developed. Subsequently, in a manner similar to the second embodiment, in the process shown in FIG. 23, by etching using the photoresist film 41 as a mask, the bottom electrode material film 13A is selectively removed. As a result, the bottom electrodes 13 corresponding to the organic light emitting elements 10R, 10G, and 10B are formed in the regions each including the contact hole 12A. In the operation, by adjustment of the etching parameters, the side face 13D of the bottom electrode 13 is formed in a forward-tapered shape. Alternatively, the bottom electrode 13 is made thinner than the organic layer 15.

After formation of the bottom electrode 13, in a manner similar to the second embodiment, the hole injection layer and hole transport layer 15AB made of the above-described material is formed on the entire surface of the substrate 11 by, for example, evaporation. Subsequently, in a manner similar to the second embodiment, by the processes shown in FIGS. 24 to 26, the red light emission layer 15CR, the green light emission layer 15CG, or the blue light emission layer 15CB is formed by evaporation using the evaporation mask 51.

After formation of the red light emission layer 15CR, the green light emission layer 15CG, or the blue light emission layer 15CB, in a manner similar to the second embodiment, by the process shown in FIG. 27, the electron transport layer and electron injection layer 15DE and the top electrode 16 are formed. As a result, the organic light emitting elements 10R, 10G, and 10B are formed.

After formation of the organic light emitting elements 10R, 10G, and 10B, in a manner similar to the second embodiment, by the process shown in FIG. 28, the protection film 17 is formed on the organic light emitting elements 10R, 10G, and 10B. After that, the adhesive layer 30 is formed on the protection film 17, and the sealing substrate 20 is adhered while sandwiching the adhesive layer 30. As a result, the display device shown in FIG. 19 is completed.

Modification 2

Figure 32:
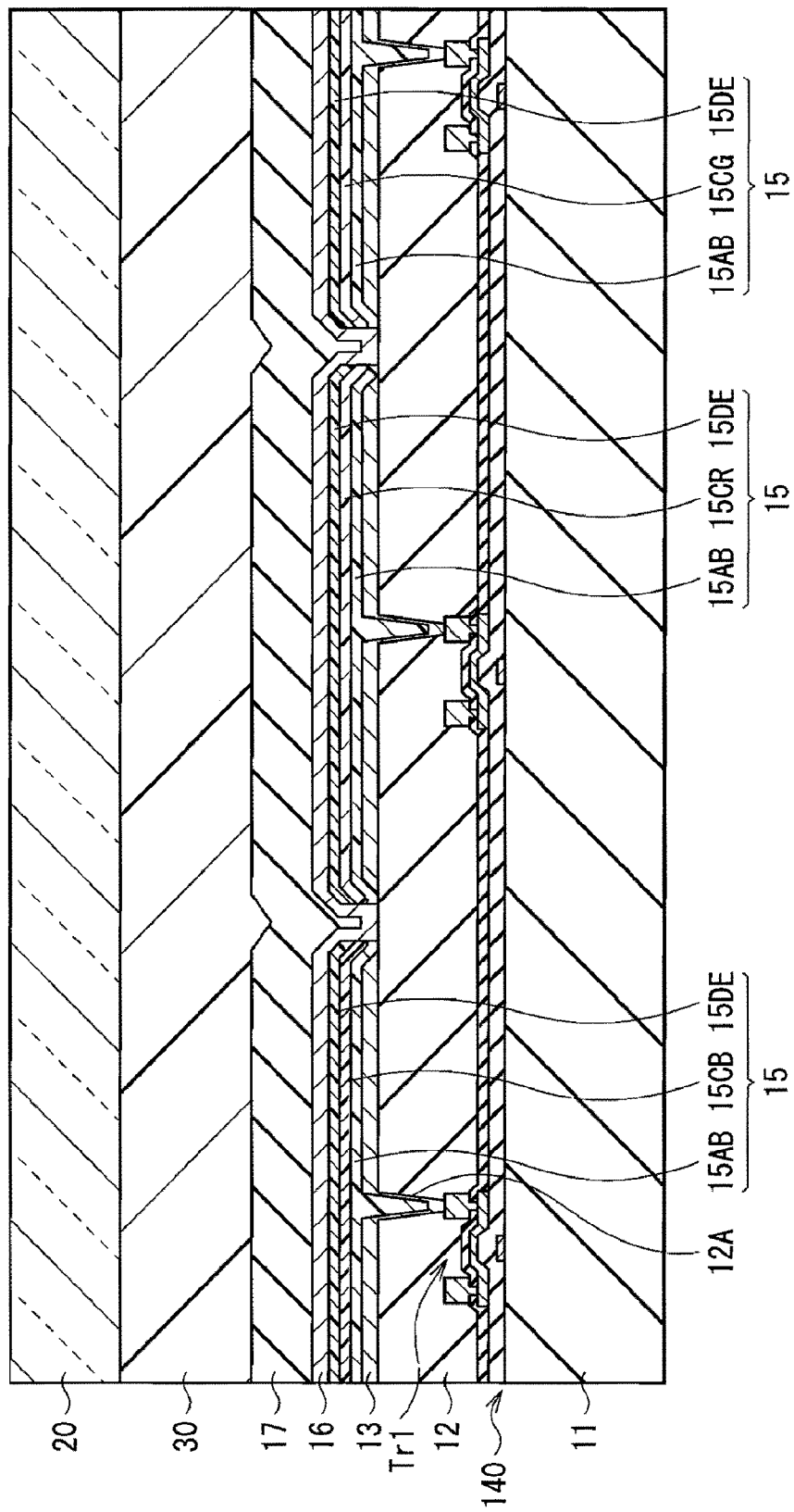
FIG. 32 is a cross section illustrating the configuration of a display region in a display device according to modification 2.

FIG. 32 illustrates a sectional configuration of the display region 110 in a display device according to modification 2. The display device has the same configuration, action, and effect as those of the second embodiment except that the intermediate electrode 18 is not provided, and the drive transistor Tr1 and the bottom electrode 13 are connected via the contact hole 12A in the planarization film 12, and is manufactured similarly.

Modification 3

Figure 33:
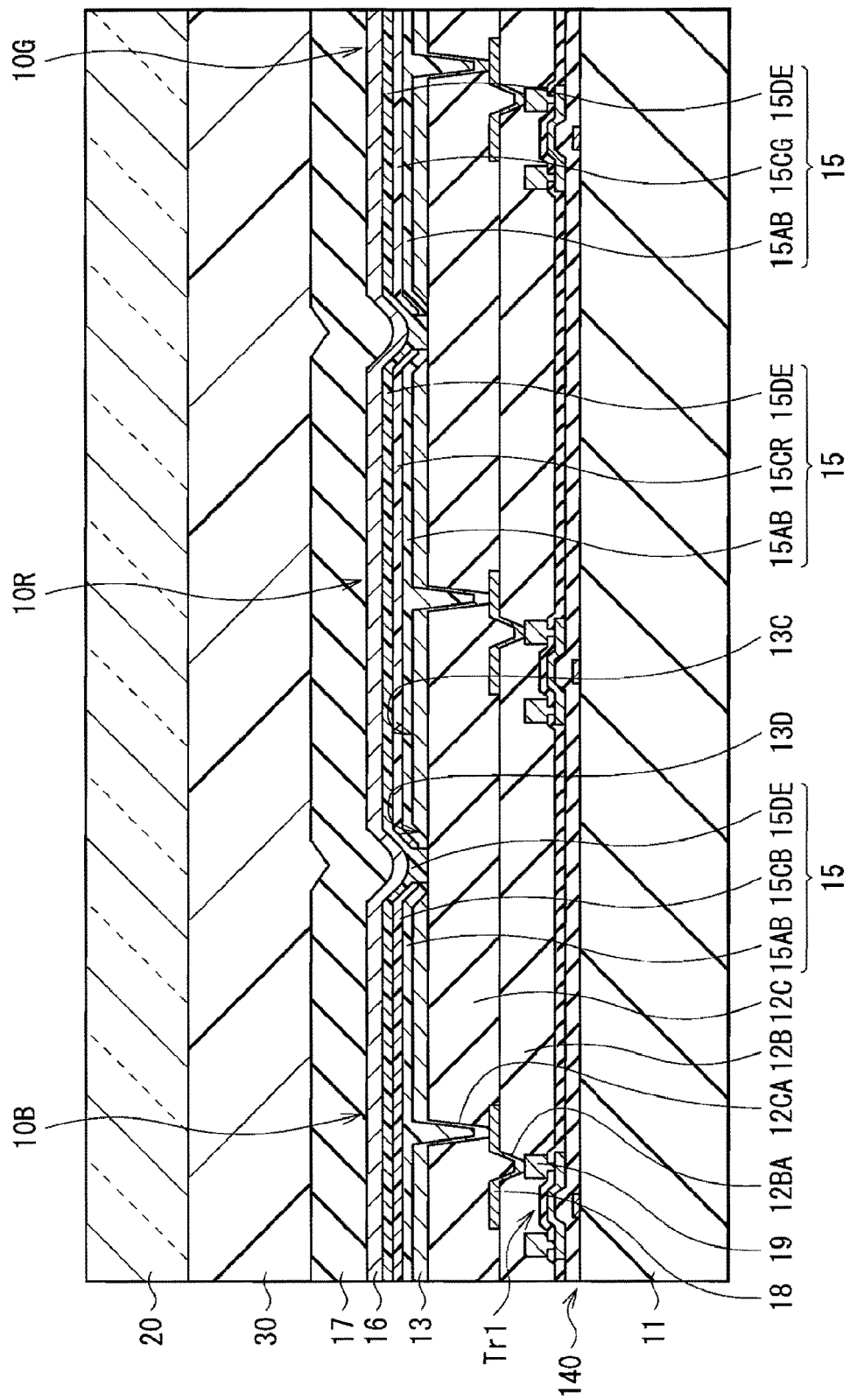
FIG. 33 is a cross section illustrating the configuration of a display region in a display device according to modification 3.

FIG. 33 illustrates a sectional configuration of the display region 110 in a display device according to modification 3. The display device has the same configuration, action, and effect as those of the second embodiment except that the hole injection layer and hole transport layer 15AB is formed for each of the organic light emitting elements 10R, 10G, and 10B. The display device may be manufactured in a manner similar to the second embodiment except that the hole injection layer and hole transport layer 15AB and the red light emission layer 15CR, the green light emission layer 15CG, or the blue light emission layer 15CB are formed by using the evaporation mask 51.

Modification 4

Figure 34:
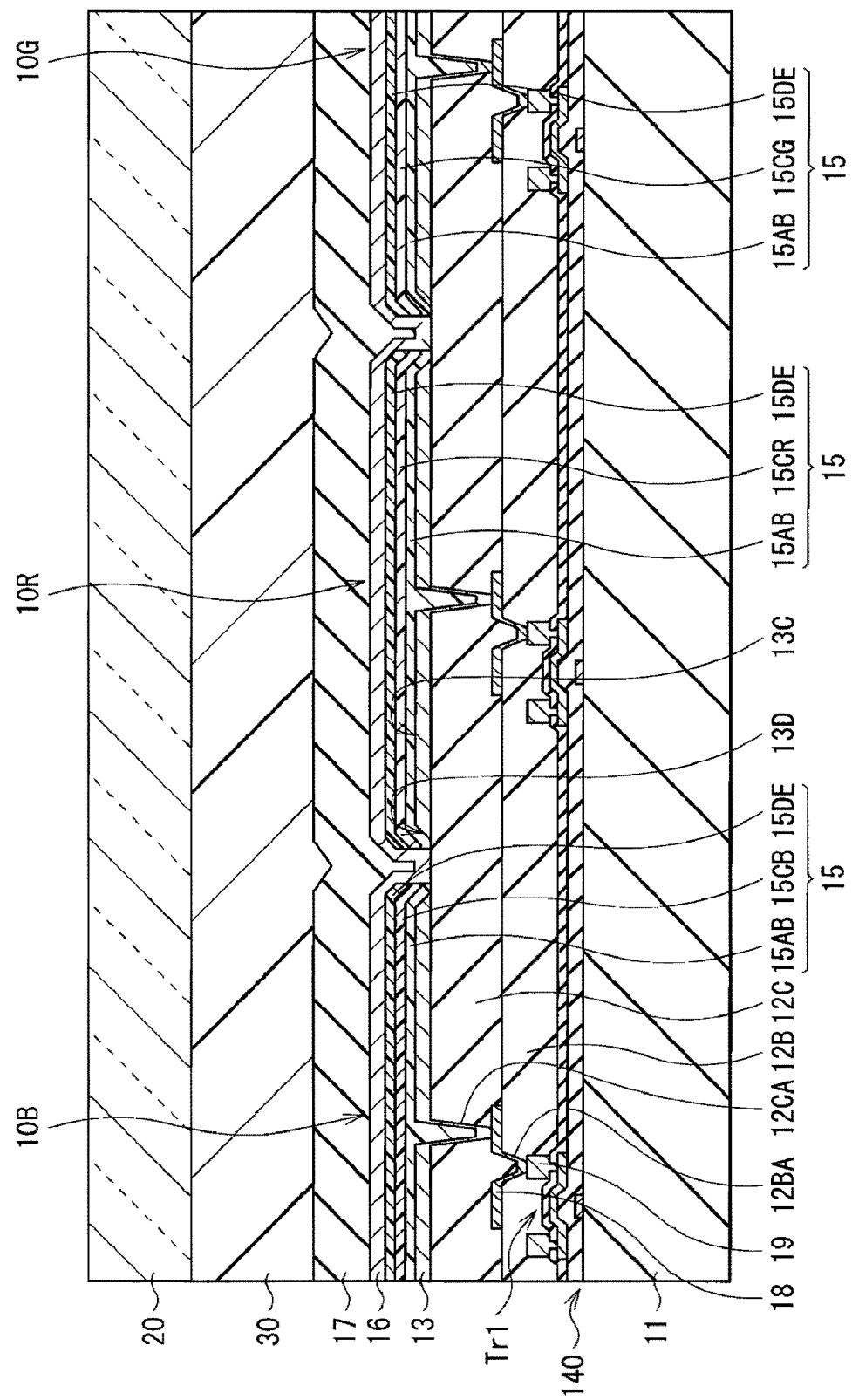
FIG. 34 is a cross section illustrating the configuration of a display region in a display device according to modification 4.

FIG. 34 illustrates a sectional configuration of the display region 110 in a display device according to modification 4. The display device has the same configuration, action, and effect as those of the second embodiment except that all of the layers of the organic layer 15, that is, the hole injection layer and hole transport layer 15AB, the red light emission layer 15CR, the green light emission layer 15CG, or the blue light emission layer 15CB, and the electron transport layer and electron injection layer 15DE are formed for each of the organic light emitting elements 10R, 10G, and 10B. The display device may be manufactured in a manner similar to the second embodiment except that all of the organic layer 15 is formed by using the evaporation mask 51. In the modification, the organic layer 15 has to cover the top face 13C and the side face 13D of the bottom electrode 13.

Modification 5

Figure 35:
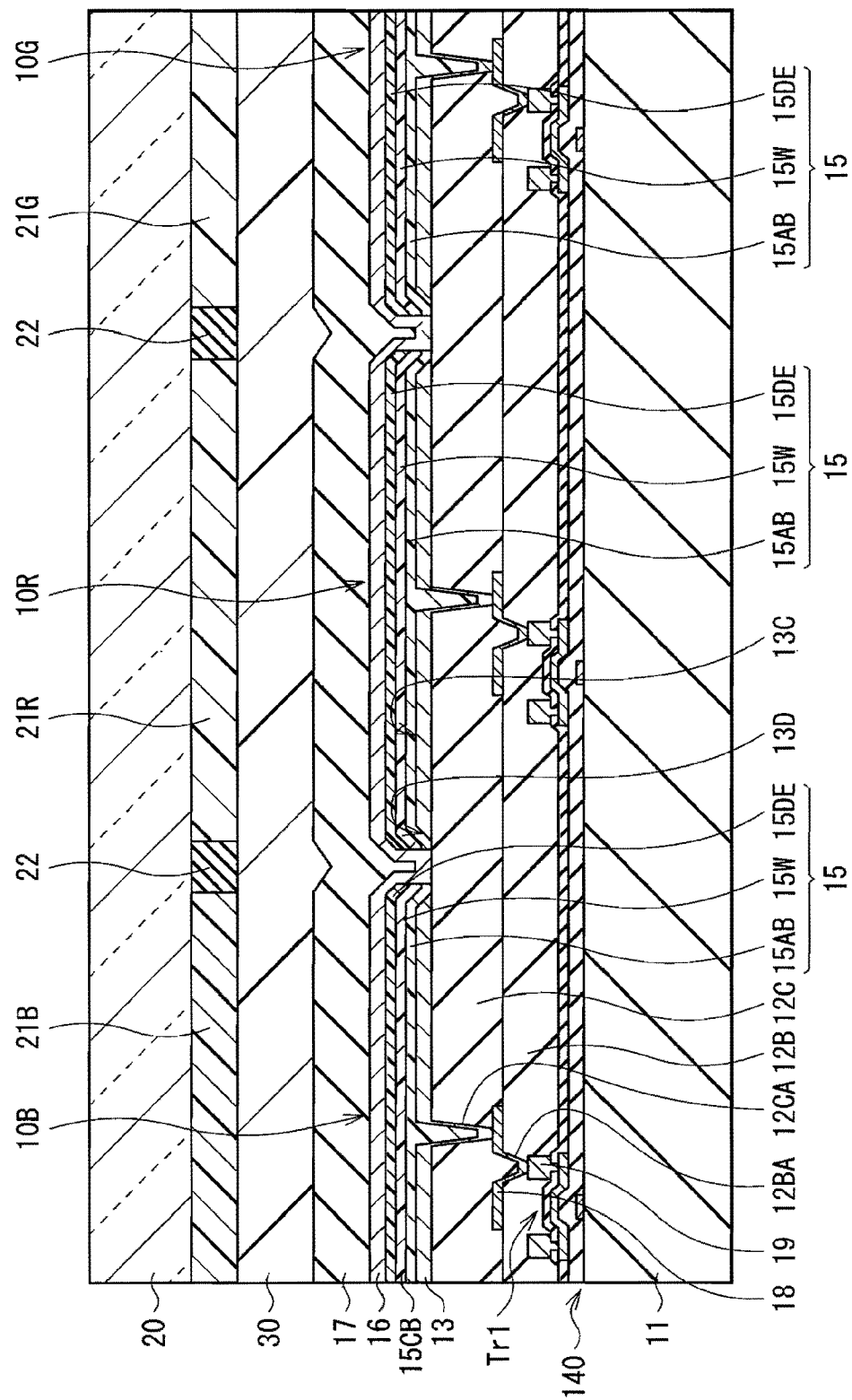
FIG. 35 is a cross section illustrating the configuration of a display region in a display device according to modification 5.

FIG. 35 illustrates a sectional configuration of the display region 110 in a display device according to modification 5. The display device has the same configuration, action, and effect as those of the second embodiment except that a white light emission layer 15CW is formed in place of the red light emission layer 15CR, the green light emission layer 15CG, or the blue light emission layer 15CB, and color filters 21R, 21G, and 21B and a light shield film 22 as a black matrix are provided for the sealing substrate 20, and is similarly manufactured. In place of the color filters 21R, 21G, and 21B, a CCM (Color Changing Medium) may be provided.

Modification 6

Figure 36:
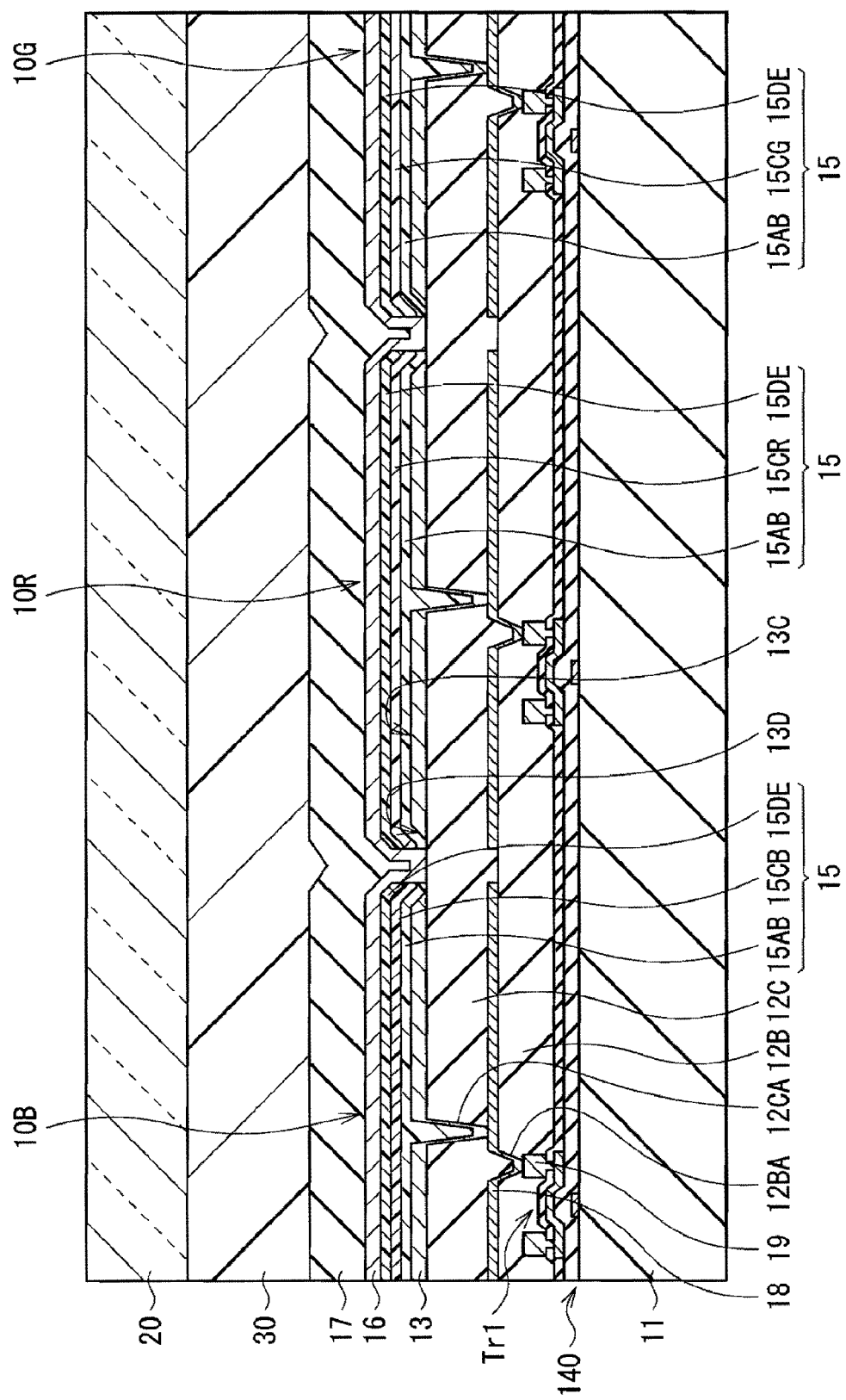
FIG. 36 is a cross section illustrating the configuration of a display region in a display device according to modification 6.

FIG. 36 illustrates a sectional configuration of the display region 110 in a display device according to modification 6. In the modification, the intermediate electrode 18 is provided in the same region as the bottom electrode 13, thereby giving the function of a reflection electrode to the intermediate electrode 18. With the configuration, in the case where the bottom electrode 13 is a transparent electrode, light generated by the red light emission layer 15CR, the green light emission layer 15CG, or the blue light emission layer 15CB is extracted from the top electrode 16 side (top emission). Except for the above, the display device has the same configuration, action, and effect as those of the second embodiment, and is similarly manufactured.

Modification 7

Figure 37:
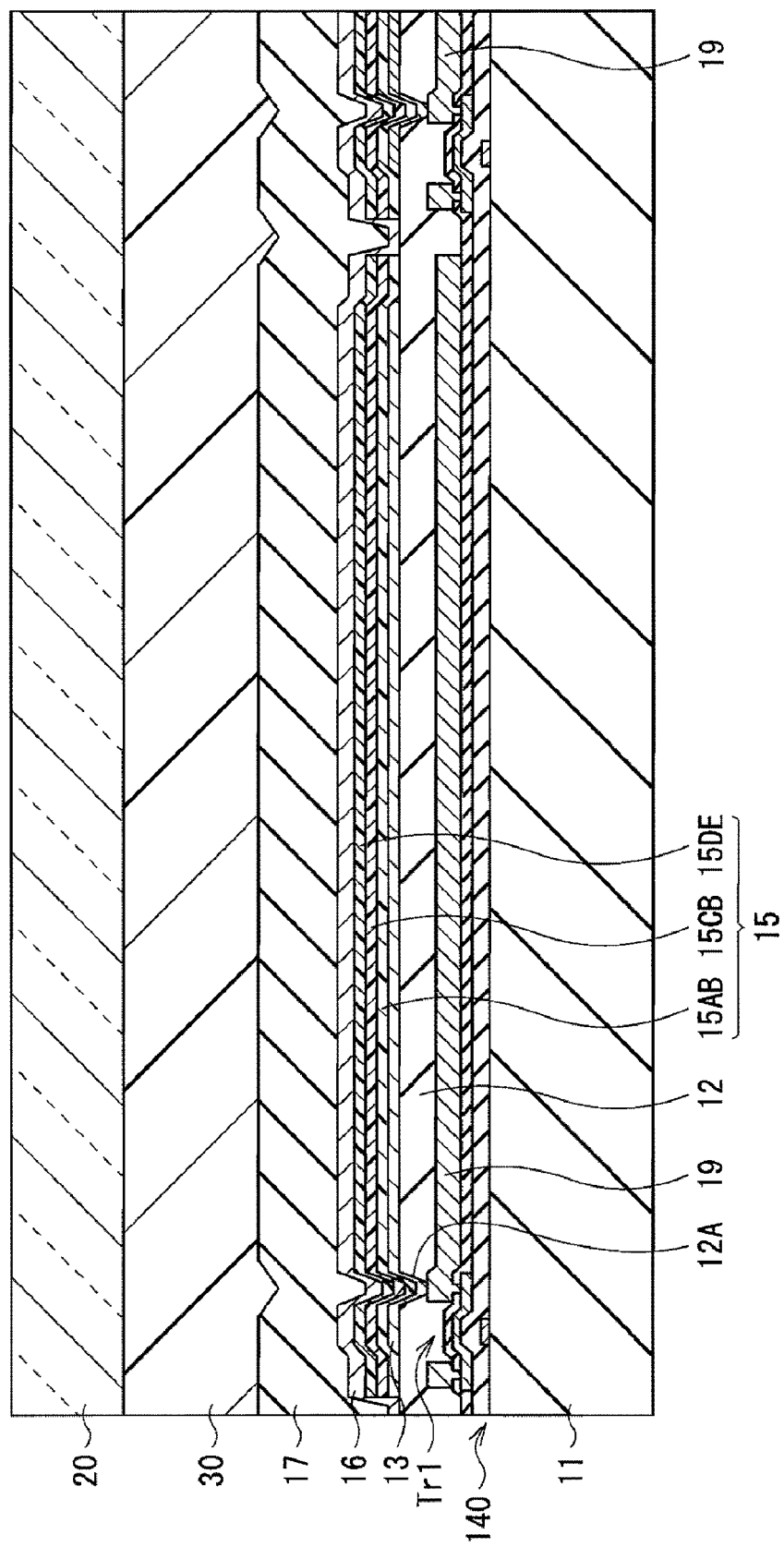
FIG. 37 is a cross section illustrating the configuration of a display region in a display device according to modification 7.

FIG. 37 illustrates a sectional configuration of the display region 110 of a display device according to modification 7. In the modification, by providing the wire electrode 19 of the drive transistor Tr1 in the same region as that of the bottom electrode 13, the function of a reflection electrode is given to the wire electrode 19. With a simple configuration, effects similar to those of the modification 6 are obtained. Except for this, the display device has the same configuration, action, and effect as those of the second embodiment, and is similarly manufactured.

Modification 8

Figure 38:
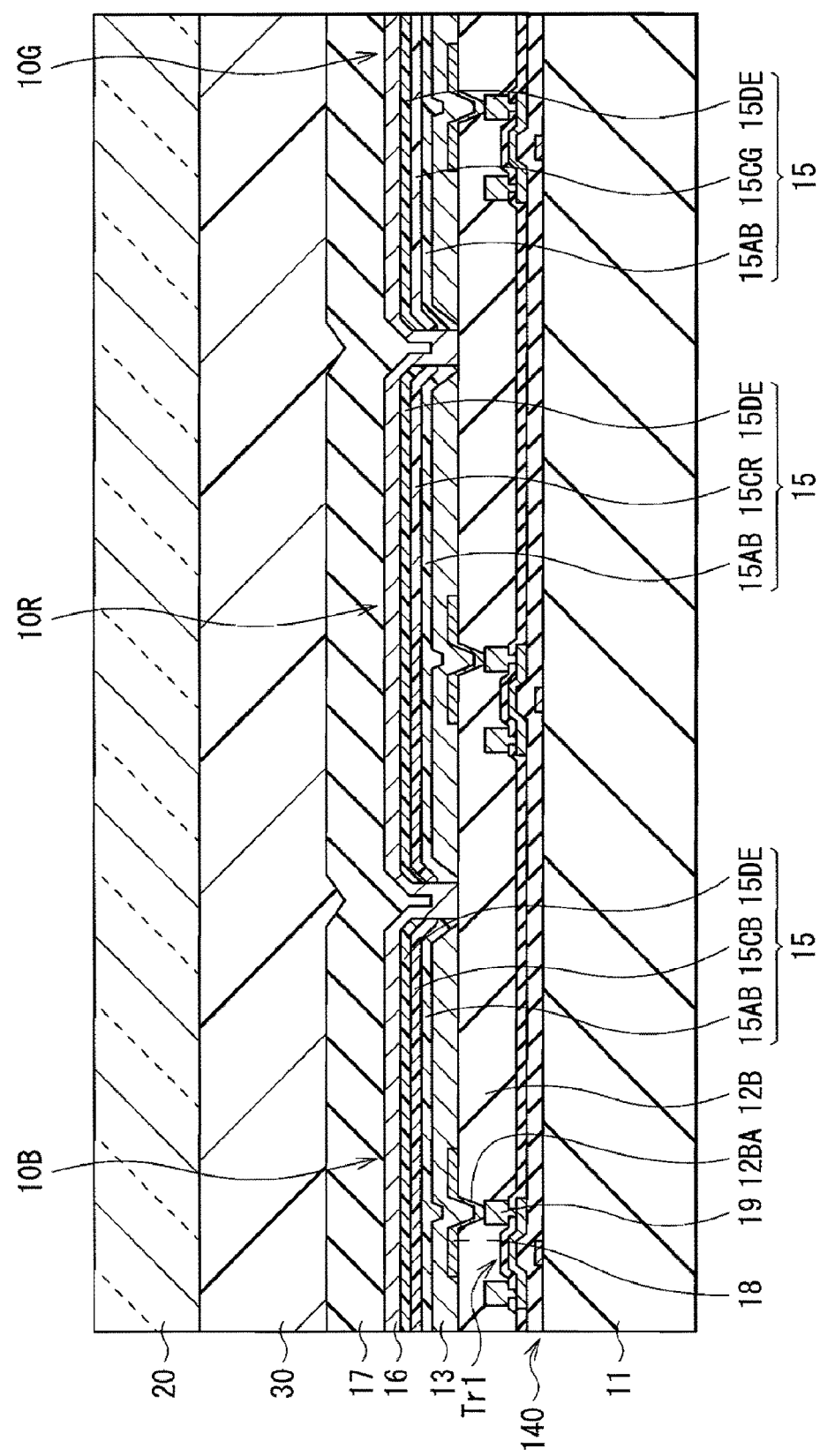
FIG. 38 is a cross section illustrating the configuration of a display region in a display device according to modification 8.

FIG. 38 illustrates a sectional configuration of the display region 110 of the display device according to modification 8. In the modification, the second planarization film 12C is not provided but the bottom electrode 13 is provided on the intermediate electrode 18, thereby suppressing short-circuit with a simple configuration. Except for the above, the display device has the same configuration, action, and effect as those of the second embodiment, and is similarly manufactured.

Third Embodiment

FIGS. 39 to 44 illustrate a method of manufacturing a display device according to a third embodiment of the invention in process order. In the embodiment, the bottom electrode 13 is formed by using the evaporation mask 51. Except for this, the method is similar to that of the second embodiment. Therefore, the same processes as those of the second embodiment will be described with reference to FIGS. 21 to 28.

Figure 39:
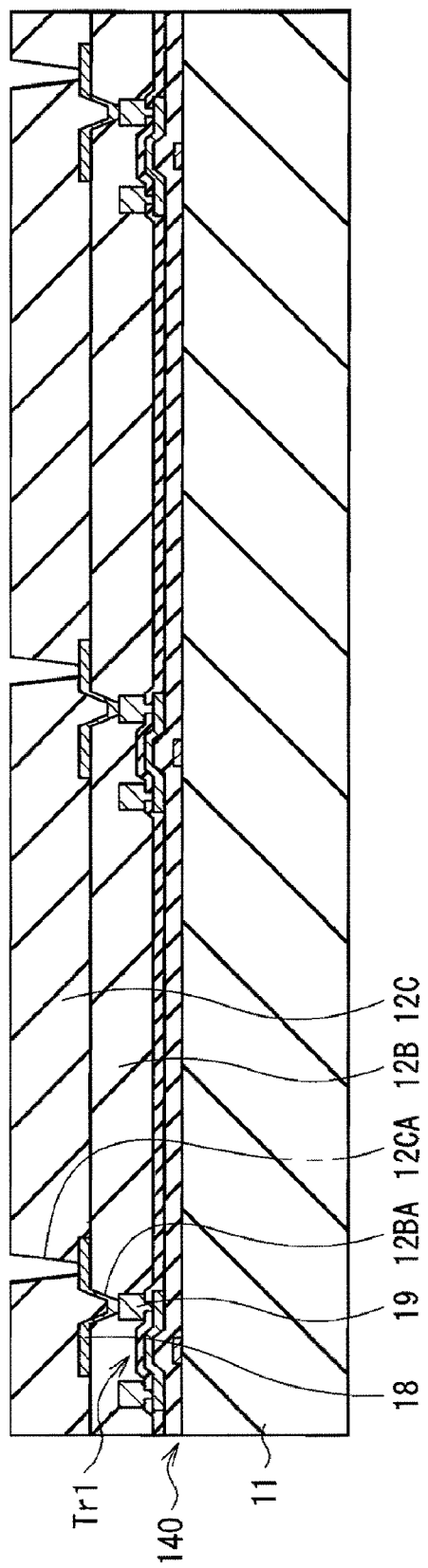
FIG. 39 is a cross section illustrating a method of manufacturing a display device according to the second embodiment of the invention.

First, as shown in FIG. 39, in a manner similar to the second embodiment, by the process illustrated in FIG. 21, the pixel drive circuit 140 including the drive transistor Tr1, the first planarization film 12B, the intermediate electrode 18, and the second planarization film 12C are formed on the substrate 11.

Figure 40:
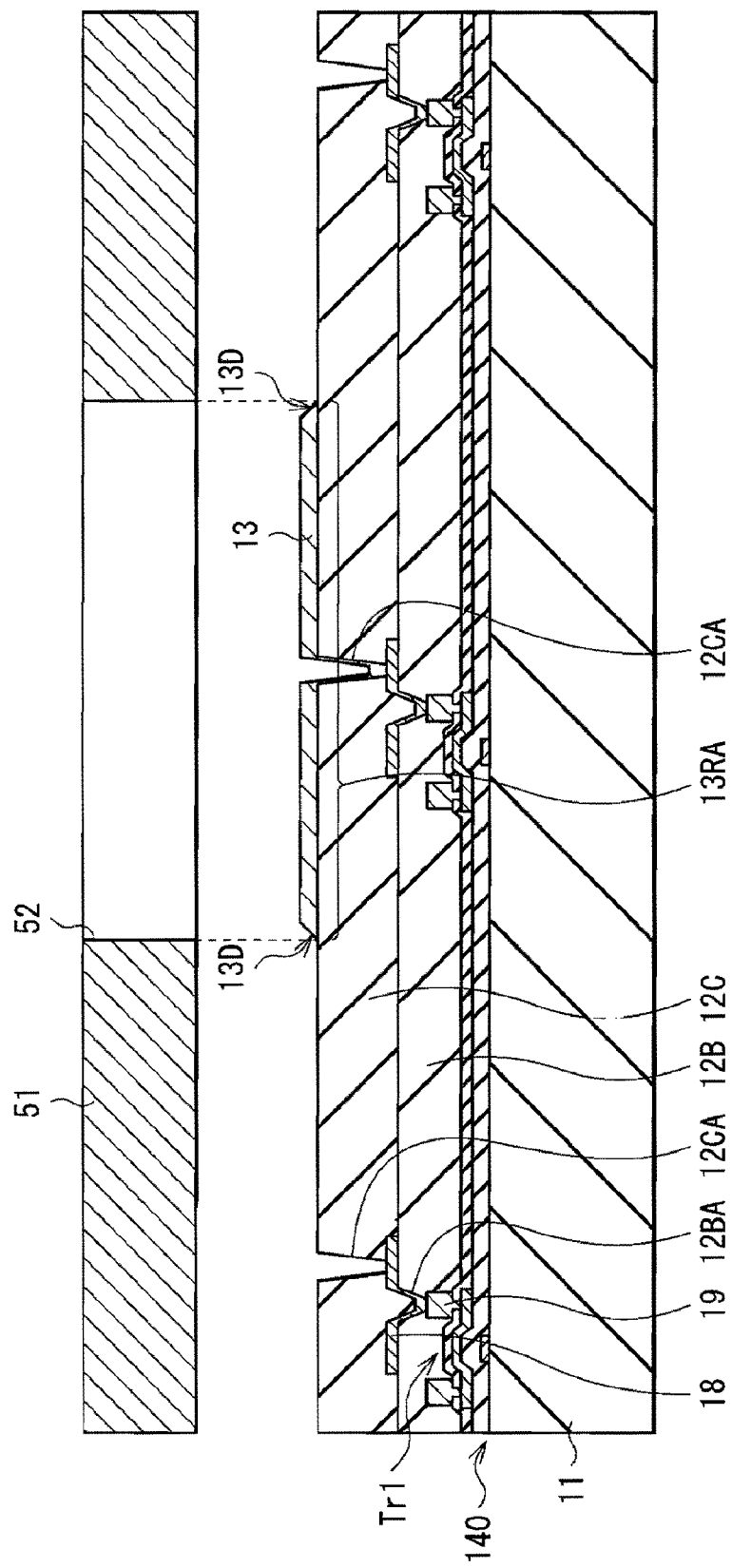
FIG. 40 is a cross section illustrating a process subsequent to FIG. 39.

As shown in FIG. 40, the opening 52 in the evaporation mask 51 is aligned to the region 13RA in which the bottom electrode 13 of the organic light emitting element 10R is to be formed in the second planarization film 12C, and the bottom electrode 13 is formed by evaporation, sputtering, or the like. The region 13RA in which the bottom electrode 13 is to be formed includes the contact hole 12CA. It is preferable to form the side face 13D of the bottom electrode 13 in a forward-tapered shape by adjustment of film formation parameters.

Figure 41:
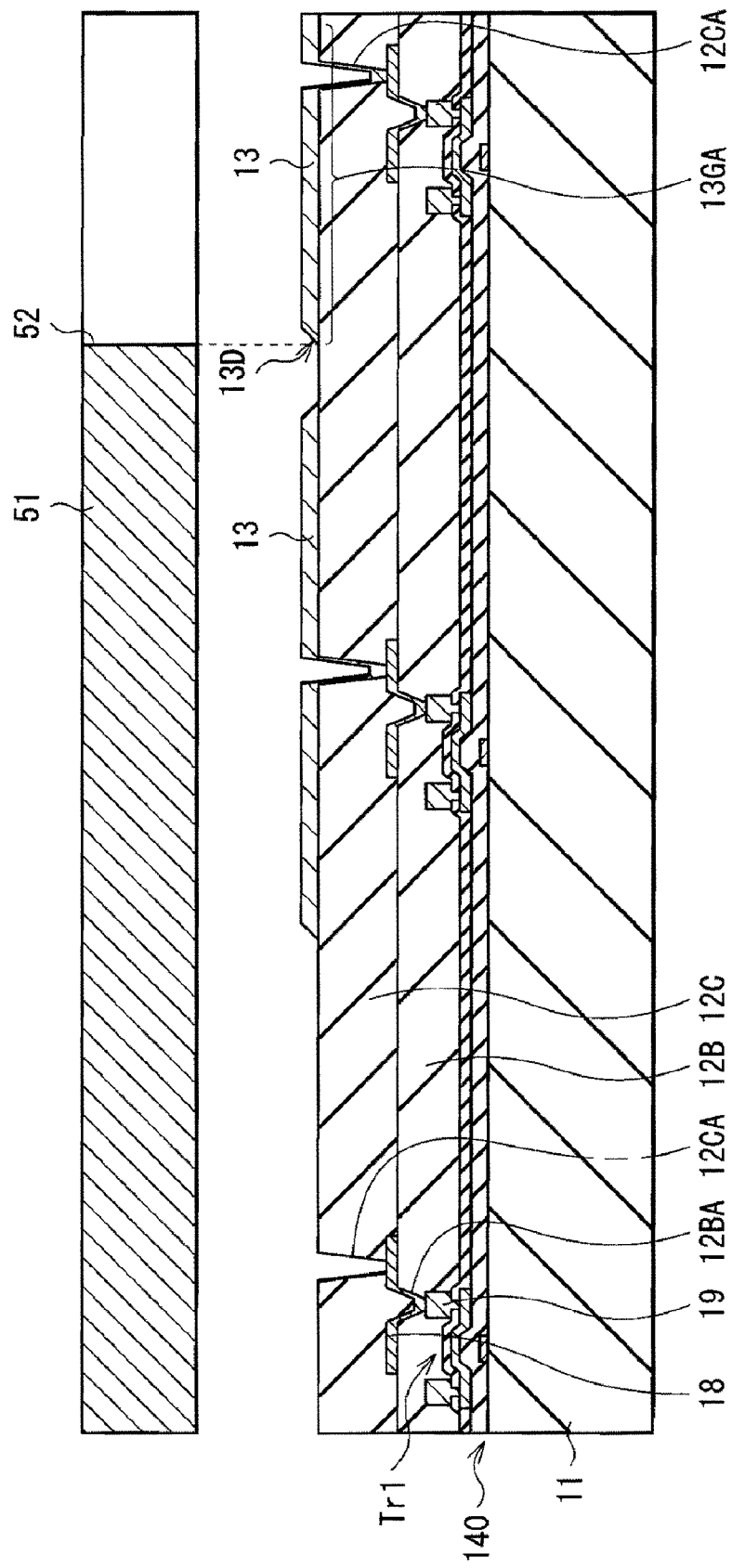
FIG. 41 is a cross section illustrating a process subsequent to FIG. 40.

Subsequently, as shown in FIG. 41, in a manner similar to the case of the bottom electrode 13 of the organic light emitting element 10R, the opening 52 in the evaporation mask 51 is aligned to the region 13GA in which the bottom electrode 13 of the organic light emitting element 10G is to be formed in the second planarization film 12C, and the bottom electrode 13 is formed by evaporation, sputtering, or the like.

Figure 42:
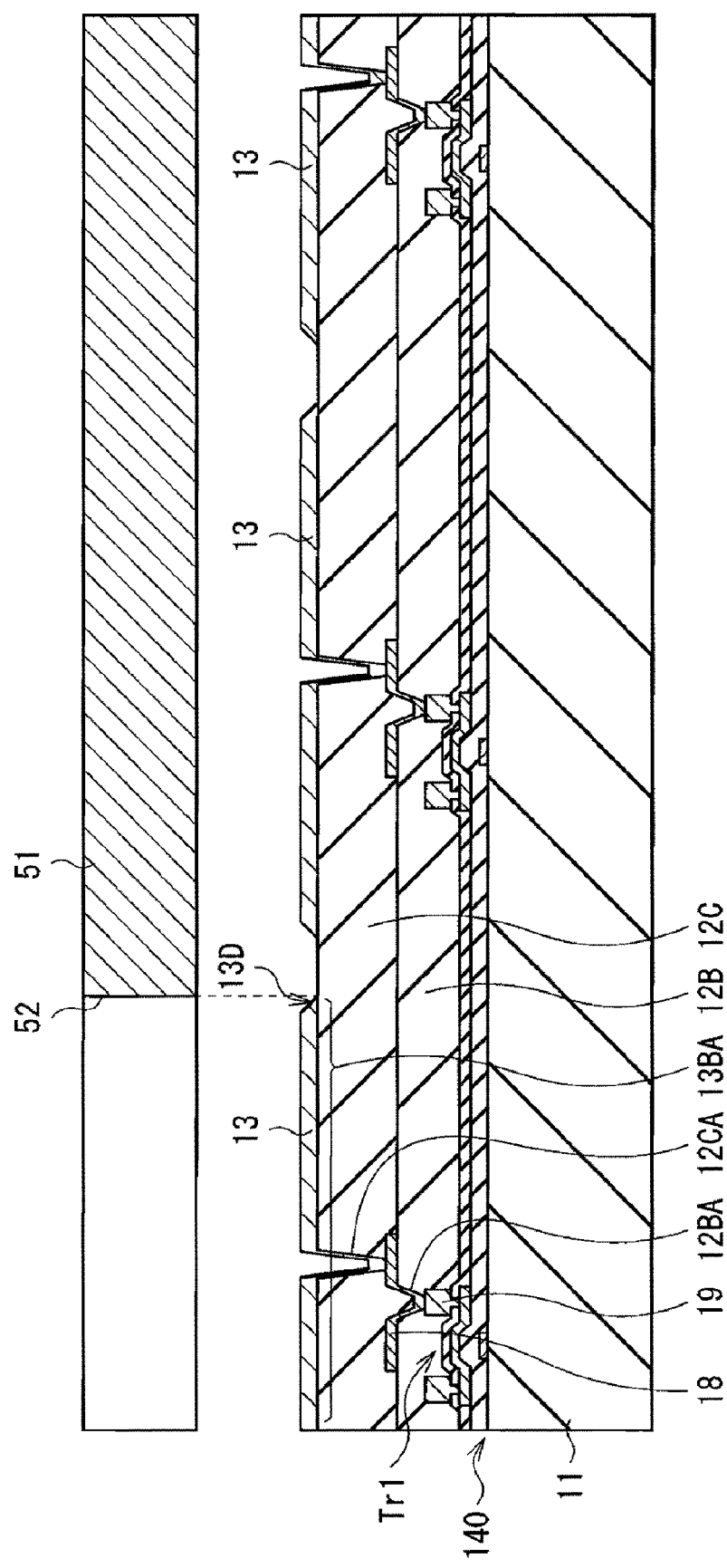
FIG. 42 is a cross section illustrating a process subsequent to FIG. 41.

Subsequently, as shown in FIG. 42, in a manner similar to the case of the bottom electrode 13 of the organic light emitting element 10R, the opening 52 in the evaporation mask 51 is aligned to the region 13BA in which the bottom electrode 13 of the organic light emitting element 10B is to be formed in the second planarization film 12C, and the bottom electrode 13 is formed by evaporation, sputtering, or the like.

After formation of the bottom electrode 13, in a manner similar to the second embodiment, by the process shown in FIG. 24, the hole injection layer and hole transport layer 15AB made of the above-described material is formed on the entire surface of the substrate 11 by, for example, evaporation. Subsequently, in a manner similar to the second embodiment, by the processes shown in FIGS. 24 to 26, the red light emission layer 15CR, the green light emission layer 15CG, and the blue light emission layer 15CB are formed by evaporation using the evaporation mask 51.

By forming the bottom electrode 13 using the evaporation mask 51 as described above, even if the positional precision of the opening 52 decreases due to increase in size, the positional deviation between the bottom electrode 13 and the organic layer 15 is reduced.

Concretely, as described with reference to FIG. 20 in the second embodiment, for example, in a 40-inch FHD display device, the size of one pixel is about 153 μm×459 μm. When it is assumed that the contact hole 12CA has a size of 10 μm×10 μm and an inter-pixel space is 10 μm, the maximum positional deviation amount between the contact hole 12CA and the opening 52 of the evaporation mask 51 may be ±66.5 μm. Therefore, the positional precision requested for the evaporation mask 51 becomes very low.

In this case as well, as described in the second embodiment with reference to FIG. 20, the thickness of the bottom electrode 13 may be 10 nm or larger.

On the other hand, in related art, photolithography is used for patterning the bottom electrode. The positional precision of the pattern is determined by the positional precision of a stepper or a mirror projection aligner, and usual positional precision may be set to 1 μm or less. On the other hand, the organic layer is formed by vacuum deposition using an evaporation mask. In vacuum deposition, to decrease the shadow of the evaporation mask, usually, the evaporation mask is manufactured by a thin plate having a thickness of 5 μm to 100 μm. To manufacture the evaporation mask at high positional precision, the evaporation mask has to be fixed to a frame under tension. Since the higher the tension is, the easier high positional precision is obtained, the frame becomes heavy. Since high positional precision is requested for the evaporation mask and the weight of the frame increases, in related art, it is extremely difficult to increase the size of an organic EL display device.

Figure 43:
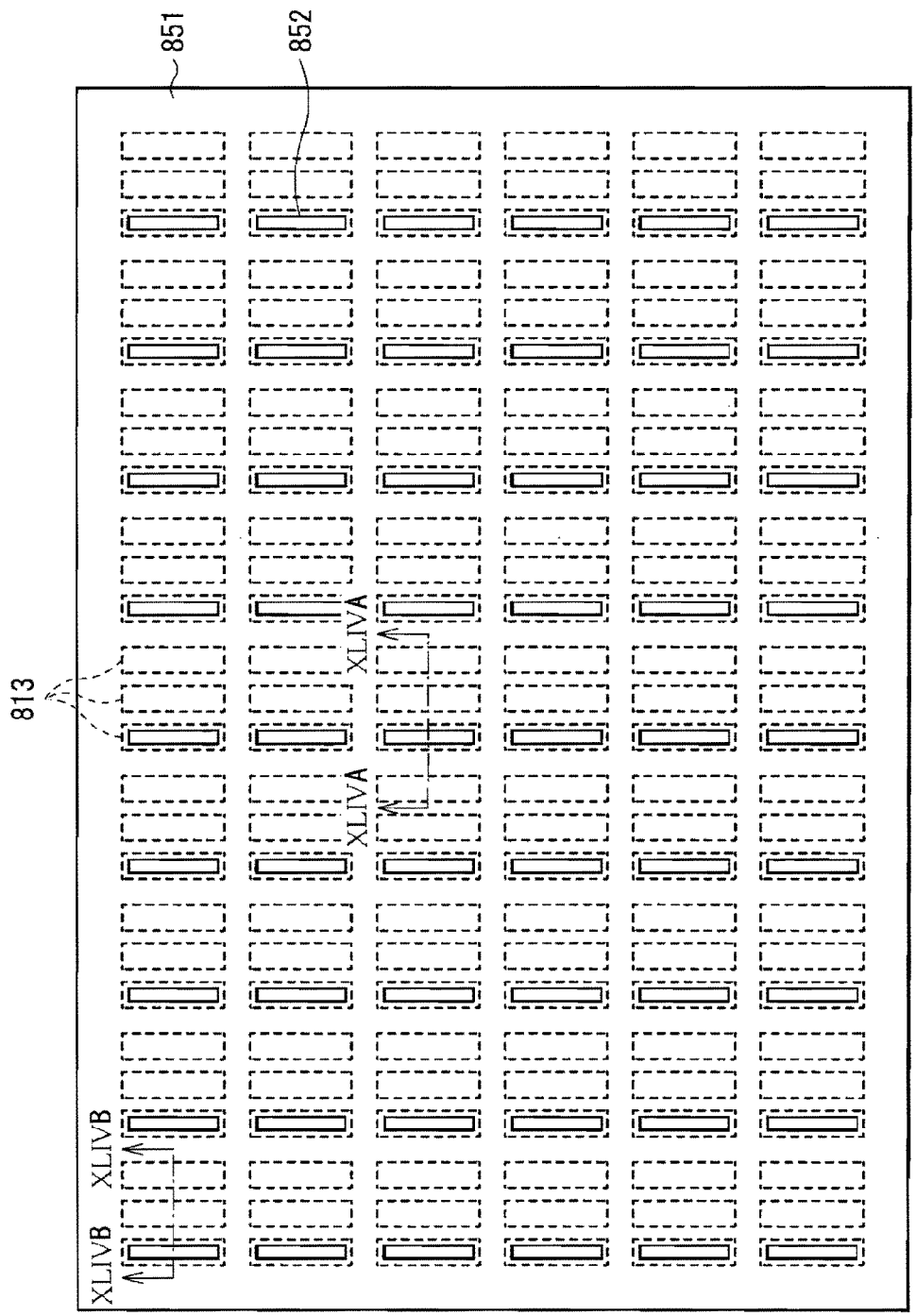
FIG. 43 is diagram for explaining a positional relation in plan view between an evaporation mask and a bottom electrode of related art.

For example, as shown in FIG. 43 and FIGS. 44A and 44B, when the position of an opening 852 in an evaporation mask 851 shifts, a bottom electrode 813 and a pixel isolation insulating film 814 and the opening 852 are aligned in a center of a screen. However, a bottom electrode 813 and the opening 852 are not aligned in an end of the screen. In the case of a 40-inch FHD, the size of one pixel is about 153 μm×459 μm. When the positional precision of the opening 852 is ±20 μm, the problem is handled by narrowing the opening 852, and the aperture ratio becomes 67% or less. In the embodiment, by forming the bottom electrode 13 using the evaporation mask 51, even when the positional precision of the opening 52 decreases due to increase in size, the positional deviation between the bottom electrode 13 and the organic layer 15 may be decreased.

After forming the red light emission layer 15CR, the green light emission layer 15CG, or the blue light emission layer 15CB as described above, in a manner similar to the second embodiment, by the process shown in FIG. 26, the electron transport layer and electron injection layer 15DE and the top electrode 16 are formed. In such a manner, the organic light emitting elements 10R, 10G, and 10B are formed.

After formation of the organic light emission layers 10R, 10G, and 10B, in a manner similar to the second embodiment, by the process shown in FIG. 27, the protection film 17 is formed on the organic light emitting elements 10R, 10G, and 10B. After that, the adhesive layer 30 is formed on the protection film 17, and the sealing substrate 20 is adhered while sandwiching the adhesive layer 30. As a result, the display device illustrated in FIG. 19 is completed.

As described above, in the embodiment, the bottom electrode 13 is formed by using the evaporation mask 51, and the organic layer 15 is formed so as to cover all of the top face 13C and the side face 13D of the bottom electrode 13 by evaporation using the evaporation mask 51. The positional deviation between the bottom electrode 13 and the organic layer 15 may be reduced. It is particularly effective for increase in size.

MODULES AND APPLICATION EXAMPLES

Hereinbelow, application examples of the display devices explained in the foregoing embodiments will be described.

The display devices of the foregoing embodiments are applicable as display devices of electronic devices in all of fields for displaying a video signal entered from the outside or generated internally as an image or a video image, such as a television apparatus, a digital camera, a notebook-sized personal computer, a portable terminal device such as a cellular phone, and a video camera.

Modules

Figure 45:
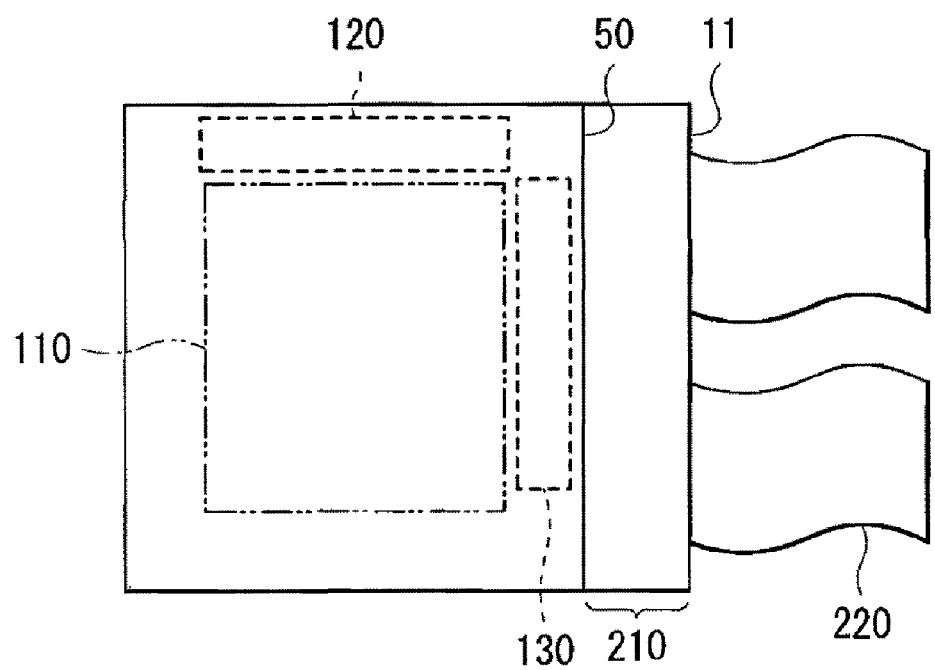
FIG. 45 is a plan view illustrating a schematic configuration of a module including the display device of the embodiment.

The display device of any of the embodiments is assembled, for example, as a module shown in FIG. 45, in various electronic devices in application examples 1 to 5 and the like which will be described later. The module has, for example, at one side of a substrate 11, a region 210 exposed from the sealing substrate 20 and the adhesive layer 30. To the exposed region 210, wires of the signal line drive circuit 120 and a scan line drive circuit 130 are extended and external connection terminals (not shown) are formed. The external connection terminal may be provided with a flexible printed circuit (FPC) 220 for inputting/outputting signals.

Application Example 1

Figure 46:
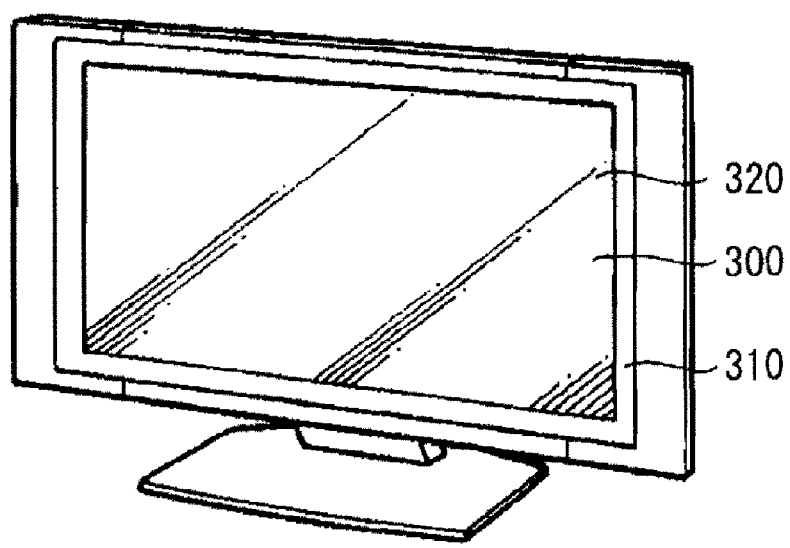
FIG. 46 is a perspective view illustrating the appearance of application example 1 of the display device of the foregoing embodiment.

FIG. 46 illustrates the appearance of a television apparatus to which the display device of the foregoing embodiment is applied. The television apparatus has, for example, a video image display screen 300 including a front panel 310 and a filter glass 320. The video image display screen 300 is constructed by the display device according to any of the embodiments.

Application Example 2

Figure 47A:
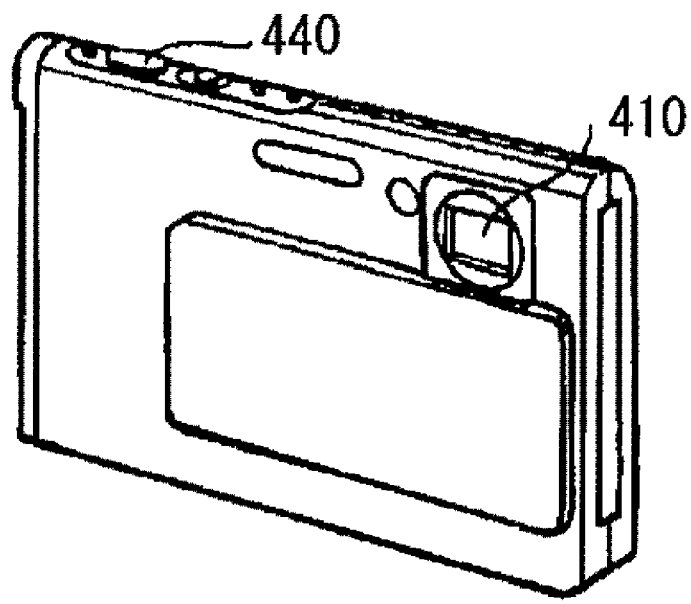
FIG. 47A is a perspective view illustrating the appearance viewed from the surface side of application example 2.
Figure 47B:
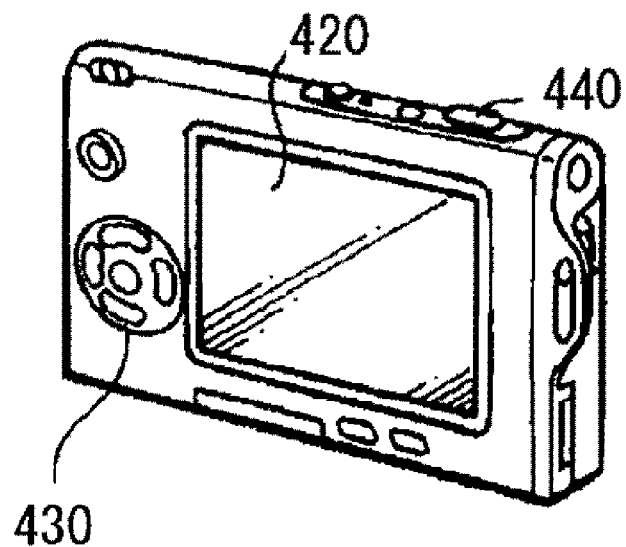
FIG. 47B is a perspective view illustrating the appearance viewed from the back side.

FIGS. 47A and 47B illustrate the appearance of a digital camera to which the display devices of the embodiments are applied. The digital camera has, for example, a light emission unit 410 for flash, a display unit 420, a menu switch 430, and a shutter button 440. The display unit 420 is constructed by the display device according to any of the foregoing embodiments.

Application Example 3

Figure 48:
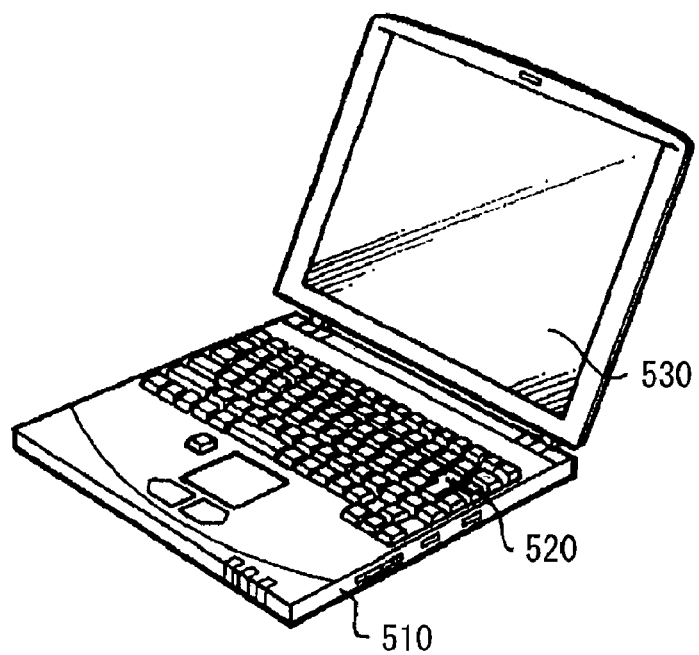
FIG. 48 is a perspective view illustrating the appearance of application example 3.

FIG. 48 expresses the appearance of a notebook-sized personal computer to which the display devices of the foregoing embodiments are applied. The notebook-sized personal computer has, for example, a body 510, a keyboard 520 for operation of entering characters and the like, and a display unit 530 for displaying an image. The display unit 530 is constructed by the display device according to any of the foregoing embodiments.

Application Example 4

Figure 49:
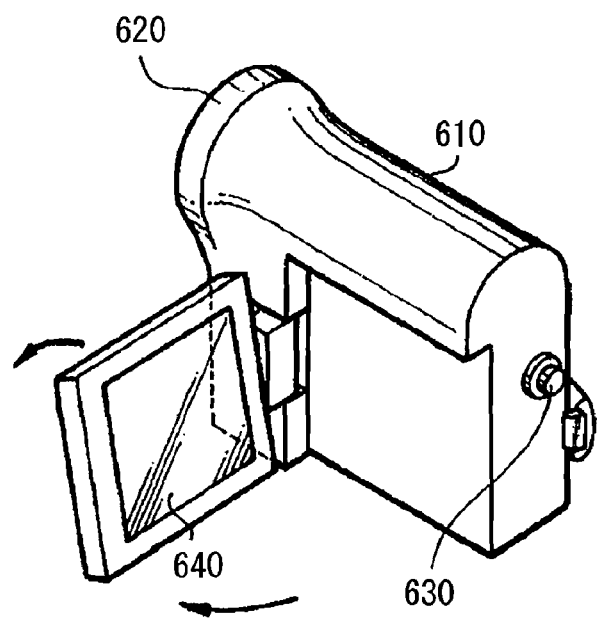
FIG. 49 is a perspective view illustrating the appearance of application example 4.

FIG. 49 illustrates the appearance of a video camera to which the display devices of the embodiments are applied. The video camera has, for example, a body 610, a lens 620 for shooting a subject, provided on the front face of the body 610, a shooting start-stop switch 630, and a display unit 640. The display unit 640 is constructed by the display device according to any of the embodiments.

Application Example 5

FIGS. 50A to 50G illustrate the appearance of a cellular phone to which the display devices of the embodiments are applied. The cellular phone is obtained by, for example, coupling an upper-side casing 710 and a lower-side casing 720 via a coupling unit (hinge) 730 and has a display 740, a sub-display 750, a picture light 760, and a camera 770. The display 740 or the sub-display 750 is constructed by the display device according to any of the embodiments.

The present invention has been described above by the embodiments. However, the invention is not limited to the embodiments but can be variously modified. For example, the present invention is not limited to the materials and thicknesses of the layers, the film forming methods, film forming conditions, and the like described in the embodiments, but other materials and thicknesses, other film forming methods, and other film forming conditions may be used.

For example, in the embodiments, the case of stacking, on the substrate 11, the bottom electrode 13, the organic layer 15, and the top electrode 16 in order from the side of the substrate 11 and extracting light from the side of the sealing substrate 20 has been described. The stack order may be inverted. On the substrate 11, the top electrode 16, the organic layer 15, and the bottom electrode 13 may be stacked on the substrate 11 in order from the side of the substrate 11, and light may be extracted from the side of the substrate 11.

Further, for example, in the foregoing embodiments, the case of setting the bottom electrode 13 as an anode and setting the top electrode 16 as a cathode has been described. However, the anode and the cathode may be interchanged. The bottom electrode 13 may be set as a cathode and the top electrode 16 may be set as an anode. The top electrode 16, the organic layer 15, and the bottom electrode 13 may be stacked on the substrate 11 in order from the side of the substrate 11, and light may be extracted from the side of the substrate 11.

In addition, in the embodiments, the configuration of the organic light emitting elements 10R, 10G, and 10B has been concretely described. However, all of the layers do not have to be provided, and another layer may be also provided.

Further, although the case of an active-matrix display device has been described in the foregoing embodiments, the present invention is also applicable to a passive-matrix display device. In addition, the circuit of the pixel drive circuit for active-matrix driving is not limited to that in the description of the embodiments. As necessary, a capacitive element and a transistor may be added. In this case, according to a change in the pixel drive circuit, a necessary drive circuit may be provided in addition to the signal line drive circuit 120 and the scan line drive circuit 130.

In addition, the present invention is not limited to the evaporation method but is also applicable to a printing method using a printing plate.

The present application contains subject matter related to that disclosed in Japanese Priority Patent Application JP 2009-027645 filed in the Japan Patent Office on Feb. 9, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   drive elements formed, on a substrate, in correspondence with each of a plurality of organic light emitting elements;
   at least one planarization film, at least uppermost film of which has a contact hole whose side face has a forward-tapered shape;
   a bottom electrode formed in a region including the contact hole in correspondence with each of the plurality of organic light emitting elements;
   an organic layer including a light emission layer; and
   a top electrode, wherein,
the organic layer is formed so as to cover all of a top face and a side face of the bottom electrode.

2. A display device comprising:
drive elements formed, on a substrate, in correspondence with each of a plurality of organic light emitting elements;
at least one planarization film, at least uppermost film of which has a contact hole whose side face has a forward-tapered shape;
a bottom electrode formed in a region including the contact hole in correspondence with each of the plurality of organic light emitting elements;
an organic layer including a light emission layer; and
a top electrode,
wherein,
a side face of the bottom electrode has a forward-tapered shape.

3. The display device according to claim 1, wherein the bottom electrode is thicker than the organic layer.

4. A display device, comprising:
drive elements formed, on a substrate, in correspondence with each of a plurality of organic light emitting elements;
a first planarization film having a contact hole in a position corresponding to the drive element;
an intermediate electrode formed in a region including the contact hole in the first planarization film;
a second planarization film having, in a position corresponding to the intermediate electrode, a contact hole whose side face has a forward-tapered shape;
a bottom electrode formed in a region including the contact hole in correspondence with each of the plurality of organic light emitting elements;
an organic layer including a light emission layer; and
a top electrode.

* * * * *